(12) United States Patent
Murakami et al.

(10) Patent No.: US 9,293,099 B2
(45) Date of Patent: Mar. 22, 2016

(54) DISPLAY DRIVE CIRCUIT, DISPLAY PANEL, AND DISPLAY DEVICE

(75) Inventors: Yuhichiroh Murakami, Osaka (JP); Shige Furuta, Osaka (JP); Makoto Yokoyama, Osaka (JP); Seijirou Gyouten, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 224 days.

(21) Appl. No.: 14/124,020

(22) PCT Filed: Jun. 25, 2012

(86) PCT No.: PCT/JP2012/066195
§ 371 (c)(1),
(2), (4) Date: Dec. 5, 2013

(87) PCT Pub. No.: WO2013/002192
PCT Pub. Date: Jan. 3, 2013

(65) Prior Publication Data
US 2014/0098017 A1    Apr. 10, 2014

(30) Foreign Application Priority Data
Jun. 30, 2011 (JP) ................. 2011-146530

(51) Int. Cl.
*G09G 3/36* (2006.01)
*G11C 19/28* (2006.01)

(52) U.S. Cl.
CPC ............ *G09G 3/3648* (2013.01); *G09G 3/3655* (2013.01); *G09G 3/3677* (2013.01);
(Continued)

(58) Field of Classification Search
CPC .............. G09G 2310/0251; G09G 2320/0261; G09G 2300/0408; G09G 2300/0417; G09G 2300/0452; G09G 2300/0809; G09G 2300/0842; G09G 2300/0861; G09G 2300/0866; G09G 2310/02; G09G 2310/0218; G09G 2310/0256; G09G 2310/0294; G09G 2300/08; G09G 2300/0814; G09G 2300/0857; G09G 2300/0885; G09G 2310/0235; G09G 2310/0254; G09G 2310/0262; G09G 2310/063; G09G 2320/0646; G06F 3/0412; G06F 3/044; G06F 3/041; G06F 3/0416; G06F 3/038; G06F 3/045; G06F 1/3203; G06F 1/3262; G06F 2203/04101; G06F 3/042; G06F 11/10; G06F 13/124; G06F 13/22; G06F 13/4022
USPC .................... 345/87–102, 690, 204
See application file for complete search history.

(56) References Cited

U.S. PATENT DOCUMENTS 5,745,092 A     4/1998   Ito
7,161,572 B2 *  1/2007   Takahashi et al. .............. 345/94
(Continued)

FOREIGN PATENT DOCUMENTS

JP     07-230073 A     8/1995
JP     2004-163601 A   6/2004
(Continued)

OTHER PUBLICATIONS

Official Communication issued in International Patent Application No. PCT/JP2012/066195, mailed on Sep. 25, 2012.

*Primary Examiner* — Duc Dinh
(74) *Attorney, Agent, or Firm* — Keating & Bennett, LLP

(57) ABSTRACT

A retention circuit (22) corresponding to each stage of a shift register is configured such that, when SROUT(k−1) is active, an input terminal of an inverter (INV1) and an output terminal of an inverter (INV2) are electrically connected to each other and an output terminal of the inverter (INV1) and an input terminal of the inverter (INV2) are connected to each other. This makes it possible to reduce a circuit scale of a display driving circuit without causing any malfunction of the display driving circuit.

16 Claims, 57 Drawing Sheets

(52) U.S. Cl.
CPC .............. *G11C 19/28* (2013.01); *G09G 3/3659* (2013.01); *G09G 2300/0426* (2013.01); *G09G 2310/0286* (2013.01); *G09G 2320/0219* (2013.01)

(56) References Cited

U.S. PATENT DOCUMENTS

| | | | |
|---|---|---|---|
| 8,072,409 B2 * | 12/2011 | Fanchiang et al. | 345/98 |
| 8,325,124 B2 * | 12/2012 | Fanchiang et al. | 345/92 |
| 2008/0218466 A1 * | 9/2008 | Koyama et al. | 345/96 |
| 2012/0086703 A1 | 4/2012 | Yokoyama et al. | |

FOREIGN PATENT DOCUMENTS

| | | |
|---|---|---|
| JP | 2010-107808 A | 5/2010 |
| WO | 2010/146740 A1 | 12/2010 |

* cited by examiner

DISPLAY DRIVE CIRCUIT, DISPLAY PANEL, AND DISPLAY DEVICE

TECHNICAL FIELD

The present invention relates to a display driving circuit for use in a display device.

BACKGROUND ART

In recent years, it is required that display driving circuits for driving liquid crystal panels be reduced in scale in order to achieve slim bezel of liquid crystal display devices. Because scales of the display driving circuits largely affect the number of elements of transistors for configuring circuits, it is important to reduce the number of transistors.

Conventional display driving circuits are, for example, signal retention circuits configuring common electrode driving circuits (also referred to as "COM drivers") and signal retention circuits (hereinafter, referred to as "retention circuit") configuring retention capacitor line driving circuits (also referred to as "CS driver") (for example, Patent Literature 1). FIG. 57 is a circuit diagram of a retention circuit configuring a conventional common electrode driving circuit. The common electrode driving circuit supplies a high-level or low-level signal (CMOUT) to each common line (COM line) on the basis of an output signal (SROUT) of each stage of a shift register (not shown) configuring a scanning signal line driving circuit.

Specifically, the common electrode driving circuit is configured by connecting multiple n (n is an integer of 2 or more) retention circuits (hereinafter, referred to as "unit circuits") (see FIG. 57). Each of the unit circuits is made up of input terminals CK, D, and an output terminal OUT. The output signal SROUT of the shift register is supplied to the input terminal CK, meanwhile, a polarity signal CMI is supplied to the input terminal D. An output of the unit circuit is supplied as the output signal CMOUT to the common line CML.

For example, a (k−1)th output signal SROUT(k−1) of the shift register is supplied to a kth (k is an integer of 1 or more but n or less) unit circuit of the common electrode driving circuit, and the kth unit circuit outputs an output signal CMOUTk to a common line CMLk.

As described above, the common electrode driving circuit subsequently supplies output signals CMOUT1 to CMOUTn to common lines CML1 to CMLn, respectively, while retaining signals inside thereof in accordance with an shift operation of the shift register.

CITATION LIST

Patent Literature

Patent Literature 1
International Publication WO 2010/146740 (Publication date: Dec. 13, 2010)

SUMMARY OF INVENTION

Technical Problem

In order to further reduce the circuit scale of each of the above common electrode driving circuits, it is effective to reduce the number of transistors, however, the display driving circuits may malfunction if the number of transistors is merely reduced. Note that, because the retention circuits (unit circuits) described above can be applied (see Patent Literature 1) in conventional retention capacitor line driving circuits (CS drivers), a similar problem occurs also in the retention capacitor line driving circuits.

In view of the circumstances, an object of the present invention is to reduce a circuit scale of a display driving circuit without causing the display driving circuit to malfunction.

Solution to Problem

In order to achieve the above object, a display driving circuit of the present invention for driving a display panel including (i) pixel electrodes included in pixels and (ii) signal lines which constitute capacitors with the pixel electrodes the display driving circuit includes: a shift register which includes plural stages provided corresponding to plural scanning signal lines, wherein: one or more retention circuits for receiving retention target signals are provided corresponding to each of the plural stages of the shift register; when an output signal of any one of the plural stages of the shift register becomes active, the corresponding retention circuit supplies an output of the corresponding retention circuit to the corresponding signal line while receiving and retaining the retention target signal; each of the retention circuits includes a first inverter and a second inverter for retaining the retention target signal, when the output signal of the shift register becomes active, the retention target signal is supplied to the second inverter, and the each of the retention circuits supplies, on the basis of an output from the first inverter or the second inverter, a high-level or low-level signal to the corresponding signal line; and, in the case where the output signal of the shift register is active, an input terminal of the first inverter and an output terminal of the second inverter are electrically connected to each other and an output terminal of the first inverter and an input terminal of the second inverter are electrically connected to each other.

In a conventional display driving circuit, an analog switch circuit SW12 is provided as illustrated in FIG. 57. Therefore, in the case where an output signal of the shift register is active, the analog switch circuit SW12 is switched off, which electrically separates an output of a first inverter from an input of a second inverter. This is for preventing malfunction of an inverter INV2, which is caused by short circuit between a polarity signal CMI and a power supply VDD.

On the contrary, a display driving circuit of the present invention has such features that the analog switch circuit SW12 is omitted and, in the case where the output signal of the shift register is active, an output of a first inverter and an input of a second inverter are electrically connected to each other.

Even in the case where the polarity signal CMI and the power supply VDD are short-circuited, malfunctions, which have occurred in the conventional display driving circuits, do not occur if the inverter INV2 can be normally operated (inverted). In the display driving circuit of the present invention, for example, it is possible to make an input signal, which is supplied to the inverter INV2 at the time of short circuit, closer to a potential level of the polarity signal CMI by increasing a channel length of a transistor which configures an inverter INV1 or by providing a resistor in the inverter INV1. This makes it possible to normally operate (invert) the inverter INV2 (detailed description will be made later).

As described above, according to the display driving circuit of the present invention, it is possible to reduce a circuit scale of the display driving circuit without causing the display driving circuit to malfunction.

Advantageous Effects of Invention

As described above, the display driving circuit of the present invention is configured such that, in the case where an output signal of the shift register is active, an input terminal of the first inverter and an output terminal of the second inverter are electrically connected to each other and an output terminal of the first inverter and an input terminal of the second inverter are electrically connected to each other. This make it possible to reduce a circuit scale of the display driving circuit without causing the display driving circuit to malfunction.

Figure 53:
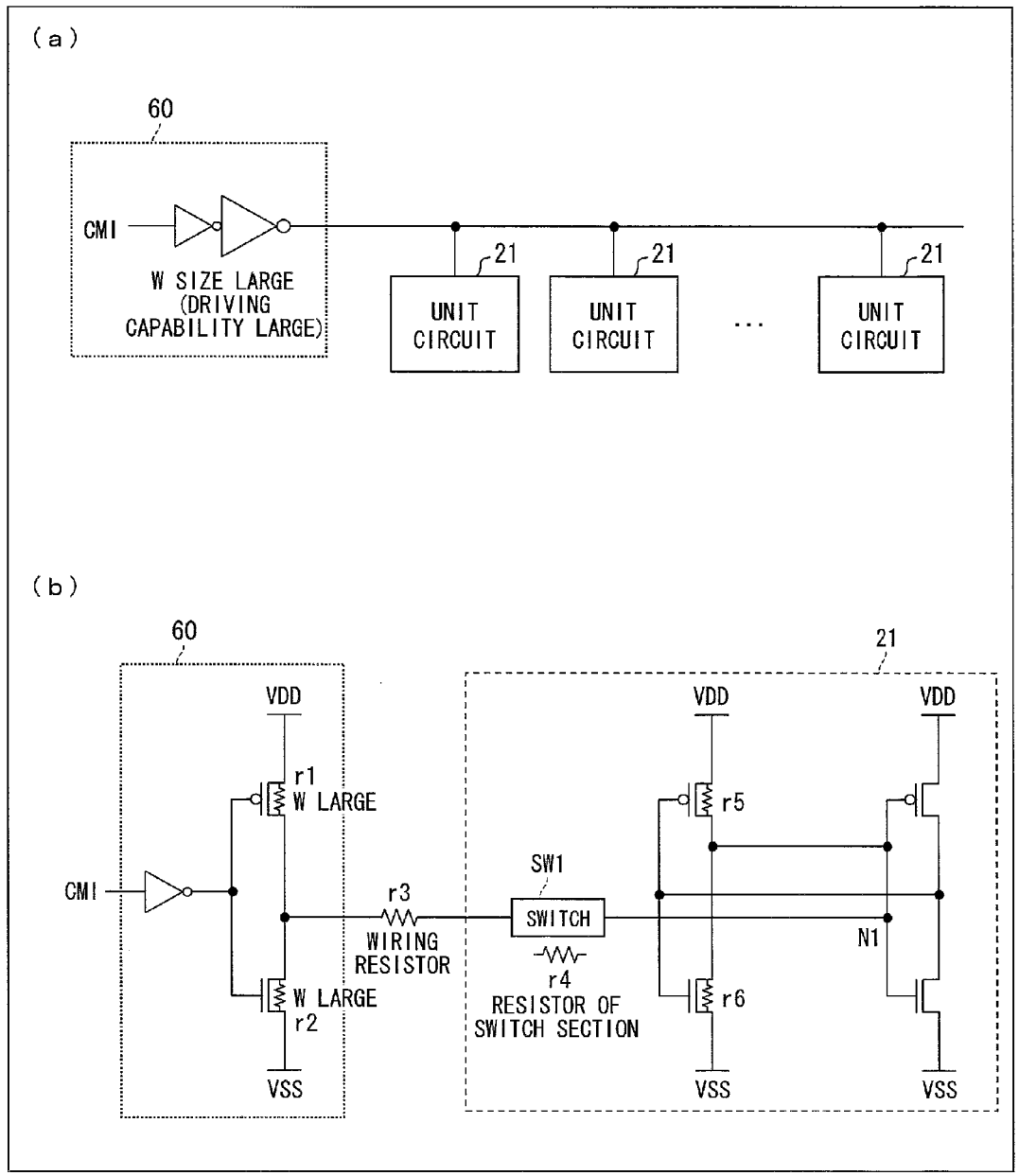

(a) of FIG. 53 is a block diagram illustrating a unit circuit and a CMI buffer section, and (b) of FIG. 53 is a circuit diagram thereof.

Figure 54:
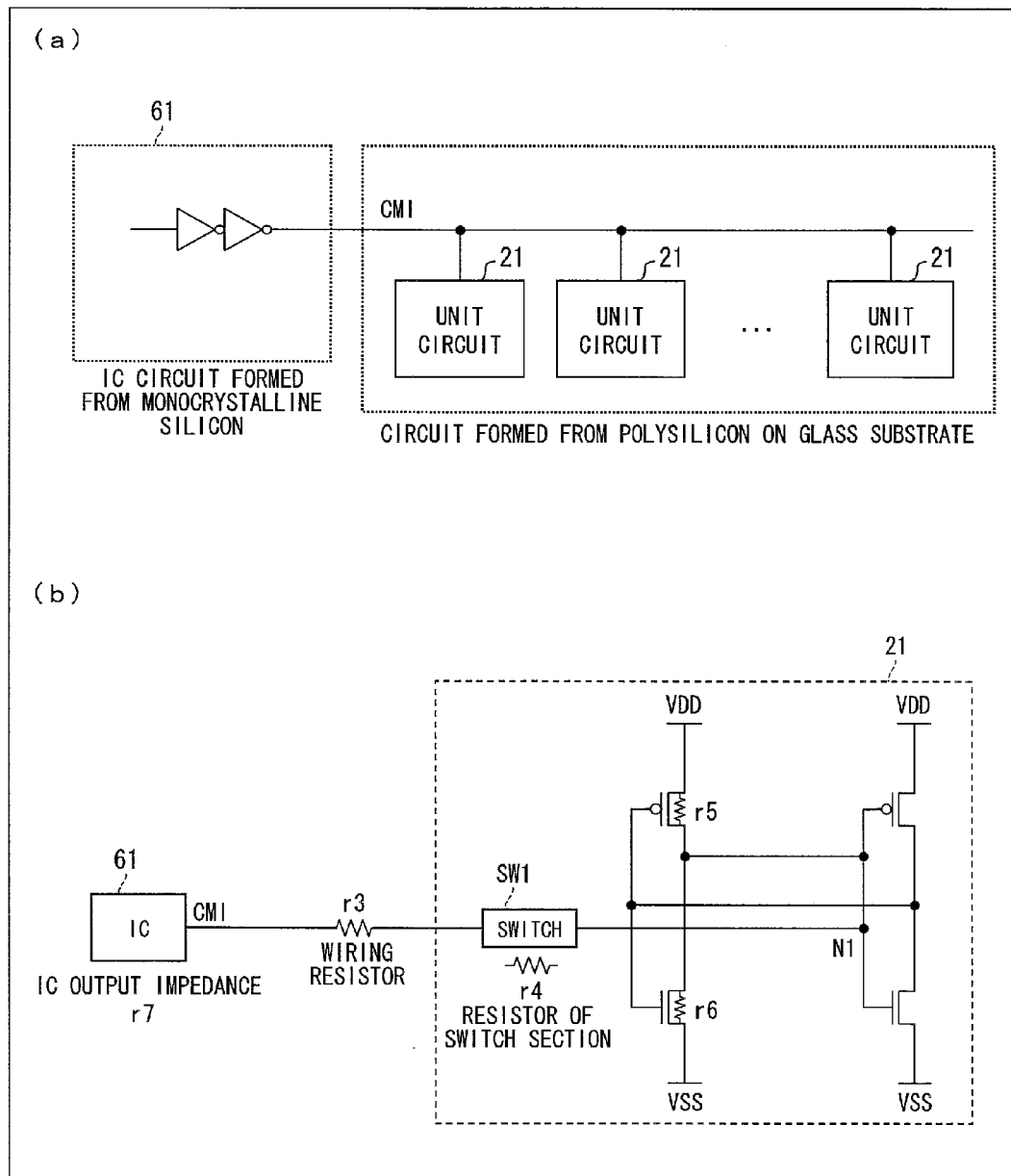

(a) of FIG. 54 is a block diagram illustrating a unit circuit and an IC circuit, and (b) of FIG. 54 is a circuit diagram thereof.

Figure 55:
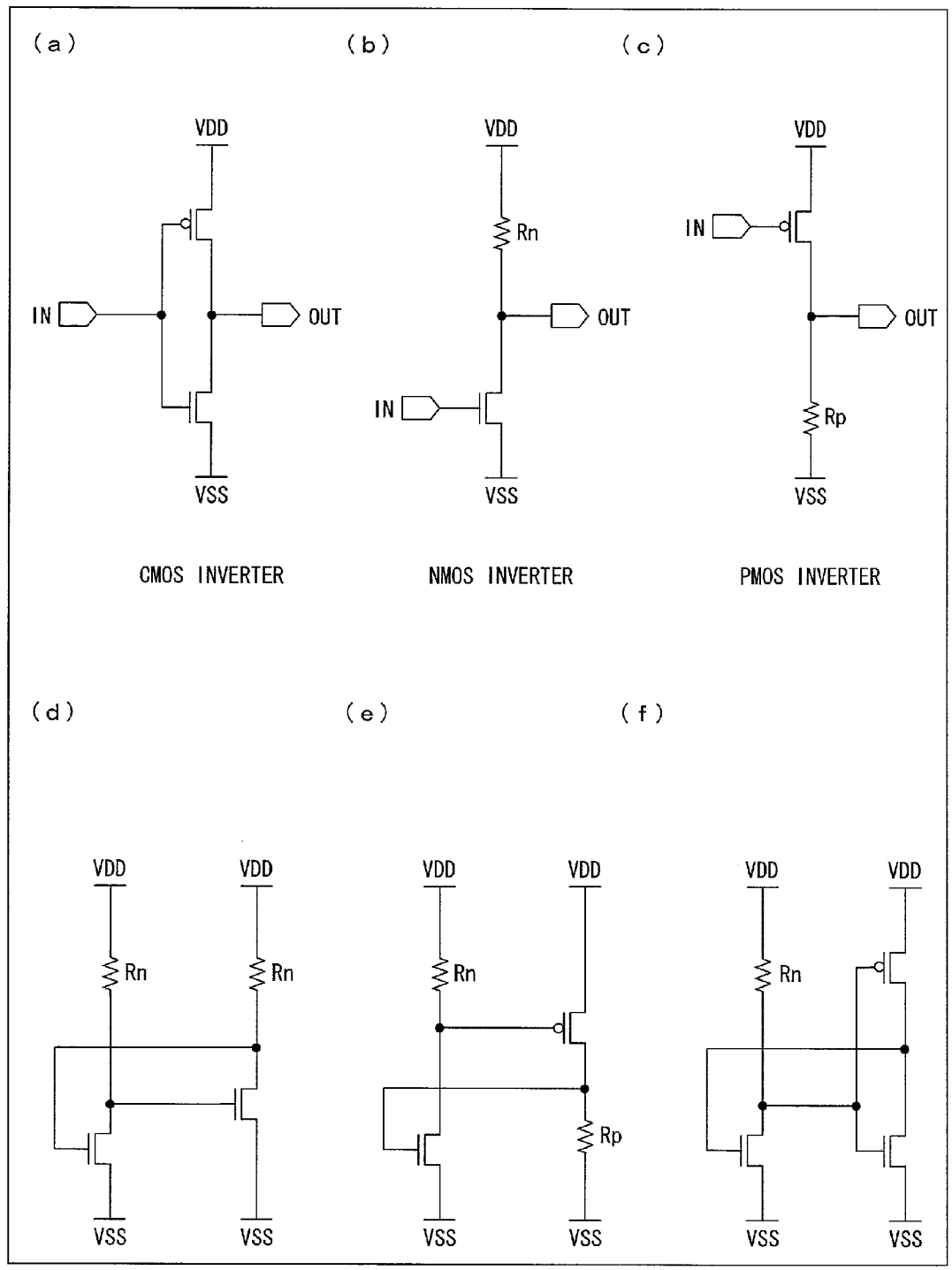

FIG. 55 is circuit diagrams of configuration examples of inverters INV1, INV2 of a unit circuit according to the present invention; (a) illustrates a CMOS inverter; (b) illustrates an NMOS inverter; (c) illustrates a PMOS inverter; and (d) to (f) illustrate configuration examples of the inverters INV1, INV2.

Figure 36:
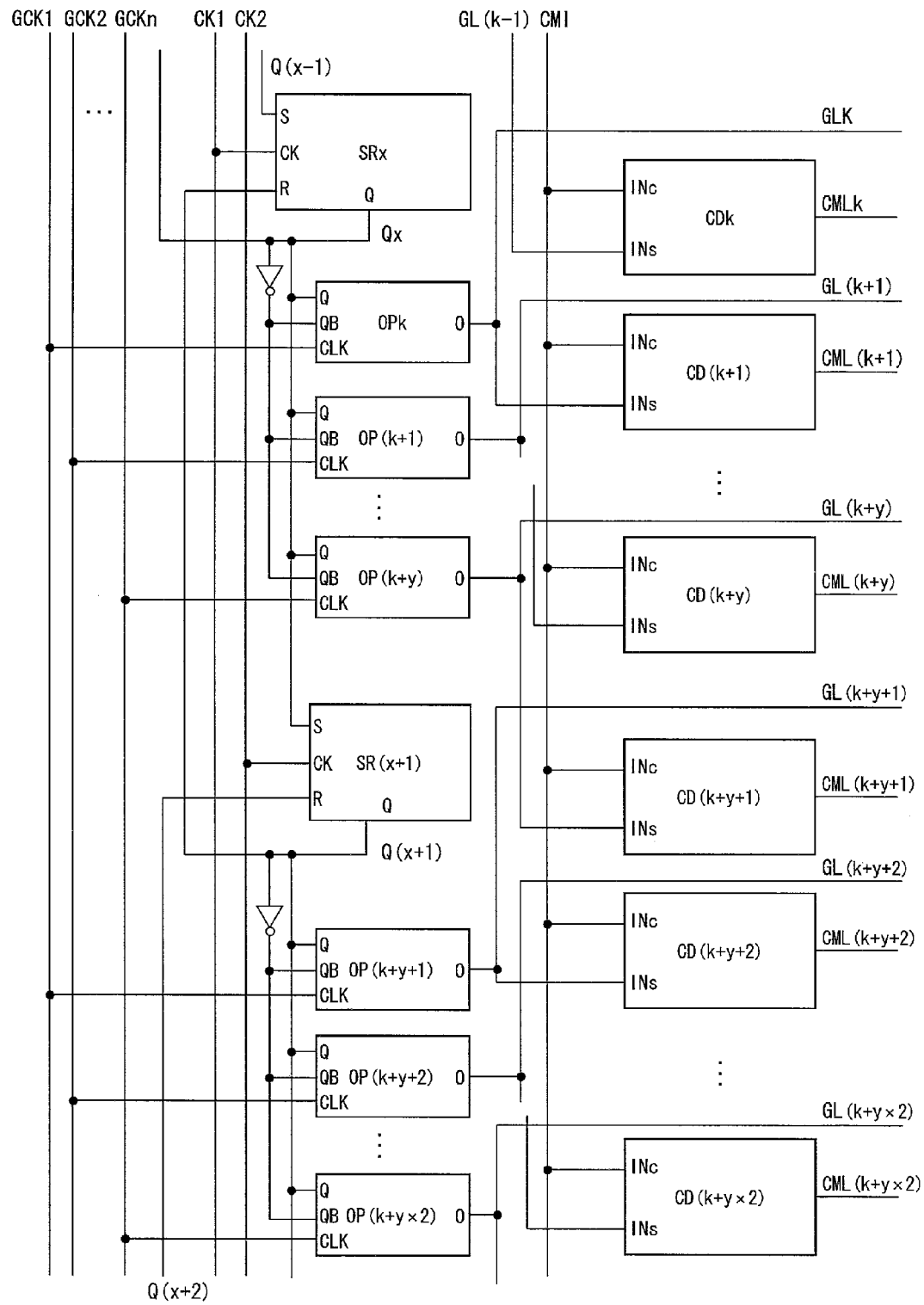
FIG. 36 is a block diagram illustrating another configuration of the common electrode driving circuit of Embodiment 1.
Figure 56:
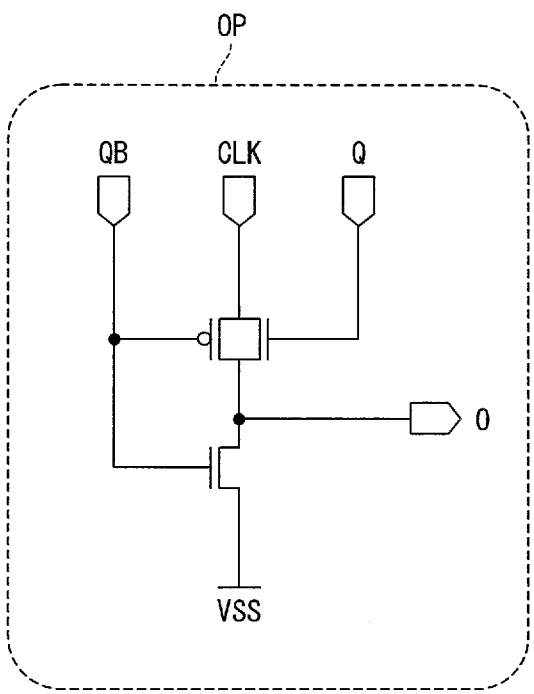

FIG. 56 a circuit diagram illustrating a pulse output section for generating a signal to be supplied to the unit circuit of FIG. 36.

Figure 57:
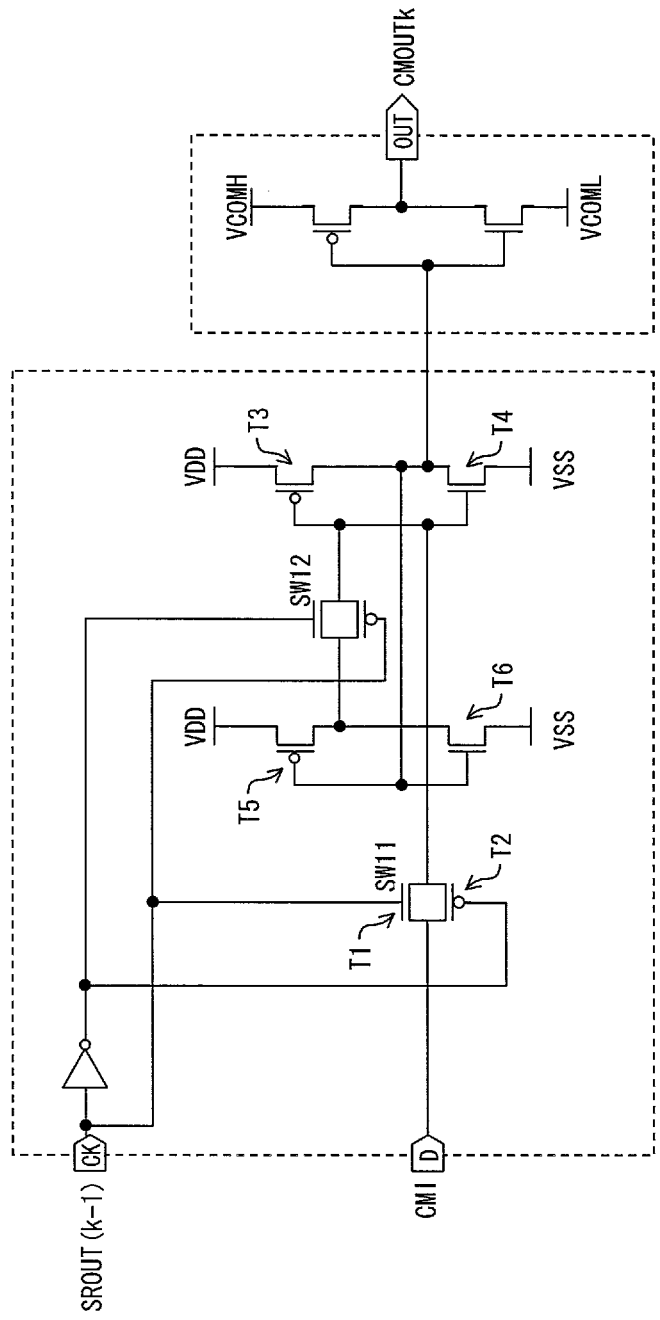

FIG. 57 is a circuit diagram of a retention circuit configuring a conventional common electrode driving circuit.

DESCRIPTION OF EMBODIMENTS

Embodiment 1

Figure 1:
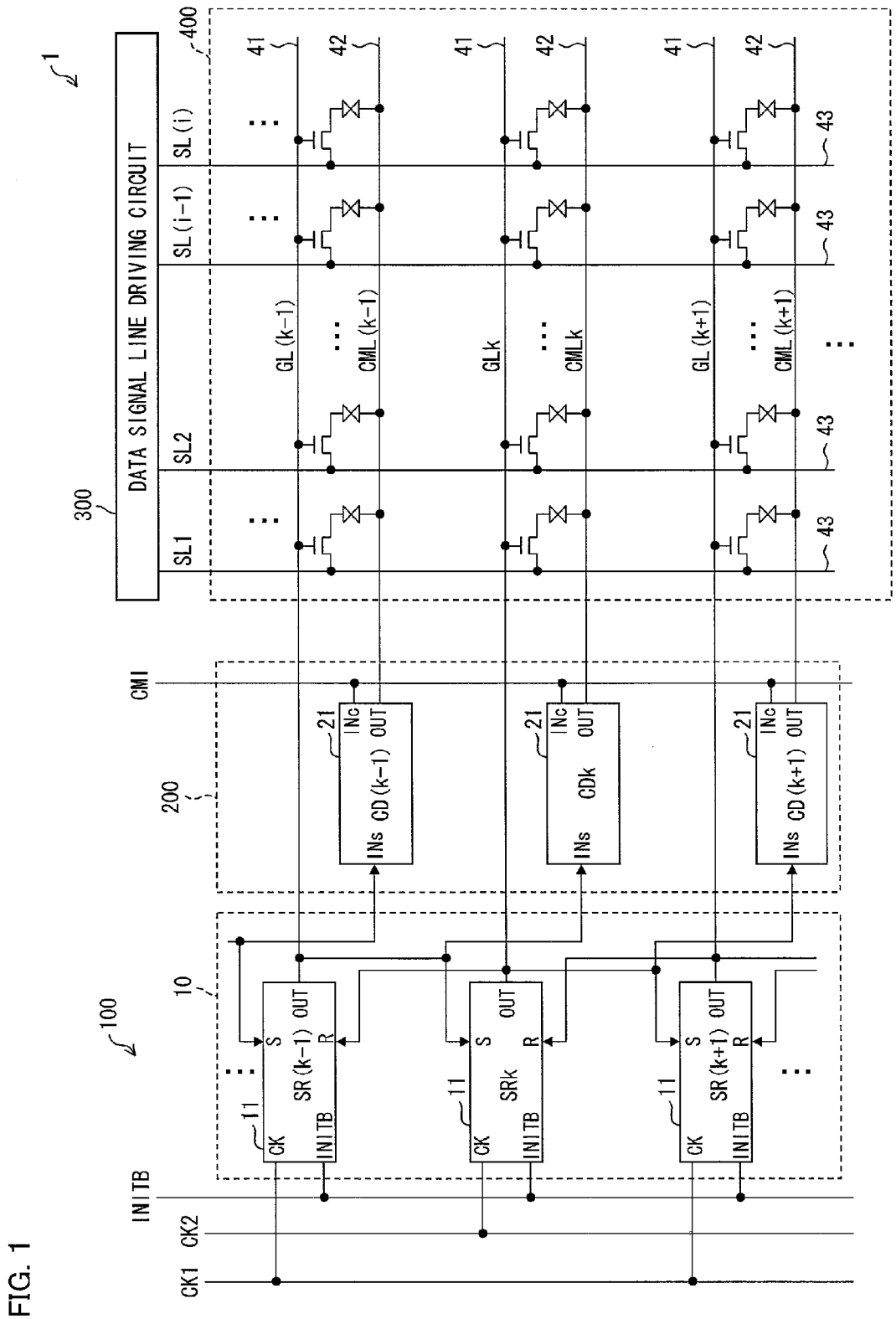
FIG. 1 is a block diagram illustrating a schematic configuration of a liquid crystal display device of Embodiment 1.
Figure 2:
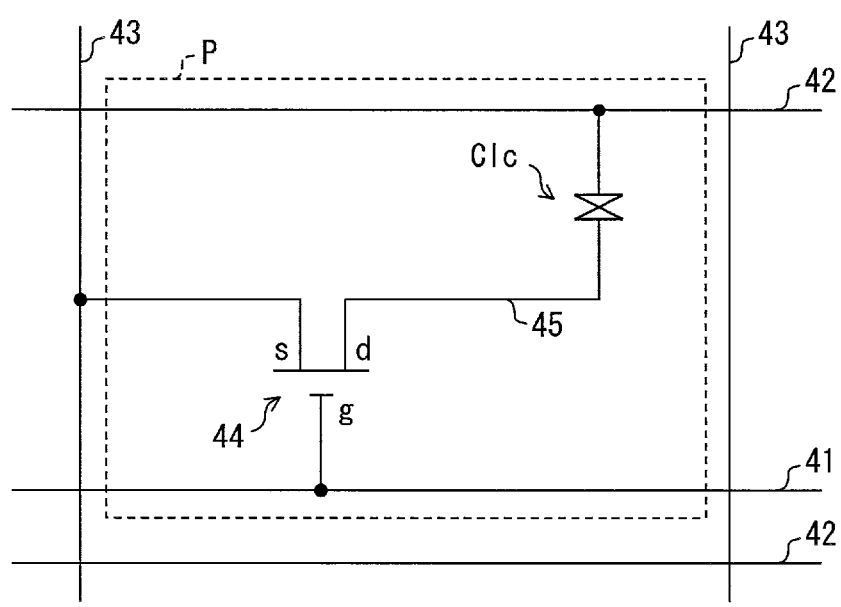
FIG. 2 is an equivalent circuit diagram of an electric configuration of a pixel of the liquid crystal display device shown in FIG. 1.

The following description will discuss Embodiment 1 according to the present invention. FIG. 1 is a block diagram illustrating a schematic configuration of a liquid crystal display device 1 of Embodiment 1, and FIG. 2 is an equivalent circuit diagram of an electric configuration of a pixel of the liquid crystal display device 1.

First, the schematic configuration of the liquid crystal display device 1 will be described with reference to FIG. 1 and FIG. 2. The liquid crystal display device 1 includes a scanning signal line driving circuit 100 (gate driver), a common electrode driving circuit 200 (COM driver), a data signal line driving circuit 300 (source driver), and a display panel 400. Further, the liquid crystal display device 1 also includes control circuits (not shown) for controlling respective driving circuits. Note that the driving circuits and pixel circuits may be monolithically formed on an active matrix substrate.

The display panel 400 is configured such that a liquid crystal (not shown) is sandwiched between an active matrix substrate (not shown) and a counter substrate (not shown), and has a large number of pixels P (FIG. 2) arrayed in matrix.

The display panel 400 includes, on the active matrix substrate, scanning signal lines 41 (GLn) (gate lines), common lines (common electrode line) 42 (CMLn), data signal lines 43 (SLi) (source lines), thin film transistors (hereinafter, also referred to as "TFT") 44, and pixel electrodes 45. Note that "i" and "n" are integers of 2 or more.

The scanning signal lines 41 are formed to be parallel to each other in a row direction (horizontal direction) so that one line is provided in each row. The data signal lines 43 are formed to be parallel to each other in a column direction (vertical direction) so that one line is provided in each column. As illustrated in FIG. 2, each of the TFTs 44 and each of the pixel electrodes 45 correspond to an intersection of ones of the scanning signal lines 41 and the data signal lines 43, and a gate electrode g of the TFT 44 is connected to a corresponding scanning signal line 41, a source electrode s thereof is connected to a corresponding data signal line 43, and a drain electrode d thereof is connected to a corresponding pixel electrode 45. A capacitor Clc (including liquid crystal capacitor) is formed between the pixel electrode 45 and the common line 42.

Therefore, gradation can be displayed in accord with a source signal by (i) switching on the gate of the TFT 44 with use of a gate signal (scanning signal) supplied to the scanning signal line 41, (ii) writing the source signal (data signal) of the data signal line 43 to the pixel electrodes 45 so as to set a potential of the pixel electrode 45 in accord with the source signal, and (iii) applying a voltage in accord with the source signal to a liquid crystal provided between the pixel electrode 45 and the common line 42.

The display panel 400 as configured above is driven by the scanning signal line driving circuit 100, the common electrode driving circuit 200, the data signal line driving circuit 300, and control circuits for controlling those circuits 100, 200, and 300.

In Embodiment 1, in an active period (active scanning period) of a vertical scanning period which is periodically repeated, horizontal scanning periods in rows are subsequently allotted and the rows are subsequently scanned.

Therefore, the scanning signal line driving circuit 100 synchronizes gate signals for switching on the TFTs 44 with horizontal scanning periods in respective rows, thereby supplying the gate signals subsequently to the scanning signal lines 41 in the rows.

Based on an output signal (SROUT) of the shift register 10 configuring the scanning signal line driving circuit 100, the common electrode driving circuit 200 supplies a high-level signal (Vcomh) (first potential) or low-level signal (Vcoml) (second potential) to each common line 42.

The data signal line driving circuit 300 supplies a source signal to each data signal line 43. The source signal is obtained by (i) allotting an image signal, which has been supplied to the data signal line driving circuit 300 via the control circuit from the outside of the liquid crystal display device 1, to each row of the data signal line driving circuit 300, and (ii) subjecting the image signal to voltage increase etc.

The control circuits control the scanning signal line driving circuit 100, the common electrode driving circuit 200, and the data signal line driving circuit 300, which have been described above, to output gate signals, source signals, and common signals.

The liquid crystal display device 1 of Embodiment 1 is configured to perform a stable operation by preventing decrease in potential level of an output signal of the common electrode driving circuit 200 while reducing a circuit area. The following description will discuss specific configurations of the scanning signal line driving circuit 100 and the common electrode driving circuit 200.

The shift register 10 configuring the scanning signal line driving circuit 100 is configured by connecting multiple m (m is an integer of 2 or more) unit circuits 11. Each of the unit circuits 11 is made up of a clock terminal (CK terminal), a set terminal (S terminal), a reset terminal (R terminal), an initialization terminal (INITB terminal), and an output terminal OUT. Hereinafter, signals inputted and outputted via those terminals will be referred to with use of reference name of the terminals (e.g., a signal inputted via a clock terminal CK will be referred to as "clock signal CK").

To the shift register 10, a start pulse (not shown) and double-phase clock signals CK1, CK2 are supplied from the outside. The start pulse is supplied to an S terminal of a first unit circuit 11. The clock signals CK1 are supplied to CK terminals of (odd-number)th unit circuits 11, meanwhile, the clock signals CK2 are supplied to CK terminals of (even-number)th unit circuits 11. An output of each unit circuit 11, which is as an output signal SROUT, is supplied, via an output terminal OUT, to a corresponding scanning signal line GL, to an S terminal of a subsequent unit circuit 11, and to an R terminal of a preceding unit circuit 11. Further, the output signal SROUT of the each unit circuit 11 is supplied to a corresponding unit circuit 21 of the common electrode driving circuit 200.

The common electrode driving circuit 200 is configured by connecting multiple n (n is an integer of 2 or more) unit circuits 21 (retention circuits). Each of the unit circuits 21 is made up of input terminals INs, INc, and an output terminal OUT. The output signal SROUT of the shift register 10 is supplied to the input terminal INs of the unit circuit 21, a polarity signal CMI (retention target signal) is supplied to the input terminal INc of the unit circuit 21, and an output from the unit circuit 21 is supplied, as an output signal CMOUT, to a common line (COM line) CML.

Specifically, an output signal SROUT(k−1) of a (k−1)th unit circuit 11 of the shift register 10 is supplied to a kth (k is an integer of 1 or more but n or less) unit circuit 21 of the common electrode driving circuit 200, and the kth unit circuit 21 supplies an output signal CMOUTk to a common line CMLk. As described above, the common electrode driving circuit 200 subsequently supplies output signals CMOUT1 to CMOUTn to common lines CML1 to CMLn, respectively, in accordance with a shift operation of the shift register 10. Note that, to a first unit circuit 21, a start pulse of the shift register 10 is supplied.

As the shift register 10, a well-known configuration can be applied. Therefore, detailed description of the shift register 10 will be omitted, and the following description will discuss the common electrode driving circuit 200 in detail.

Example 1

Figure 3:
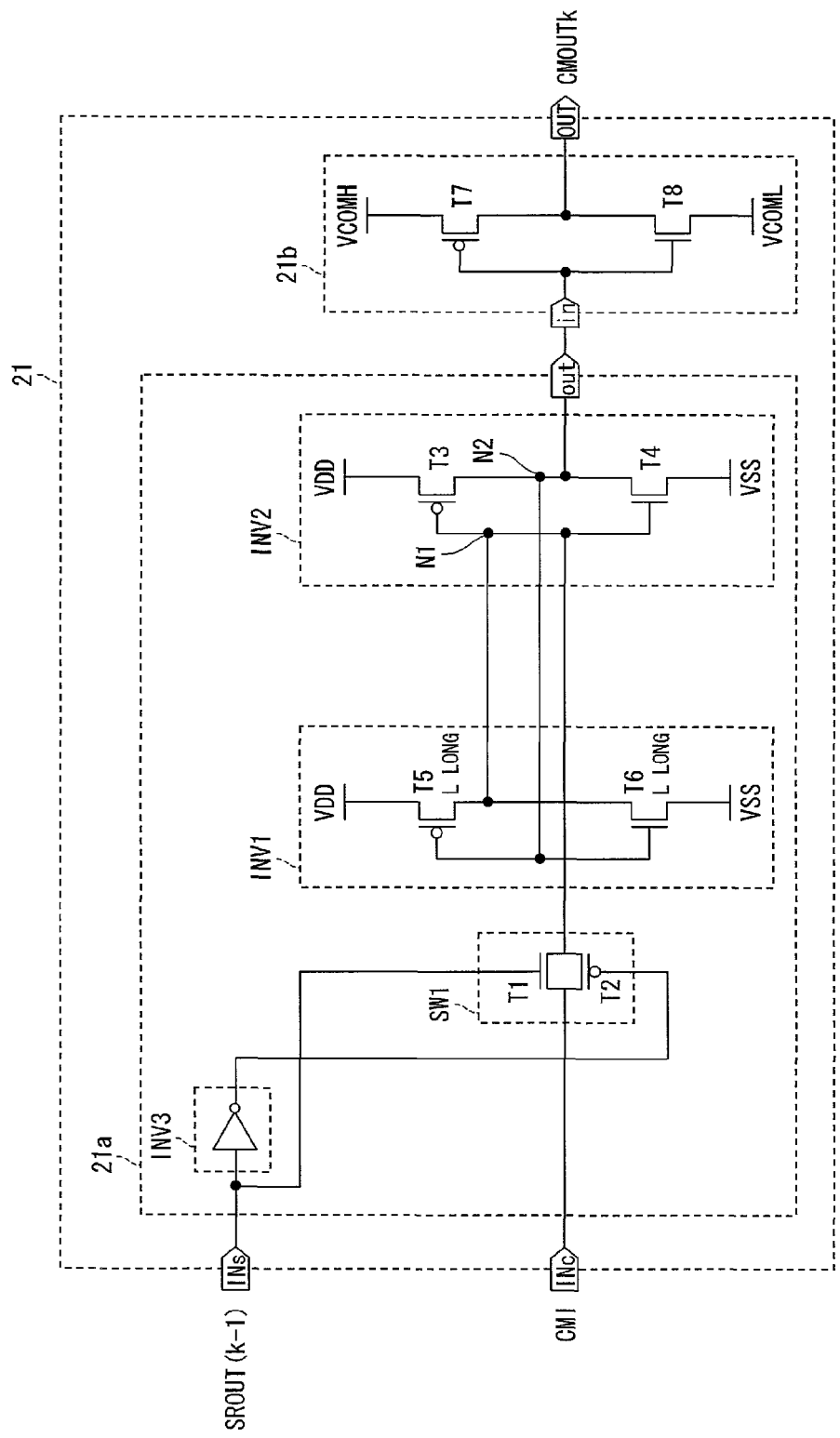
FIG. 3 is a circuit diagram of a unit circuit included in a common electrode driving circuit of Example 1.

FIG. 3 is a circuit diagram of the unit circuit 21 included in the common electrode driving circuit 200 of Example 1. As illustrated in FIG. 3, the unit circuit 21 (retention circuit) includes a latch through circuit 21a and a buffer 21b. The latch through circuit 21a includes inverters INV1 (first inverter), INV2 (second inverter), and INV3, and an analog switch circuit SW1. The buffer 21b includes two transistors. Hereinafter, in the inverter INV2, a connection point between an output of the inverter INV1 and an input of the inverter INV2 is defined as a node N1 (first connection point) and a connection point between an input of the inverter INV1 and an output of the inverter INV2 is defined as a node N2.

An input terminal of the inverter INV3 is connected to the input terminal INs of the unit circuit 21. The analog switch circuit SW1 includes an N channel type transistor T1 (first transistor) and a P channel transistor T2. The transistor T1 is connected to the input terminal INs at its gate terminal, and is connected to the input terminal INc of the unit circuit 21 at its source terminal. The transistor T2 is connected to an output terminal of the inverter INV3 at its gate terminal, and is connected to the input terminal INc at its source terminal. An output signal SROUT of the unit circuit 11 of the shift register 10 is supplied to the input terminal INs, meanwhile, a polarity signal CMI is supplied to the input terminal INc.

The inverter INV2 is made up of a P channel type transistor T3 (fourth transistor) and an N channel type transistor T4 (fifth transistor). An input terminal (connection point (node N1) between a gate terminal of the transistor T3 and a gate terminal of the transistor T4) of the inverter INV2 is connected to an output terminal (drain terminals of the transistors T1, T2) of the analog switch circuit SW1. A power supply voltage Vdd (high potential) is supplied to a source terminal of the transistor T3, meanwhile, a drain terminal of the transistor T3 is connected to an output terminal (connection point (node N2) between the drain terminal of the transistor T3 and a drain terminal of the transistor T4) of the inverter INV2. A power supply voltage Vss (low potential) is supplied to the source terminal of the transistor T4, meanwhile, the drain terminal of the transistor T4 is connected to the output terminal (node N2) of the inverter INV2. The node N2 is connected to an output terminal "out" of the latch through circuit 21a and an input terminal (gate terminals of transistor T5, T6) of the inverter INV1.

The inverter INV1 includes a P channel type transistor T5 (second transistor) and an N channel type transistor T6 (third transistor). The input terminal (gate terminals of the transistors T5, T6) of the inverter INV1 is connected to the output terminal (node N2) of the inverter INV2. A power supply voltage Vdd is supplied to a source terminal of the transistor T5, and a drain terminal of the transistor T5 is connected to an output terminal (connection point between the drain terminal of the transistor T5 and a drain terminal of the transistor T6) of the inverter INV1. A power supply voltage Vss is supplied to a source terminal of the transistor T6, and the drain terminal of the transistor T6 is connected to the output terminal of the inverter INV1. The output terminal of the inverter INV1 is connected to the input terminal (node N1) of the inverter INV2. The output terminal "out" of the latch through circuit 21a is connected to an input terminal "in" of the buffer 21b. Here, the transistors T5, T6 have respective channel lengths L longer than those of the transistors T3, T4 so as to have driving capabilities smaller than those of the transistors T3, T4.

The buffer 21b includes a P channel type transistor T7 and an N channel type transistor T8. Gate terminals of the transistors T7, T8 are connected to the input terminal "in". A power supply voltage Vcomh is supplied to a source terminal of the transistor T7, and a drain terminal of the transistor T7 is connected to the output terminal OUT of the unit circuit 21. A power supply voltage Vcoml is supplied to a source terminal of the transistor T8, and a drain terminal of the transistor T8 is connected to the output terminal OUT of the unit circuit 21.

Therefore, the output signal SROUT(k−1) of the (k−1)th unit circuit 11 of the shift register 10 is supplied to the input terminal INs of the kth unit circuit 21, and the output signal CMOUTk is supplied to the kth common line CMLk via the output terminal OUT of the kth unit circuit 21.

The common electrode driving circuit 200, including the unit circuit 21 configured as described above, subsequently outputs output signals CMOUT1 to CMOUTn one by one, whose voltages are alternately changed (high level (Vcomh) or low level (Vcoml)) in each frame. Hereinafter, potentials of signals inside the common electrode driving circuit 200, including the clock signals CK1, CK2, and potentials of input and output signals are defined to be Vdd in the case where the potentials are at a high level, and are defined to be Vss in the case where the potentials are at a low level, unless otherwise specified. Further, a potential of the polarity signal CMI is also defined to be Vdd in the case where the potential is at a high level, and is defined to be Vss in the case where the potential is at a low level. Note, however, that a potential level of the polarity signal CMI is not limited thereto, and "high level" only needs to be higher than an inverted potential of the inverter INV2, whereas "low level" only needs to be lower than the inverted potential of the inverter INV2.

(Operation)

Figure 4:
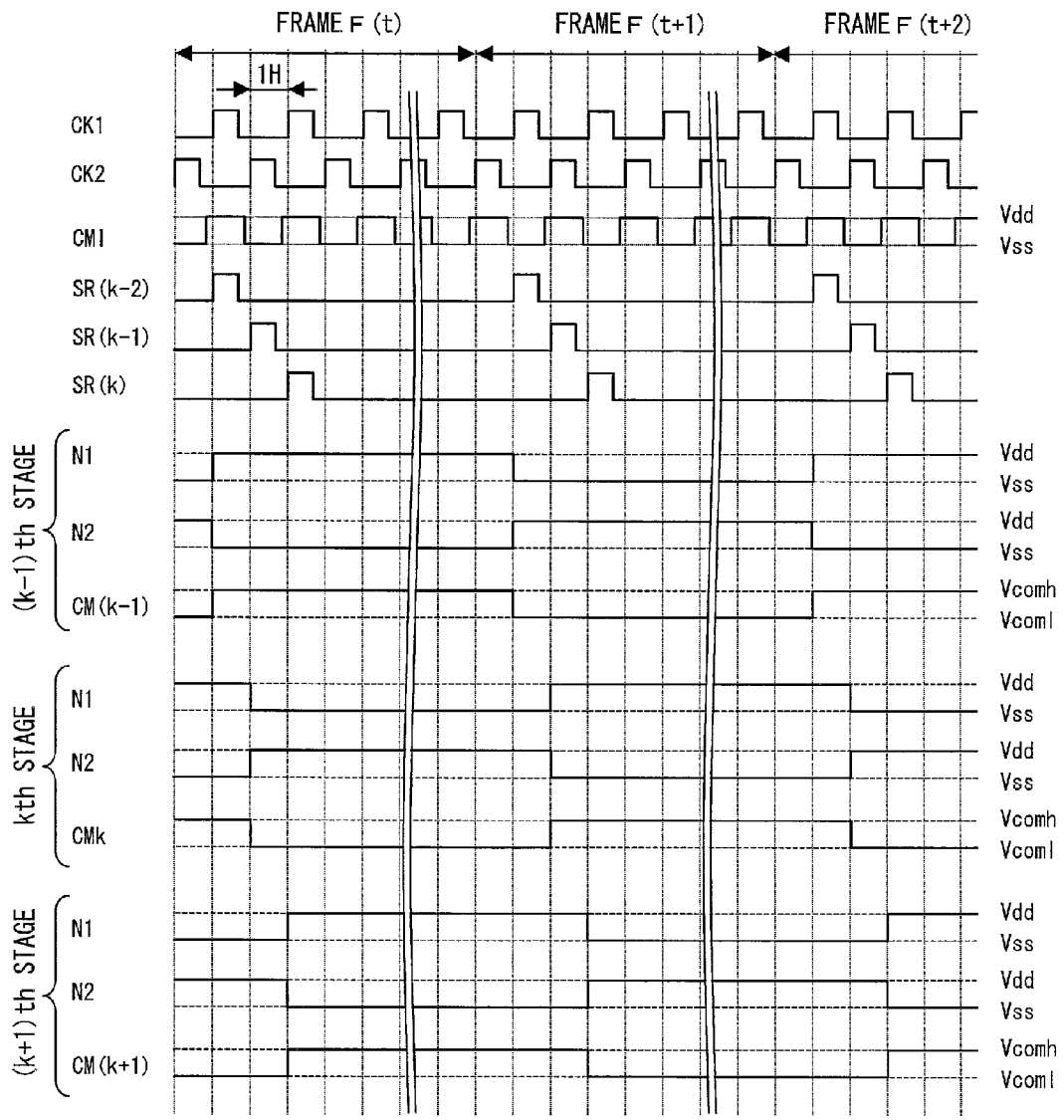
FIG. 4 is a timing chart at the time of an operation of the common electrode driving circuit of Example 1.
Figure 5:
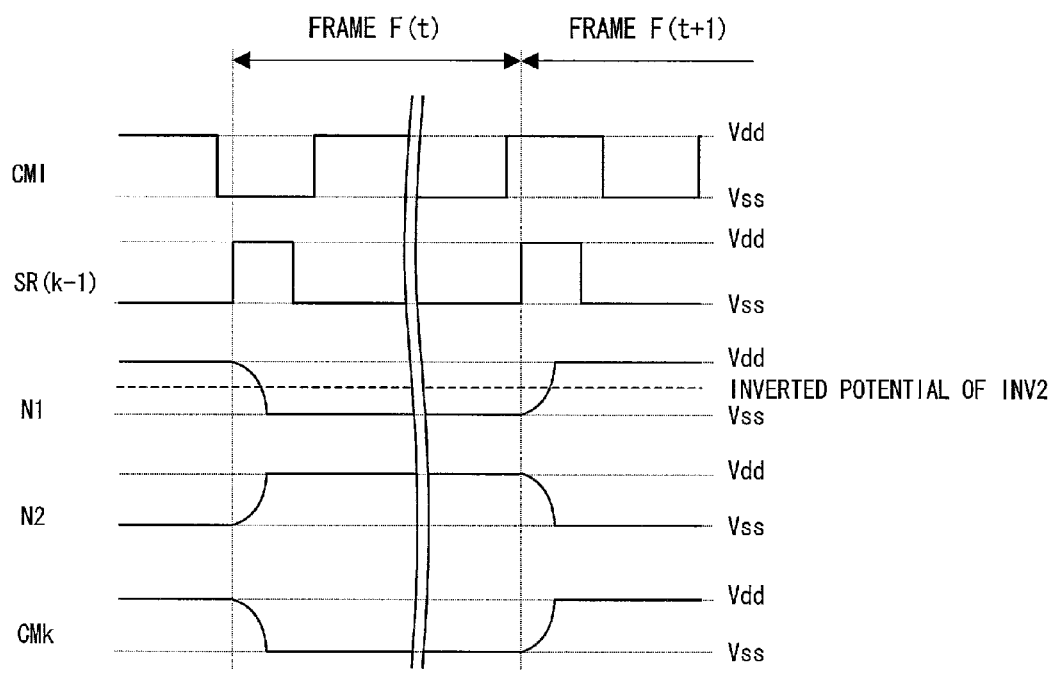
FIG. 5 is a schematic view showing a timing chart at the time of an operation of the common electrode driving circuit of Example 1.

An operation of the common electrode driving circuit 200 will be described with reference to FIG. 4 and FIG. 5. FIG. 4 is a timing chart at the time of an operation of the common electrode driving circuit 200. FIG. 5 is a schematic view showing a timing chart at the time of an operation of the common electrode driving circuit 200. In FIG. 4, input and output signals are illustrated in the (k−1)th unit circuit 21, the kth unit circuit 21, and a (k+1)th unit circuit 21.

CK1 is a clock signal to be supplied to each of the CK terminals of the (odd-number)th unit circuits 11, meanwhile, CK2 is a clock signal to be supplied to each of the CK terminals of the (even-number)th unit circuits 11. CMI is a signal (polarity signal) whose polarity is inverted in each horizontal scanning period (1H). SR(k−2), SR(k−1), and SRn indicate potentials of output signals SROUT(k−2), SROUT(k−1), and SROUTk of a (k−2)th unit circuit 11, the (k−1)th unit circuit 11, and the kth unit circuit 11, respectively, of the shift register 10. N1 and N2 indicate a potential of the node N1 and a potential of the node N2, respectively, of FIG. 3. CM(k−1), CMk, and CM(k+1) indicate output signals CMOUT(k−1), CMOUTk, and CMOUT(k+1) of the (k−1)th unit circuit 21, the kth unit circuit 21, and the (k+1)th unit circuit 21, respectively, of the common electrode driving circuit 200. Note that a period after the output signal SROUT(k−2) is outputted but until the next output signal SROUT(k−2) is outputted corresponds to one vertical scanning period (1 frame: 1 V). Further, FIG. 4 shows arbitrarily sequential frames F(t), F(t+1), and F(t+2).

First, the following description will discuss operations in the frames F(t), F(t+1) of the kth unit circuit 21.

In the frame F(t), an output signal SROUT(k−1) (high level (active)) of the (k−1)th unit circuit 11 of the shift register 10 is supplied to the input terminal INs of the kth unit circuit 21. This switches on the analog switch circuit SW1, with the result that a polarity signal CMI (low level; Vss) is received by the latch through circuit 21*a*.

Immediately before the output signal SROUT(k−1) becomes a high level (active), a potential of the node N1 is retained at Vdd (high level) and the transistor T5 is in an ON state. Therefore, when the output signal SROUT(k−1) becomes the high level (active), Vss (low level) of the polarity signal CMI and a power supply VDD (high level) (high-potential-side power supply) are short-circuited. As to this point, the transistor T5 of the inverter INV1 is set to have a long channel length L and therefore has a low driving capability. Therefore, a potential of the node N1 is made closer to that of the polarity signal CMI, thereby decreasing to a potential (potential lower than an inverted potential of the inverter INV2) which is close to Vss (low level) of the polarity signal CMI (see FIG. 5).

Thereafter, the transistor T3 is switched on, and an output (node N2; Vdd (high level)) of the inverter INV2 is fed back to the input of the inverter INV1, which results in switching off the transistor T5 and switching on the transistor T6. This further decreases the potential of the node N1 from the potential close to Vss of the polarity signal CMI to Vss (see FIG. 5).

The potential of the node N1 becomes close to Vss (low level) or becomes Vss (low level), which results in switching on the transistor T3 of the inverter INV2 and switching off the transistor T4 of the inverter INV2. This switching on of the transistor T3 causes the potential of the node N2 to be Vdd (high level), and Vdd (high level) is outputted from the latch through circuit 21*a*. In addition, in the buffer 21*b*, to which Vdd (high level) is supplied, the transistor T7 is switched off, whereas the transistor T8 is switched on. As such, Vcoml is outputted from the buffer 21*b* and is supplied to a kth common line CMLk.

Then, the output signal SROUT(k−1) of the shift register 10 changes from the high level (active) to the low level (non-active), the analog switch circuit SW1 is switched off, and therefore an input of the polarity signal CMI is interrupted, with the result that the node N1 retains the potential (Vss (low level)) which has been retained immediately before such interruption because of a latch operation of the inverters INV1, INV2, and the buffer 21*b* keeps supplying the Vcoml to the kth common line CMLk until the output signal SROUT(k−1) becomes the high level (active) in the frame F(t+1).

Next, in the frame F(t+1), when the output signal SROUT(k−1) of the (k−1)th unit circuit 11 of the shift register 10 becomes the high level (active), the analog switch circuit SW1 switched on, with the result that a polarity signal CMI (high level; Vdd) is received by the latch through circuit 21*a*.

Immediately before the output signal SROUT(k−1) becomes the high level (active) (in the frame F(t)), the potential of the node N1 is retained at Vss (low level) and the transistor T6 is in an ON state, which causes short circuit between Vdd (high level) of the polarity signal CMI and the power supply VSS (low level) (low-potential-side power supply) in the case where the output signal SROUT(k−1) becomes the high level (active). As to this point, because the transistor T6 of the inverter INV1 is set to have a long channel length L and therefore has a low driving capability, the potential of the node N1 is made closer to that of the polarity signal CMI, which results in increasing to a potential close to Vdd (high level) of the polarity signal CMI (potential higher than the inverted potential of the inverter INV2) (see FIG. 5).

Thereafter, the output (node N2; Vss (low level)) of the inverter INV2 is fed back to the input of the inverter INV1, which switching on the transistor T5 and switching off the transistor T6. This further increases the potential of the node N1 from the potential close to Vdd of the polarity signal CMI to Vdd (see FIG. 5).

The potential of the node N1 becomes close to Vdd (high level) or becomes Vdd (high level), which results in switching on the transistor T4 and switching off the transistor T3 of the inverter INV2. This switching on of the transistor T4 causes the potential of the node N2 to become Vss (low level), which results in outputting Vss (low level) from the latch through circuit 21*a*. Then, in the buffer 21*b* to which Vss (low level) is supplied, the transistor T8 is switched off and the transistor T7 is switched on, which in turn supplies the Vcomh from the buffer 21*b* to the kth common line CMLk.

Then, when the output signal SROUT(k−1) of the shift register 10 is changed from the high level (active) to the low level (non-active), the analog switch circuit SW1 is switched off, and, therefore, an input of the polarity signal CMI is interrupted, with the result that the node N1 retains the potential (Vdd (high level)) which has been retained immediately before such interruption because of a latch operation of the inverters INV1, INV2, and the buffer 21*b* keeps supplying the Vcomh to the kth common line CMLk until the output signal SROUT(k−1) becomes the high level (active) in a frame F(t+2) kth. After the frame F(t+2), the operations in the frames F(t), F(t+1) are repeated.

The following description will discuss operations in the frames F(t), F(t+1) in the (k+1)th unit circuit 21.

In the frame F(t), an output signal SROUTk (high level (active)) of the kth unit circuit 11 of the shift register 10 is supplied to the input terminal INs of the k+1 th unit circuit 21. This switches on the analog switch circuit SW1, with the result that a polarity signal CMI (high level; Vdd) is received by the latch through circuit 21*a*.

Immediately before the output signal SROUTk becomes a high level (active), a potential of the node N1 is retained at Vss (low level) and the transistor T6 is in an ON state. Therefore, when the output signal SROUTk becomes the high level (active), Vdd (high level) of the polarity signal CMI and a power supply VSS (low level) are short-circuited. As to this point, the transistor T6 of the inverter INV1 is set to have a long channel length L and therefore has a low driving capability. Therefore, a potential of the node N1 is made closer to that of the polarity signal CMI, thereby increasing to a potential (potential higher than an inverted potential of the inverter INV2) which is close to Vdd (high level) of the polarity signal CMI.

Thereafter, the transistor T4 is switched on, and an output (node N2; Vss (low level)) of the inverter INV2 is fed back to the input of the inverter INV1, which results in switching on the transistor T5 and switching off the transistor T6. This further increases the potential of the node N1 from the potential close to Vdd of the polarity signal CMI to Vdd.

The potential of the node N1 becomes close to Vdd (high level) or becomes Vdd (high level), which results in switching on the transistor T4 of the inverter INV2 and switching off the transistor T3 of the inverter INV2. This switching on of the transistor T4 causes the potential of the node N2 to be Vss (low level), and Vss (low level) is outputted from the latch through circuit 21a. In addition, in the buffer 21b, to which Vss (low level) is supplied, the transistor T8 is switched off, whereas the transistor T7 is switched on. As such, Vcomh is outputted from the buffer 21b and is supplied to a (k+1)th common line CML(k+1).

Then, the output signal SROUTk of the shift register 10 changes from the high level (active) to the low level (non-active), the analog switch circuit SW1 is switched off, and therefore an input of the polarity signal CMI is interrupted, with the result that the node N1 retains the potential (Vdd (high level)) which has been retained immediately before such interruption because of a latch operation of the inverters INV1, INV2, and the buffer 21b keeps supplying the Vcomh to the (k+1)th common line CML(k+1) until the output signal SROUTk becomes the high level (active) in the frame F(t+1).

Next, in the frame F(t+1), when the output signal SROUTk of the kth unit circuit 11 of the shift register 10 becomes the high level (active), the analog switch circuit SW1 switched on, with the result that a polarity signal CMI (low level; Vss) is received by the latch through circuit 21a.

Immediately before the output signal SROUTk becomes the high level (active) (in the frame F(t)), the potential of the node N1 is retained at Vdd (high level) and the transistor T5 is in an ON state, which causes short circuit between Vss (low level) of the polarity signal CMI and the power supply VDD (high level) in the case where the output signal SROUTk becomes the high level (active). As to this point, because the transistor T5 of the inverter INV1 is set to have a long channel length L and therefore has a low driving capability, the potential of the node N1 is made closer to that of the polarity signal CMI, which results in decreasing to a potential close to Vss (low level) of the polarity signal CMI (potential lower than the inverted potential of the inverter INV2).

Thereafter, the transistor T3 is switched on, and an output (node N2; Vdd (high level)) of the inverter INV2 is fed back to an input of the inverter INV1, which switching off the transistor T5 and switching on the transistor T6. This further decreases the potential of the node N1 from the potential close to Vss of the polarity signal CMI to Vss.

The potential of the node N1 becomes close to Vss (low level) or becomes Vss (low level), which results in switching on the transistor T3 of the inverter INV2 and switching off the transistor T4. This switching on of the transistor T3 causes the potential of the node N2 to become Vdd (high level), which results in outputting Vdd (high level) from the latch through circuit 21a. Then, in the buffer 21b to which Vdd (high level) is supplied, the transistor T7 is switched off and the transistor T8 is switched on, which in turn supplies the Vcoml from the buffer 21b to the (k+1)th common line CML(k+1).

Then, when the output signal SROUTk of the shift register 10 is changed from the high level (active) to the low level (non-active), the analog switch circuit SW1 is switched off, and, therefore, an input of the polarity signal CMI is interrupted, with the result that the node N1 retains the potential (Vss (low level)) which has been retained immediately before such interruption because of a latch operation of the inverters INV1, INV2, and the buffer 21b keeps supplying the Vcoml to the (k+1)th common line CML(k+1) until the output signal SROUTk becomes the high level (active) in a frame F(t+2) kth. After the frame F(t+2), the operations in the frames F(t), F(t+1) are repeated.

As compared with the conventional unit circuit shown in FIG. 57, the analog switch circuit SW12 is omitted in the unit circuit 21 of Example 1. This reduces the circuit scale of the common electrode driving circuit 200. Therefore, it is possible to achieve further slim bezel of the liquid crystal display device. Further, no malfunction is caused by the reduction in circuit scale.

In configuration shown in FIG. 3, the transistors T5, T6 are individually increased in channel lengths, however, the present invention is not limited thereto. For example, the channel lengths L may be substantially increased by connecting plural stages of transistors in series and connecting the gate terminals to each other. In this case, the gate terminals can be shared by the transistors T5, T6, so that it is unnecessary to provide lines of the output signal SROUT(k−1) and its inversion signal to a gate terminal of the analog switch circuit SW12, unlike a conventional unit circuit (see FIG. 57). It is therefore possible to reduce the circuit scale correspondingly.

The following description will discuss another form of the common electrode driving circuit (COM driver) of Embodiment 1. Note that, in the following description, differences between the another form and the common electrode driving circuit 200 of Example 1 will be mainly described. Therefore, members having the like functions as the figures described in Example 1 are denoted by the like reference signs and the detailed description thereof is omitted.

Example 2

Figure 6:
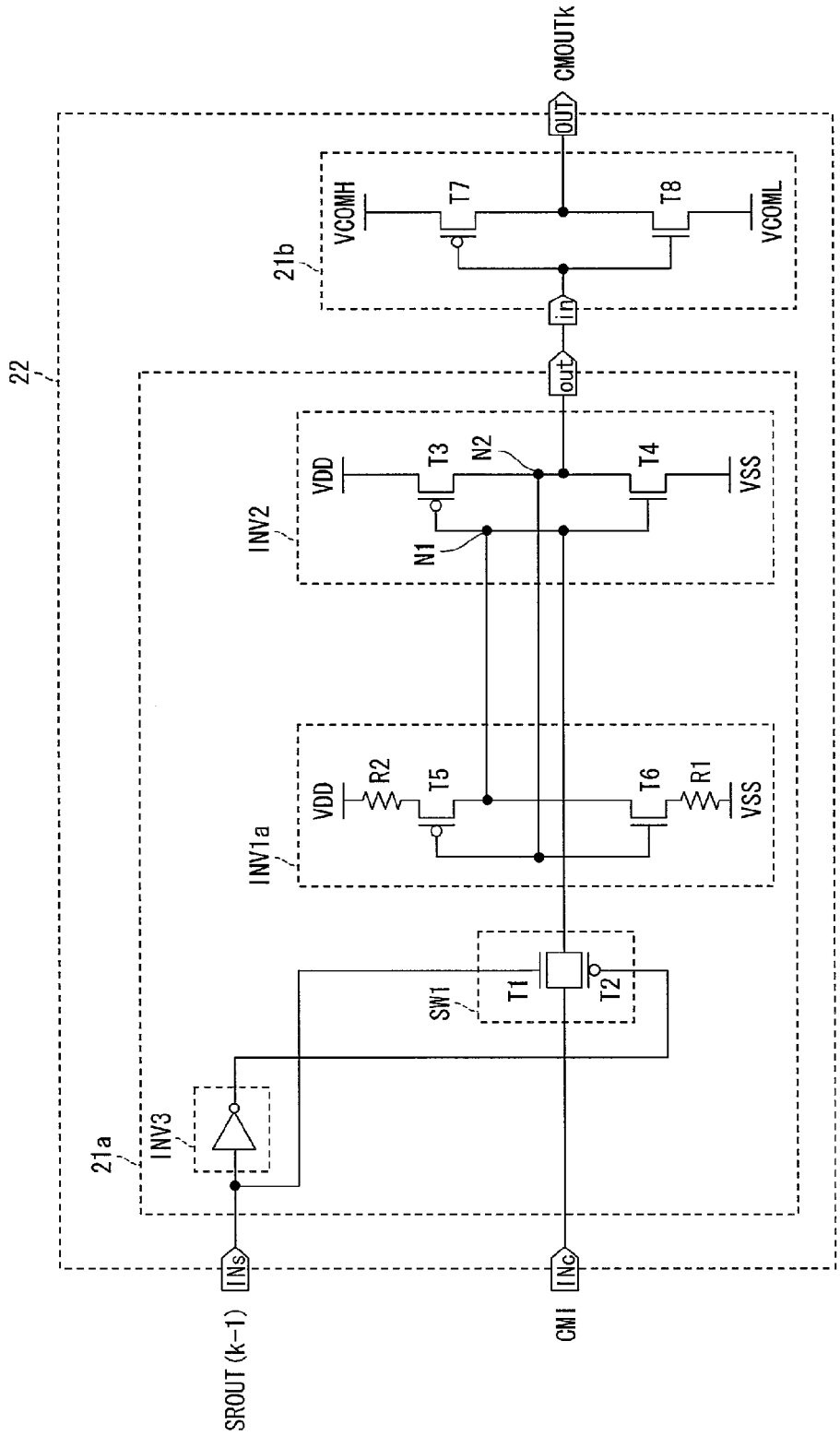
FIG. 6 is a circuit diagram of a unit circuit included in a common electrode driving circuit of Example 2.

FIG. 6 is a circuit diagram of a unit circuit 22 included in a common electrode driving circuit 200 of Example 2. As shown in FIG. 6, an inverter INV1a of the unit circuit 22 is configured by adding a resistor R1 (first resistor) and a resistor R2 (second resistor) to the inverter INV1 of the unit circuit 21 (see FIG. 3) in Example 1. Further, transistors T5, T6 configuring the inverter INV1a of the unit circuit 22 are set to have channel lengths L identical with those of transistors T3, T4 of an inverter INV2.

In the inverter INV1a, the resistor R2 is connected to a power supply VDD at one terminal thereof and is connected to a source terminal of the transistor T5 at the other terminal thereof, meanwhile, the resistor R1 is connected to a power supply VSS at one terminal thereof and is connected to a source terminal of the transistor T6 at the other terminal thereof. Note that the resistors R1, R2 have a resistance from several kΩ to several MΩ.

(Operation)

An operation of the common electrode driving circuit 200 of Example 2 will be described. Timing charts used are identical with those of FIG. 4 and FIG. 5. The following description will mainly discuss differences between Examples 1 and 2 by exemplifying operations of a kth unit circuit 22 in frames F(t), F(t+1).

First, in the frame F(t), when an output signal SROUT(k−1) (high level (active)) is supplied to an input terminal INs of the kth unit circuit 22, the analog switch circuit SW1 is switched on, with the result that a polarity signal CMI (low level; Vss) is received by latch through circuit 21a.

Immediately before the output signal SROUT(k−1) becomes a high level (active), a potential of the node N1 is retained at Vdd (high level) and the transistor T5 is in an ON state. Therefore, when the output signal SROUT(k−1) becomes the high level (active), Vss (low level) of the polarity signal CMI and a power supply VDD (high level) are short-circuited. As to this point, because the resistor R2 is provided between the power supply VDD and the node N1, a potential of the node N1 is made closer to that of the polarity signal CMI, thereby decreasing to a potential (potential lower than an inverted potential of the inverter INV2) which is close to Vss (low level) of the polarity signal CMI (see FIG. 5).

Thereafter, the transistor T3 is switched on, and an output (node N2; Vdd (high level)) of the inverter INV2 is fed back to the input of the inverter INV1a, which results in switching off the transistor T5 and switching on the transistor T6. This further decreases the potential of the node N1 from the potential close to Vss of the polarity signal CMI to Vss (see FIG. 5).

The potential of the node N1 becomes close to Vss (low level) or becomes Vss (low level), which results in switching on the transistor T3 of the inverter INV2 and switching off the transistor T4 of the inverter INV2. This switching on of the transistor T3 causes the potential of the node N2 to be Vdd (high level), and Vdd (high level) is outputted from the latch through circuit 21a. In addition, in the buffer 21b, to which Vdd (high level) is supplied, the transistor T7 is switched off, whereas the transistor T8 is switched on. As such, Vcoml is outputted from the buffer 21b and is supplied to a kth common line CMLk.

Then, the output signal SROUT(k−1) of the shift register 10 changes from the high level (active) to the low level (non-active), the analog switch circuit SW1 is switched off, and therefore an input of the polarity signal CMI is interrupted, with the result that the node N1 retains the potential (Vss (low level)), and the buffer 21b keeps supplying the Vcoml to the kth common line CMLk until the output signal SROUT(k−1) becomes the high level (active) in the frame F(t+1).

Next, in the frame F(t+1), when the output signal SROUT (k−1) becomes the high level (active), the analog switch circuit SW1 switched on, with the result that a polarity signal CMI (high level; Vdd) is received by the latch through circuit 21a.

Immediately before the output signal SROUT(k−1) becomes the high level (active) (in the frame F(t)), the potential of the node N1 is retained at Vss (low level) and the transistor T6 is in an ON state, which causes short circuit between Vdd (high level) of the polarity signal CMI and the power supply VSS (low level) in the case where the output signal SROUT(k−1) becomes the high level (active). As to this point, because the resistor R1 is provided between the power supply VSS and the node N1, the potential of the node N1 is made closer to that of the polarity signal CMI, which results in increasing to a potential close to Vdd (high level) of the polarity signal CMI (potential higher than the inverted potential of the inverter INV2) (see FIG. 5).

Thereafter, the transistor T4 is switched on, and an output (node N2; Vss (low level)) of the inverter INV2 is fed back to the input of the inverter INV1a, which switching on the transistor T5 and switching off the transistor T6. This further increases the potential of the node N1 from the potential close to Vdd of the polarity signal CMI to Vdd (see FIG. 5).

The potential of the node N1 becomes close to Vdd (high level) or becomes Vdd (high level), which results in switching on the transistor T4 and switching off the transistor T3 of the inverter INV2. This switching on of the transistor T4 causes the potential of the node N2 to become Vss (low level), which results in outputting Vss (low level) from the latch through circuit 21a. Then, in the buffer 21b to which Vss (low level) is supplied, the transistor T8 is switched off and the transistor T7 is switched on, which in turn supplies the Vcomh from the buffer 21b to the kth common line CMLk.

Then, when the output signal SROUT(k−1) of the shift register 10 is changed from the high level (active) to the low level (non-active), the analog switch circuit SW1 is switched off, and, therefore, an input of the polarity signal CMI is interrupted, with the result that the node N1 retains Vdd (high level) and the buffer 21b keeps supplying the Vcomh to the kth common line CMLk until the output signal SROUT(k−1) becomes the high level (active) in a frame F(t+2) kth. After the frame F(t+2), the operations in the frames F(t), F(t+1) are repeated.

With this, it is possible to achieve a similar effect to that of Example 1. Further, in Example 2, resistors are used. Resistors can be arbitrarily changed in shape. This makes it possible to locate resistors effectively and to further reduce a circuit scale.

Note that, in FIG. 6, in order to reduce a through current occurring when an output signal of the inverter INV2 is changed, for example, a resistor may be provided between the transistor T3 and the power supply VDD and another resistor may be provided between the transistor T4 and the power supply VSS. Therefore, it is unnecessary to directly connect the source terminals of transistors T3, T4 to the power supplies VDD, VSS, respectively, and it is only necessary to supply a high potential signal to the source terminal of the transistor T3 and supply a low potential signal to the source terminal of the transistor T4.

Example 3

Figure 7:
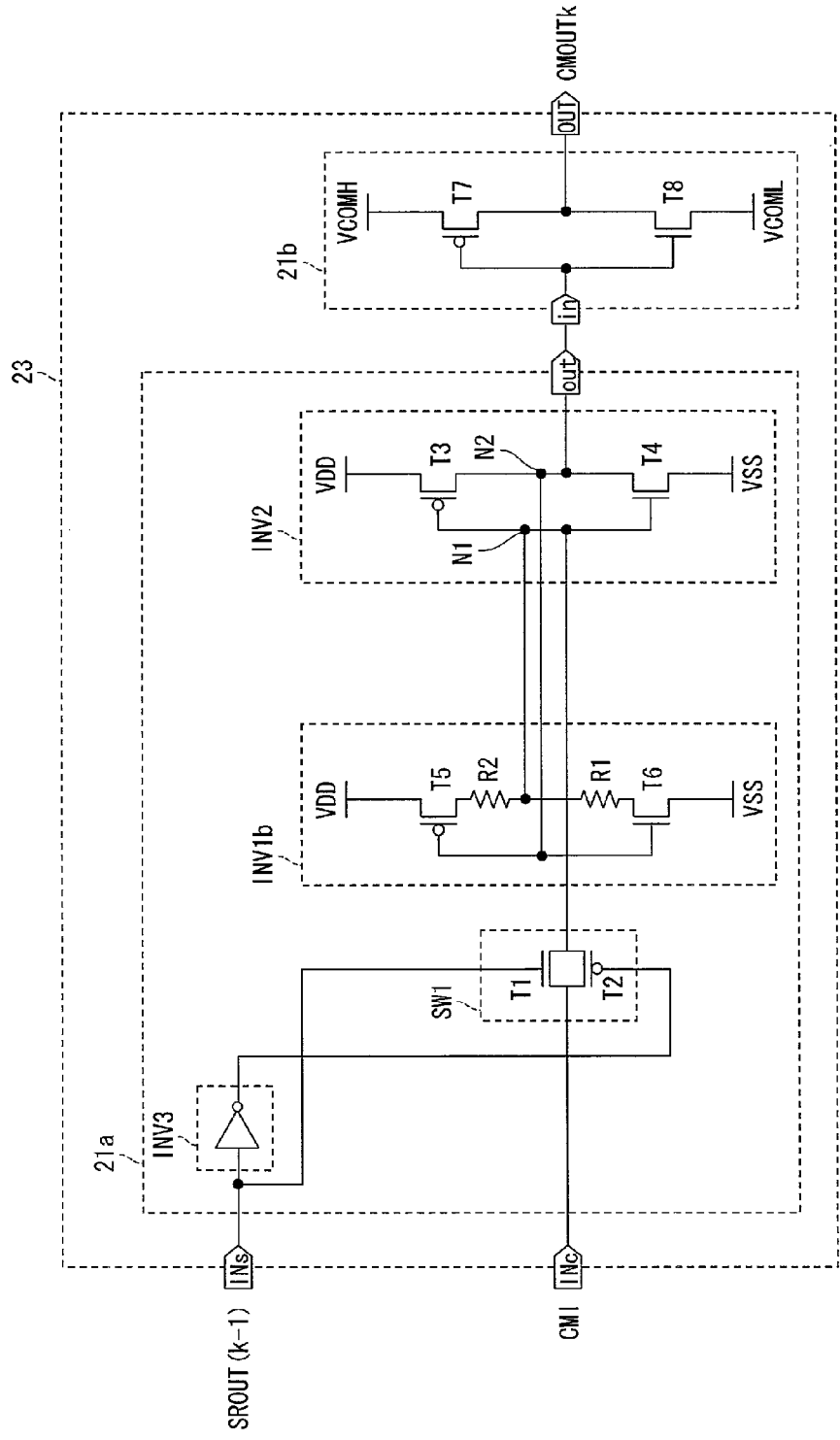
FIG. 7 is circuit diagram of a unit circuit included in a common electrode driving circuit of Example 3.

FIG. 7 is a circuit diagram of a unit circuit 23 included in a common electrode driving circuit 200 of Example 3. As shown in FIG. 7, resistors R1 and R2 of an inverter INV1b in the unit circuit 23 are provided in different locations from those in the inverter INV1a in the unit circuit 22 (see FIG. 6) of Example 2.

Specifically, in the inverter INV1b, one terminal of the resistor R2 is connected to a drain terminal of a transistor T5 and the other terminal of the resistor R2 is connected to a node N1, whereas one terminal of the resistor R1 is connected to a drain terminal of a transistor T6 and the other terminal of the resistor R1 is connected to the node N1.

With this configuration, as well as in Example 2, even in a case where an output signal SROUT(k−1) is at a high level (active) and thus Vss (low level) of a polarity signal CMI and a power supply VDD (high level) are short-circuited, a potential of the node N1 is made closer to that of the polarity signal CMI since the resistor R2 is provided between the power supply VDD and the node N1. Thus, the potential of the node N1 decreases to a potential close to Vss (low level) of the polarity signal CMI (potential lower than an inverted potential of the inverter INV2). and thereafter decreases to Vss due to feedback of an output (Vdd) of the inverter INV2. Further, even in a case where Vdd (high level) of the polarity signal CMI and a power supply VSS (low level) are short-circuited, a potential of the node N1 is made closer to that of the polarity signal CMI since the resistor R1 is provided between the power supply VSS and the node N1. Therefore, the potential of the node N1 increases to a potential close to Vdd of the polarity signal CMI (potential higher than an inverted potential of the inverter INV2), and thereafter increases to Vdd due to feedback of an output (Vss) of the inverter INV2.

With this, it is possible to achieve a similar effect to that of Example 2. Note that the configuration of FIG. 7 may include additional resistors on the sides of source terminals of transistors T5 and T6 (see Example 2).

Example 4

Figure 8:
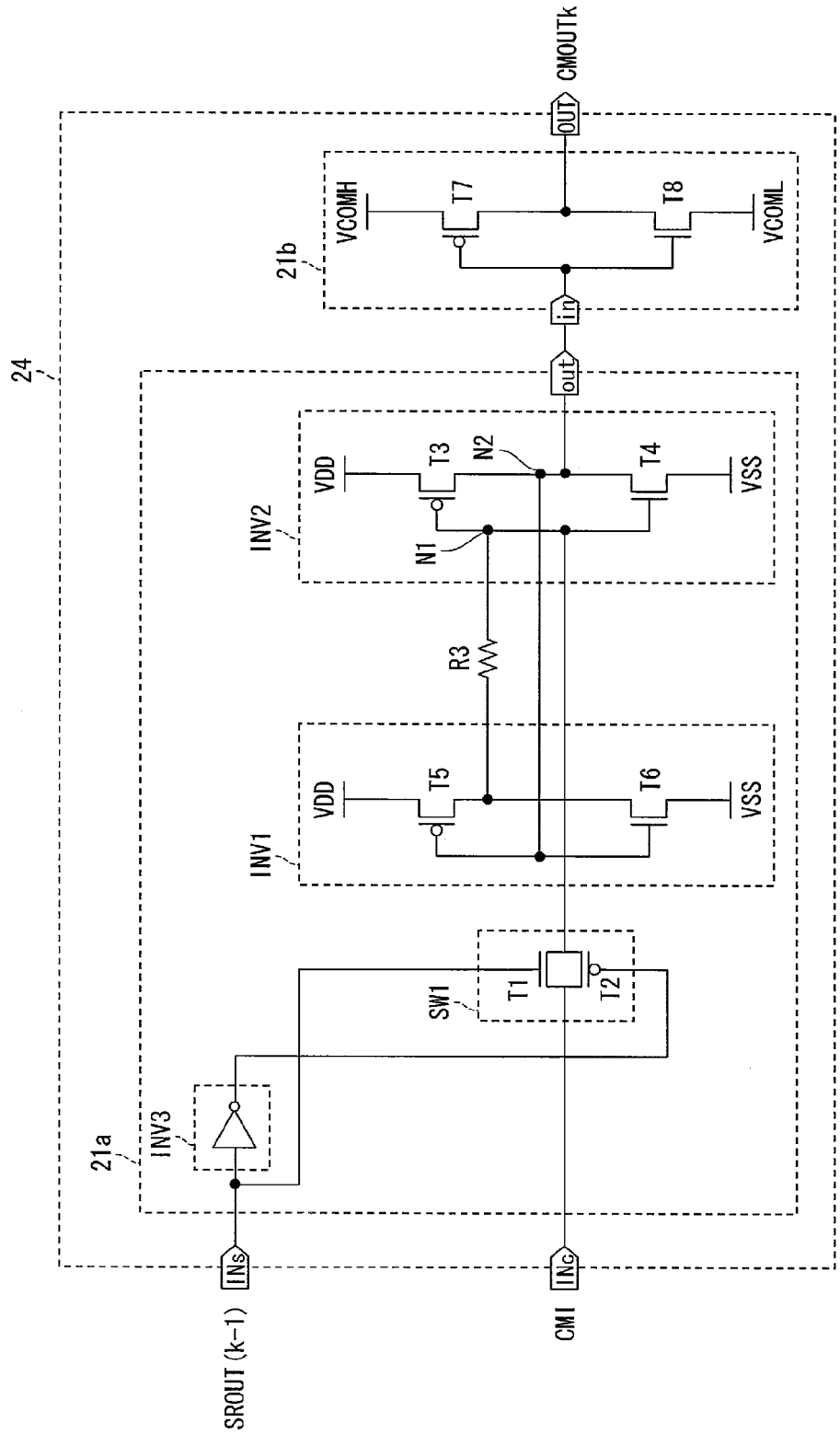
FIG. 8 is a circuit diagram of a unit circuit included in a common electrode driving circuit of Example 4.

FIG. 8 is a circuit diagram of a unit circuit 24 included in a common electrode driving circuit 200 of Example 4. As shown in FIG. 8, the unit circuit 24 corresponds to the unit circuit 21 (see FIG. 3) of Example 1 additionally including a resistor R3 between an output terminal of an inverter INV1 and an input terminal (node N1) of an inverter INV2. In the unit circuit 24, the transistors T5 and T6 configuring the inverter INV1 are set to have channel lengths L identical to those of transistors T3 and T4 configuring the inverter INV2.

Specifically, one terminal of the resistor R3 is connected to an output terminal (i.e., a connection point between a drain terminal of the transistor T5 and a drain terminal of the transistor T6) of the inverter INV1, and the other terminal of the resistor R3 is connected to an input terminal (i.e., the node N1) of the inverter INV2. Note that the resistor R3 has a resistance from several kΩ to several MΩ.

With this configuration, as well as in Examples 2 and 3, even in a case where an output signal SROUT(k−1) is at a high level (active) and thus Vss (low level) of a polarity signal CMI and a power supply VDD (high level) are short-circuited, a potential of the node N1 is made closer to that of the polarity signal CMI since the resistor R3 is provided between the power supply VDD and the node N1. Thus, the potential of the node N1 decreases to a potential close to Vss (low level) of the polarity signal CMI (potential lower than an inverted potential of the inverter INV2), and thereafter decreases to Vss due to feedback of an output (Vdd) of the inverter INV2. Further, even in a case where Vdd (high level) of the polarity signal CMI and a power supply VSS (low level) are short-circuited, a potential of the node N1 is made closer to that of the polarity signal CMI since the resistor R3 is provided between the power supply VSS and the node N1. Thus, the potential of the node N1 increases to a potential close to Vdd of the polarity signal CMI (potential higher than an inverted potential of the inverter INV2), and thereafter increases to Vdd due to feedback of an output (Vss) of the inverter INV2.

With this, it is possible to achieve a similar effect to that of Example 2.

Example 5

Figure 9:
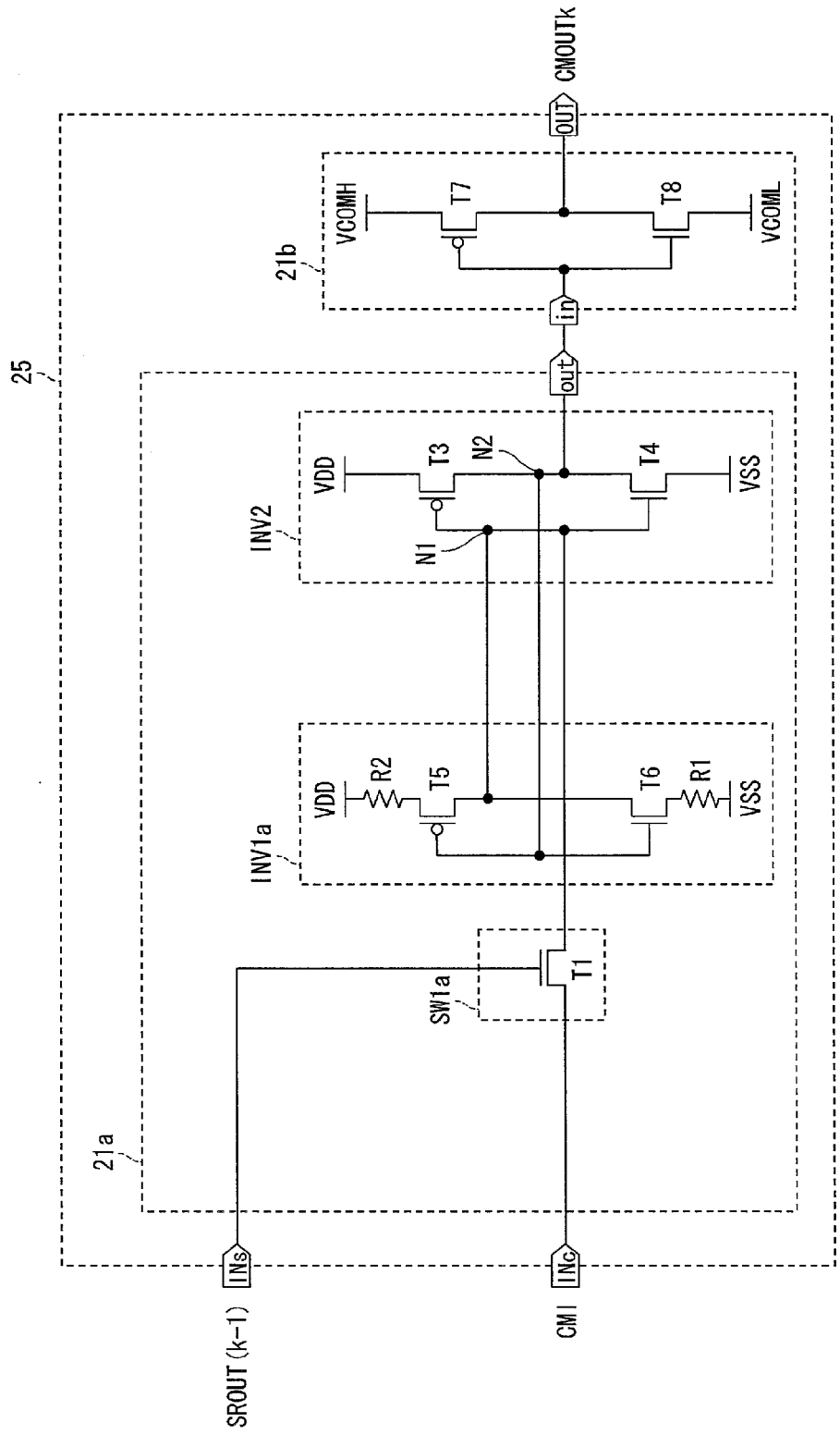
FIG. 9 is a circuit diagram of a unit circuit included in a common electrode driving circuit of Example 5.

FIG. 9 is a circuit diagram of a unit circuit 25 included in a common electrode driving circuit 200 of Example 5. As shown in FIG. 9, the unit circuit 25 corresponds to the unit circuit 22 (see FIG. 6) of Example 2 in which the inverter INV3 is omitted and the analog switch circuit SW1 is constituted only by an N channel type transistor T1.

Specifically, an analog switch circuit SW1a includes a transistor T1 whose gate terminal is connected to an input terminal INs of the unit circuit 25, whose source terminal is connected to an input terminal INc of the unit circuit 25, and whose drain terminal is connected to a node N1.

With this configuration, upon input of an output signal SROUT(k−1) (high level (active)) to the input terminal INs of a kth unit circuit 25, the analog switch circuit SW1a is switched on. In a case where a polarity signal CMI is at a low level (Vss), a potential of the node N1 becomes Vss. In a case where the polarity signal CMI is at a high level (Vdd), a potential of the node N1 becomes Vdd−Vth (threshold value).

Here, even in a case where the output signal SROUT(k−1) becomes a high level (active) and thus the low level (Vss) of the polarity signal CMI and a power supply VDD (high level) are short-circuited, a potential of the node N1 is made closer to that of the polarity signal CMI since a resistor R2 is provided between the power supply VDD and the node N1. Thus, the potential of the node N1 decreases to a potential close to Vss (low level) of the polarity signal CMI (potential lower than an inverted potential of the inverter INV2), and thereafter decreases to Vss due to feedback of an output (Vdd) of the inverter INV2. Further, even in a case where Vdd−Vth of the polarity signal CMI and a power supply VSS (low level) are short-circuited, a potential of the node N1 is made closer to that of the polarity signal CMI since a resistor R1 is provided between the power supply VSS and the node N1. Thus, the potential of the node N1 increases to a potential close to Vdd−Vth of the polarity signal CMI (potential higher than an inverted potential of the inverter INV2), and thereafter increases to Vdd due to feedback of an output (Vss) of the inverter INV2.

In a case where the polarity signal CMI is at a high level (Vdd), an output of the analog switch circuit SW1a is Vdd−Vth. This causes the transistor T1 in the analog switch circuit SW1a to have a relatively high resistance. This makes the potential of the node N1 difficult to increase, which causes an operation delay and/or a reduction in an operation margin. In order to avoid this, the unit circuit 25 is preferably configured such that, e.g., (i) the resistor R1 has a higher resistance (alternatively, a transistor T6 in the inverter INV1a is set to have a longer channel length L so as to have a reduced driving capability) and/or (ii) a transistor T4 in the inverter INV2 is set to have an increased size so that an inverted potential of the inverter INV2 is reduced.

In a case where (i) an output signal of the shift register 10 is an inversion signal of SROUT(k−1) or (ii) SROUT(k−1) is at a low level while SROUT(k−1) is active, the unit circuit 25 only needs to be configured such that the analog switch circuit SW1a is constituted by a P channel transistor T2 (see FIG. 6).

With this, it is possible to achieve a similar effect to that of Example 2. Further, since Example 5 omits the inverter INV3 and includes the analog switch circuit SW constituted only by the transistor T1, it is possible to further reduce the number of elements, thereby further reducing the circuit scale.

Example 6

Figure 10:
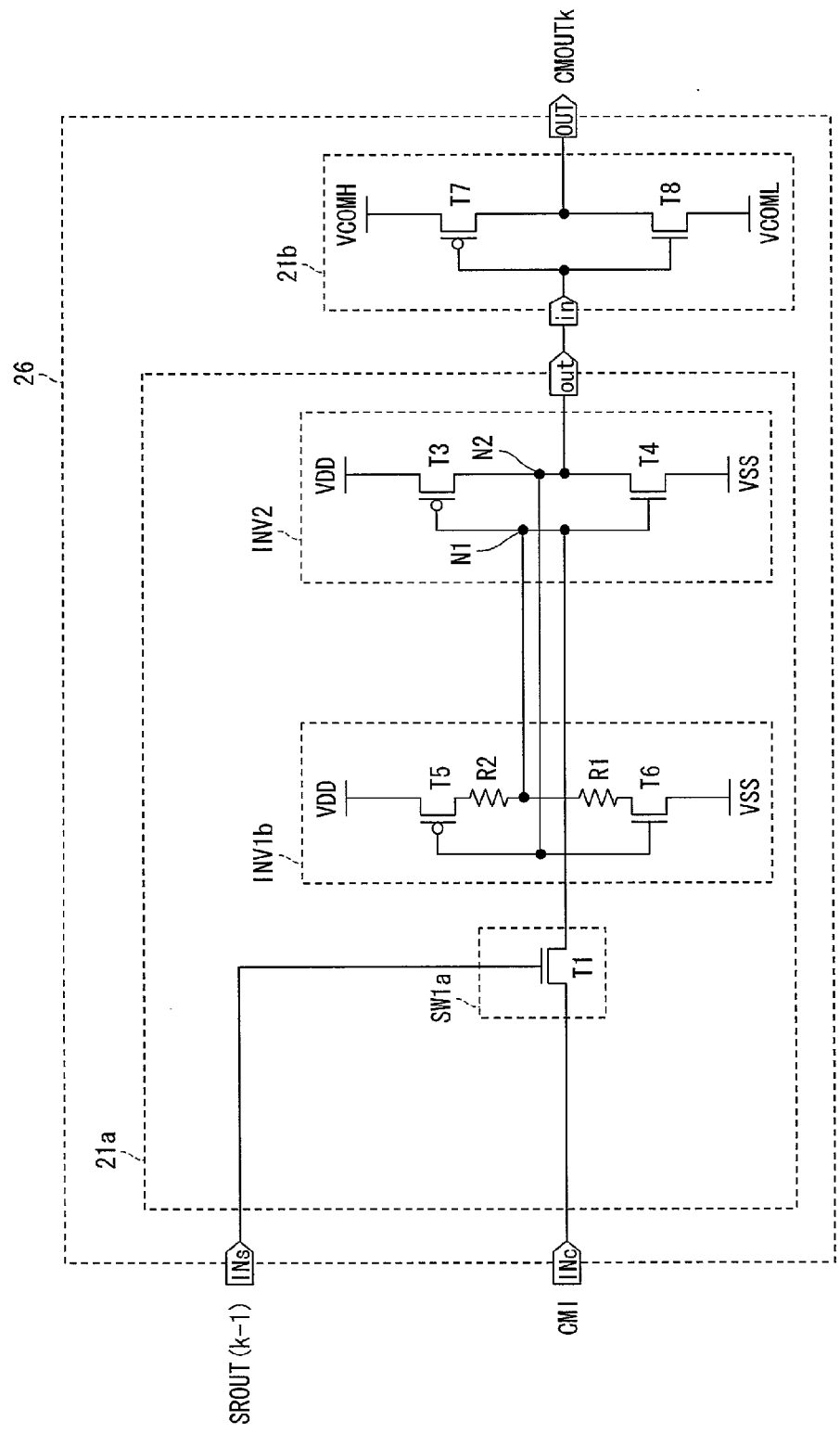
FIG. 10 is a circuit diagram of a unit circuit included in a common electrode driving circuit of Example 6.

FIG. 10 is a circuit diagram of a unit circuit 26 included in a common electrode driving circuit 200 of Example 6. As shown in FIG. 10, resistors R1 and R2 of an inverter INV1b in the unit circuit 26 are provided in different locations from those in the inverter INV1a in the unit circuit 25 (see FIG. 9) of Example 5.

Specifically, in the inverter INV1b, one terminal of the resistor R2 is connected to a drain terminal of a transistor T5 and the other terminal of the resistor R2 is connected to a node N1, whereas one terminal of the resistor R1 is connected to a drain terminal of a transistor T6 and the other terminal of the resistor R1 is connected to the node N1.

With this configuration, as well as in Example 5, even in a case where an output signal SROUT(k−1) is at a high level (active) and thus a low level (Vss) of a polarity signal CMI and a power supply VDD (high level) are short-circuited, a potential of the node N1 is made closer to that of the polarity signal CMI since the resistor R2 is provided between the power supply VDD and the node N1. Thus, the potential of the node N1 decreases to a potential close to Vss (low level) of the polarity signal CMI (potential lower than an inverted potential of the inverter INV2), and thereafter decreases to Vss due to feedback of an output (Vdd) of the inverter INV2. Further, even in a case where Vdd−Vth of the polarity signal CMI and a power supply VSS (low level) are short-circuited, a potential of the node N1 is made closer to that of the polarity signal CMI since the resistor R1 is provided between the power supply VSS and the node N1. Therefore, the potential of the node N1 increases to a potential close to Vdd−Vth of the polarity signal CMI (potential higher than an inverted potential of the inverter INV2), and thereafter increases to Vdd due to feedback of an output (Vss) of the inverter INV2.

With this, it is possible to achieve a similar effect to that of Example 5.

Example 7

Figure 11:
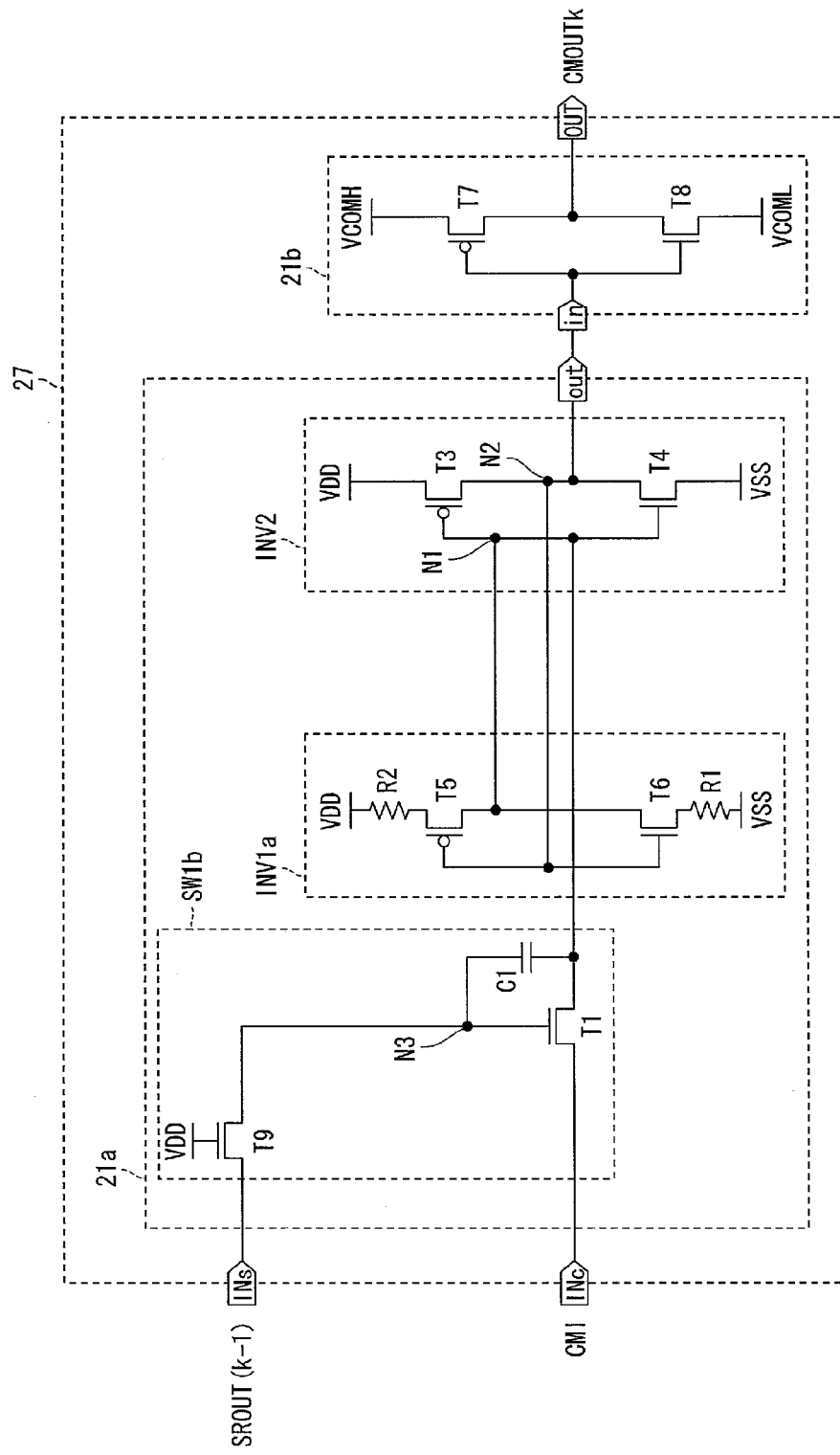
FIG. 11 is a circuit diagram of a unit circuit included in a common electrode driving circuit of Example 7.

FIG. 11 is a circuit diagram of a unit circuit 27 included in a common electrode driving circuit 200 of Example 7. As shown in FIG. 11, the unit circuit 27 corresponds to the unit circuit 25 (see FIG. 9) of Example 5 whose analog switch circuit SW1a additionally includes an N channel type transistor T9 and a capacitor C1.

Specifically, in an analog switch circuit SW1b of the unit circuit 27, the transistor T9 has a gate terminal supplied with a power supply voltage Vdd, is connected to an input terminal INs at its source terminal, and is connected to a gate terminal of a transistor T1 at its drain terminal. Further, in the analog switch circuit SW1b, the capacitor C1 is provided between the gate terminal and a drain terminal of the transistor T1. Note that a connection point between the capacitor C1 and the gate terminal of the transistor T1 is defined as a node N3.

With this configuration, upon input of an output signal SROUT(k−1) (high level (active)) to the input terminal INs of a kth unit circuit 27, a potential of the node N3 is charged to be Vdd−Vth, and thereafter the transistor T9 is switched off. The node N1 is supplied with Vdd (high level) of a polarity signal CMI, since the transistor T1 is switched on by the output signal SROUT(k−1) (high level). Consequently, a potential of the node N1 starts to increase from Vss (low level) to Vdd (high level). Due to the change in the potential of the node N1, a potential of the node N3 is caused to rise to Vdd−Vth+α via the capacitor C1. As a result, the polarity signal CMI (Vdd) is supplied to the node N1 without dropping to below a threshold value (Vth). Thus, the potential of the node N1 becomes Vdd (bootstrap operation).

Here, according to the unit circuit 25 of Example 5, in a case where a polarity signal CMI is at a high level (Vdd), a potential of the node N1 is Vdd−Vth until an output (Vss) of the inverter INV2 is fed back. On the contrary, according to the unit circuit 27 of Example 7, it is possible to set the potential of the node N1 at Vdd due to the bootstrap operation, thereby enabling to secure an operation margin. Except for the above operation, the unit circuit 27 operates in the same manner as the unit circuit 25 of Example 5.

In a case where (i) an output signal of the shift register 10 is an inversion signal of SROUT(k−1) or (ii) SROUT(k−1) is at a low level while SROUT(k−1) is active, the unit circuit 27 of Example 7 only needs to be configured such that the analog switch circuit SW1b is constituted by a P channel type transistor and the power supply is fixed at VSS.

Example 8

Figure 12:
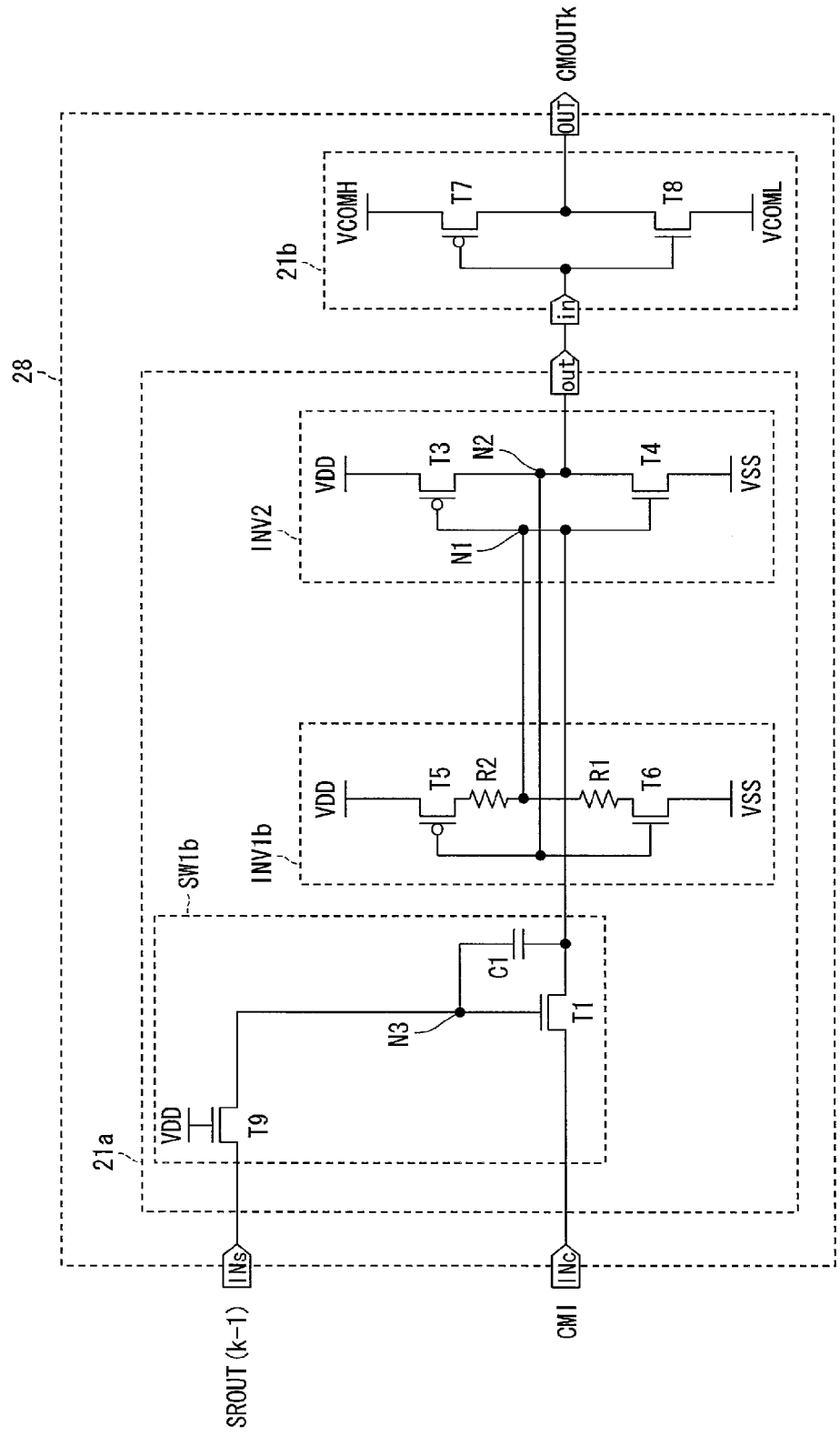
FIG. 12 is a circuit diagram of a unit circuit included in a common electrode driving circuit of Example 8.

FIG. 12 is a circuit diagram of a unit circuit 28 included in a common electrode driving circuit 200 of Example 8. As shown in FIG. 12, resistors R1 and R2 of an inverter INV1b in the unit circuit 28 are provided in different locations from those in the inverter INV1a in the unit circuit 27 (see FIG. 11) of Example 7.

Specifically, in the inverter INV1b, one terminal of the resistor R2 is connected to a drain terminal of a transistor T5 and the other terminal of the resistor R2 is connected to a node N1, whereas one terminal of the resistor R1 is connected to a drain terminal of a transistor T6 and the other terminal of the resistor R1 is connected to the node N1. The unit circuit 28 operates in the same manner as the unit circuit 27 of Example 7.

Example 9

Figure 13:
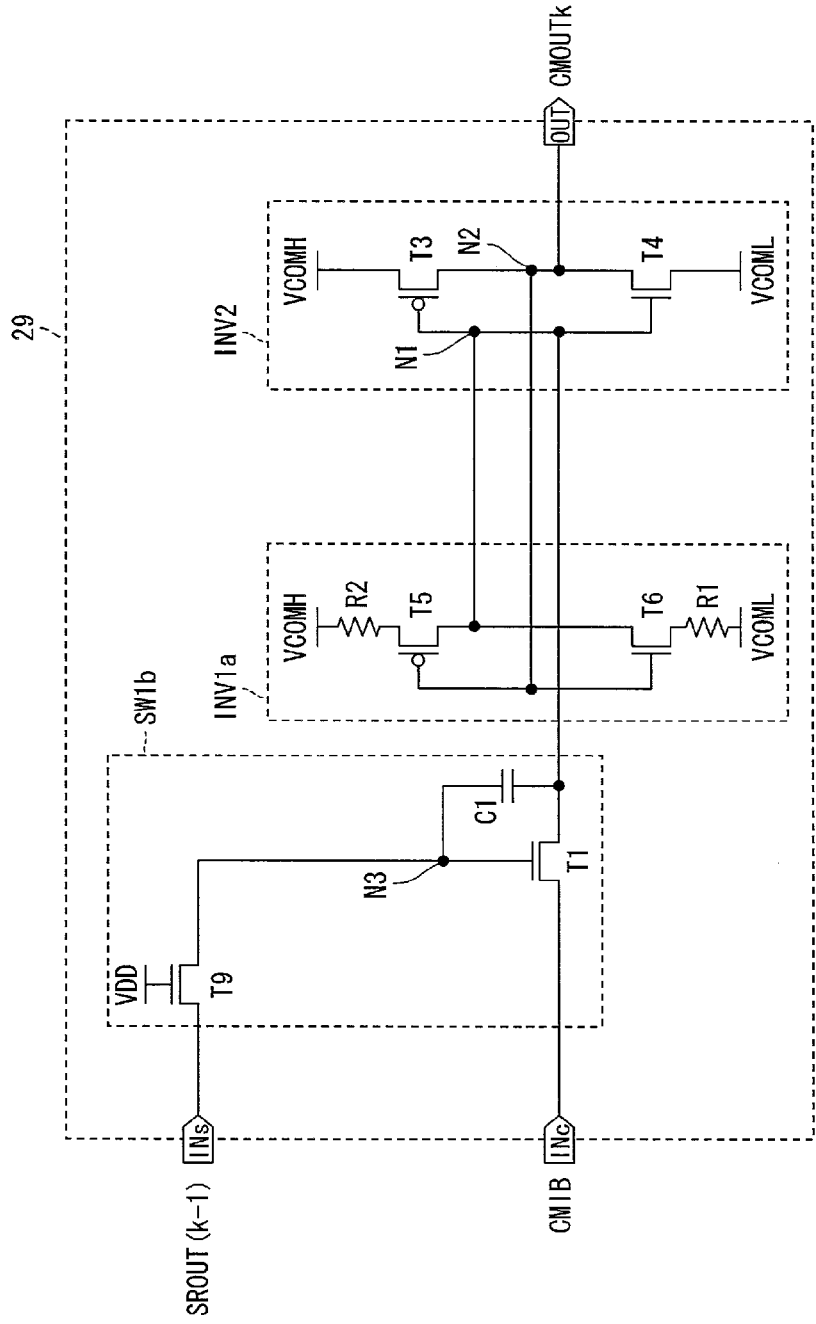
FIG. 13 is a circuit diagram of a unit circuit included in a common electrode driving circuit of Example 9.

FIG. 13 is a circuit diagram of a unit circuit 29 included in a common electrode driving circuit 200 of Example 9. As shown in FIG. 13, the unit circuit 29 corresponds to the unit circuit 27 (see FIG. 11) of Example 7 in which the buffer 21b is omitted and which is constituted only by the latch through circuit 21a. In the unit circuit 29, an input terminal INc is supplied with a polarity signal CMIB (inversion signal of CMI), and inverters INV1a and INV2 are supplied with a power supply voltage Vcomh or Vcoml. The inverter INV2 includes an output terminal (connection point (node N2) between a drain terminal of a transistor T3 and a drain terminal of a transistor T4) connected to an output terminal OUT of the unit circuit 29. In the unit circuit 29, the inverter INV2 functions as a buffer.

With this configuration, upon input of an output signal SROUT(k−1) (high level (active)) to an input terminal INs of a kth unit circuit 29, the analog switch circuit SW1b is switched on. In a case where a polarity signal CMIB is at a low level, a potential of a node N1 becomes a low level. In a case where the polarity signal CMIB is at a high level, the potential of the node N1 becomes a high level.

Even in a case where an output signal SROUT(k−1) of the shift register 10 is at a high level (active) and thus a low level of the polarity signal CMIB and a power supply VCOMH are short-circuited, a potential of the node N1 is made closer to that of the polarity signal CMIB since the resistor R2 is provided between the power supply VCOMH and the node N1. Thus, the potential of the node N1 decreases to a potential close to the low level of the polarity signal CMIB (potential lower than an inverted potential of the inverter INV2), and thereafter decreases to Vcoml due to feedback of an output (Vcomh) of the inverter INV2. Even in a case where a high level of the polarity signal CMIB and a power supply VCOML are short-circuited, a potential of the node N1 is made closer to that of the polarity signal CMIB since the resistor R1 is provided between the power supply VCOML and the node N1. Thus, the potential of the node N1 increases to a potential close to the high level of the polarity signal CMIB (potential higher than an inverted potential of the inverter INV2), and thereafter increases to Vcomh due to feedback of an output (Vcoml) of the inverter INV2. The output of the inverter INV2 is supplied to a kth common line CMLk via the output terminal OUT.

Subsequently, in a case where the output signal SROUT(k−1) of the shift register 10 is changed from the high level (active) to a low level (non-active), the analog switch circuit SW1b is switched off, and thus the polarity signal CMIB is shut off and is not inputted. Further, in a case where the node N1 retains Vcoml, the unit circuit 29 outputs Vcomh. In a case where the node N1 retains Vcomh, the unit circuit 29 outputs Vcoml.

In a case where (i) an output signal of the shift register 10 is an inversion signal of SROUT(k−1) or (ii) SROUT(k−1) is at a low level while SROUT(k−1) is active, the unit circuit 29 only needs to be configured such that the analog switch circuit SW1*b* is constituted by a P channel type transistor and the power supply is fixed at VSS.

Here, since the output terminal of the inverter INV2 is connected to the common line CMLk, writing display data from a source line involves a large noise generated from (i) an intersection between the common line CMLk and the source line and/or (ii) a plurality of pixels connected to the common line CMLk. If no resistors R1 and R2 are provided, the following case may occur: this noise is transmitted to an input terminal of the inverter INV1*a* (gate terminals of transistors T5 and T6), and thus the transistors T5 and T6 in the inverter INV1*a* are switched on for a moment, with the result that a through current occurs. In some cases, this noise may invert a potential level of retained data, thereby causing a malfunction. However, since the configuration of FIG. 13 includes the resistors R1 and R2, it is possible to reduce the through current caused by the noise, thereby preventing the malfunction.

Example 10

Figure 14:
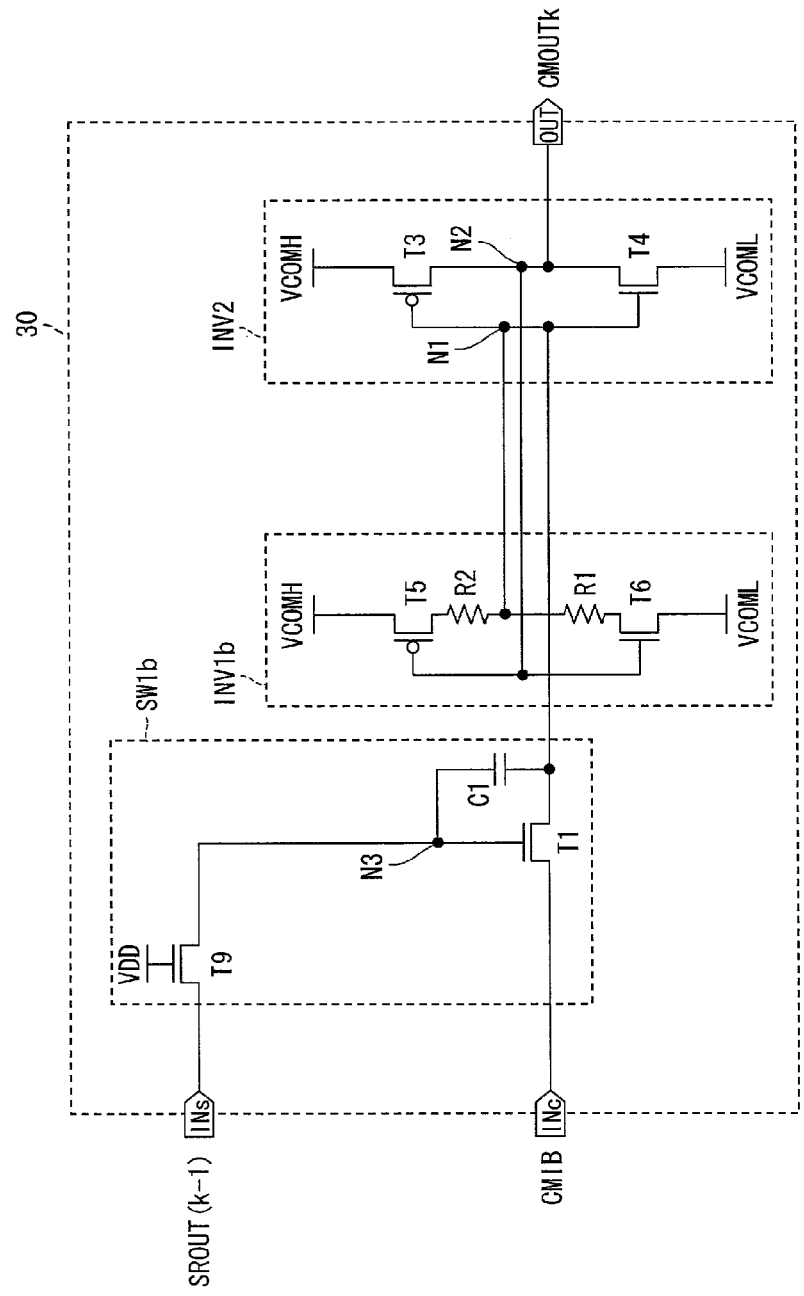
FIG. 14 is a circuit diagram of a unit circuit included in a common electrode driving circuit of Example 10.

FIG. 14 is a circuit diagram of a unit circuit 30 included in a common electrode driving circuit 200 of Example 10. As shown in FIG. 14, resistors R1 and R2 of an inverter INV1*b* in the unit circuit 30 are provided in different locations from those in the inverter INV1*a* in the unit circuit 29 (see FIG. 13) of Example 9.

Specifically, in the inverter INV1*b*, one terminal of the resistor R2 is connected to a drain terminal of a transistor T5 and the other terminal of the resistor R2 is connected to a node N1, whereas one terminal of the resistor R1 is connected to a drain terminal of a transistor T6 and the other terminal of the resistor R1 is connected to the node N1. The unit circuit 30 operates in the same manner as the unit circuit 29 of Example 9.

Example 11

Figure 15:
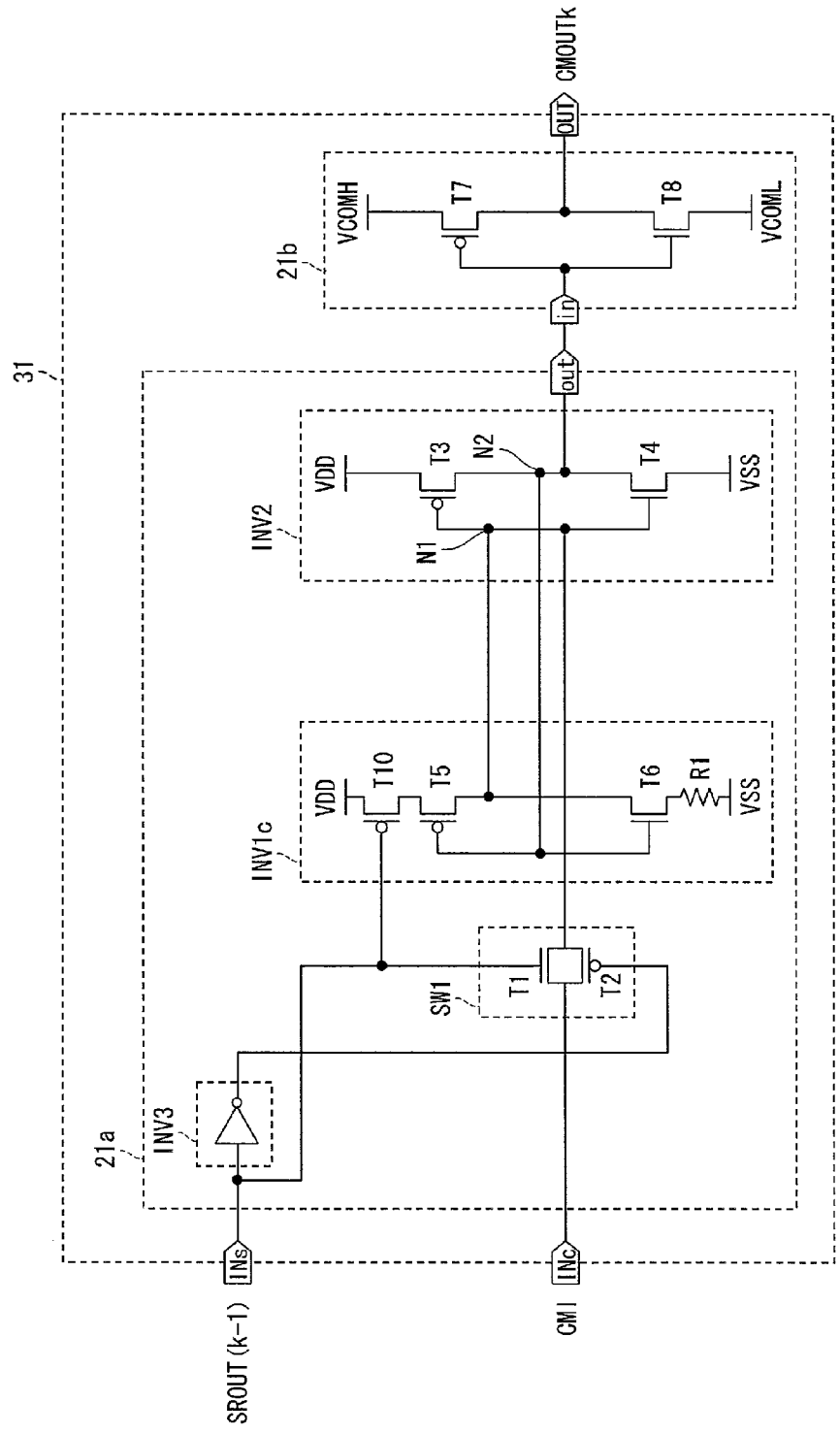
FIG. 15 is a circuit diagram of a unit circuit included in a common electrode driving circuit of Example 11.

FIG. 15 is a circuit diagram of a unit circuit 31 included in a common electrode driving circuit 200 of Example 11. As shown in FIG. 15, the unit circuit 31 includes an inverter INV1*c* corresponding to the inverter INV1 in the unit circuit 21 (see FIG. 3) of Example 1 additionally including a resistor R1 and a P channel type transistor T10. Note that, in the unit circuit 31, transistors T5, T6, and T10 configuring the inverter INV1*c* are set to have channel lengths L identical to those of transistors T3 and T4 configuring an inverter INV2.

In the inverter INV1*c*, the transistor T10 is connected to an input terminal INs at its gate terminal and is connected to a power supply VDD at its source terminal; the transistor T5 is connected to a node N2 at its gate terminal, is connected to a drain terminal of the transistor T10 at its source terminal, and is connected to a node N1 at its drain terminal; one terminal of the resistor R1 is connected to a power supply VSS; the transistor T6 is connected to the node N2 at its gate terminal, and is connected to the other terminal of the resistor R1 at its source terminal, and is connected to the node N1 at its drain terminal. Note that the resistor R1 has a resistance from several kΩ to several MΩ.

With this configuration, upon input of an output signal SROUT(k−1) (high level (active)) to the input terminal INs of a kth unit circuit 31, an analog switch circuit SW1 is switched on and the transistor T10 is switched off.

Upon input of Vss (low level) of a polarity signal CMI in this state, a potential of the node N1 maintained at Vdd decreases to Vss. During this, the polarity signal CMI (Vss) and the power supply VDD are not short-circuited, since the node N1 is disconnected from the power supply VDD due to switching-off of the transistor T10.

On the contrary, upon input of Vdd (high level) of the polarity signal CMI, the polarity signal CMI (Vdd) and the power supply VSS are short-circuited. However, since the resistor R1 is provided between the power supply VSS and the node N1, a potential of the node N1 is made closer to that of the polarity signal CMI. Thus, the potential of the node N1 increases to a potential close to Vdd of the polarity signal CMI (potential higher than an inverted potential of the inverter INV2), and thereafter increases to Vdd due to feedback of an output (Vss) of the inverter INV2.

Example 12

Figure 16:
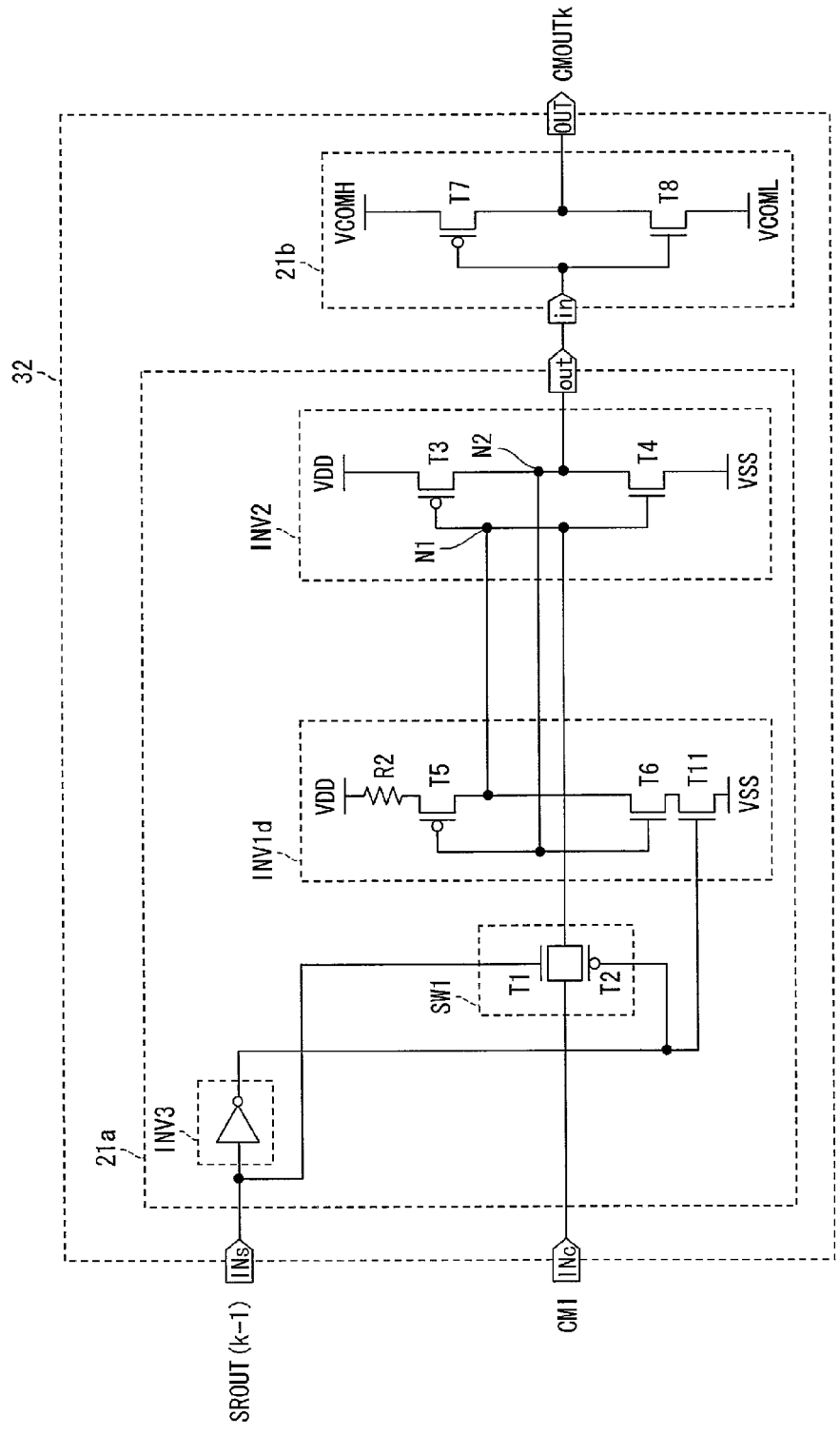
FIG. 16 is a circuit diagram of a unit circuit included in a common electrode driving circuit of Example 12.

FIG. 16 is a circuit diagram of a unit circuit 32 included in a common electrode driving circuit 200 of Example 12. As shown in FIG. 16, the unit circuit 32 includes an inverter INV1*d* corresponding to the inverter INV1 in the unit circuit 21 (see FIG. 3) of Example 1 additionally including a resistor R2 and an N channel type transistor T11. Note that, in the unit circuit 32, transistors T5, T6, and T11 configuring the inverter INV1*d* are set to have channel lengths L identical to those of transistors T3 and T4 configuring an inverter INV2.

In the inverter INV1*d*, one terminal of the resistor R2 is connected to a power supply VDD; the transistor T5 is connected to a node N2 at its gate terminal, is connected to the other terminal of the resistor R2 at its source terminal, and is connected to a node N1 at its drain terminal; the transistor T11 is connected to an output terminal of an inverter INV3 at its gate terminal and is connected to a power supply VSS at its source terminal; the transistor T6 is connected to the node N2 at its gate terminal, is connected to a drain terminal of the transistor T11 at its source terminal, and is connected to the node N1 at its drain terminal. Note that the resistor R1 has a resistance ranging from several kΩ to several MΩ.

With this configuration, upon input of an output signal SROUT(k−1) (high level (active)) to an input terminal INs of a kth unit circuit 32, an analog switch circuit SW1 is switched on and the transistor T11 is switched off.

Upon input of Vss (low level) of a polarity signal CMI in this state, the polarity signal CMI (Vss) and the power supply VDD are short-circuited. However, since the resistor R2 is provided between the power supply VDD and the node N1, a potential of the node N1 is made closer to that of the polarity signal CMI. Thus, the potential of the node N1 decreases to a potential close to Vss of the polarity signal CMI (potential lower than an inverted potential of the inverter INV2), and thereafter decreases to Vss due to feedback of an output (Vdd) of the inverter INV2.

On the contrary, upon input of Vdd (high level) of the polarity signal CMI, a potential of the node N1 maintained at Vss increases to Vdd. During this, the polarity signal CMI (Vdd) and the power supply VSS are not short-circuited, since the node N1 is disconnected from the power supply VSS due to switching-off of the transistor T11.

Example 13

Figure 17:
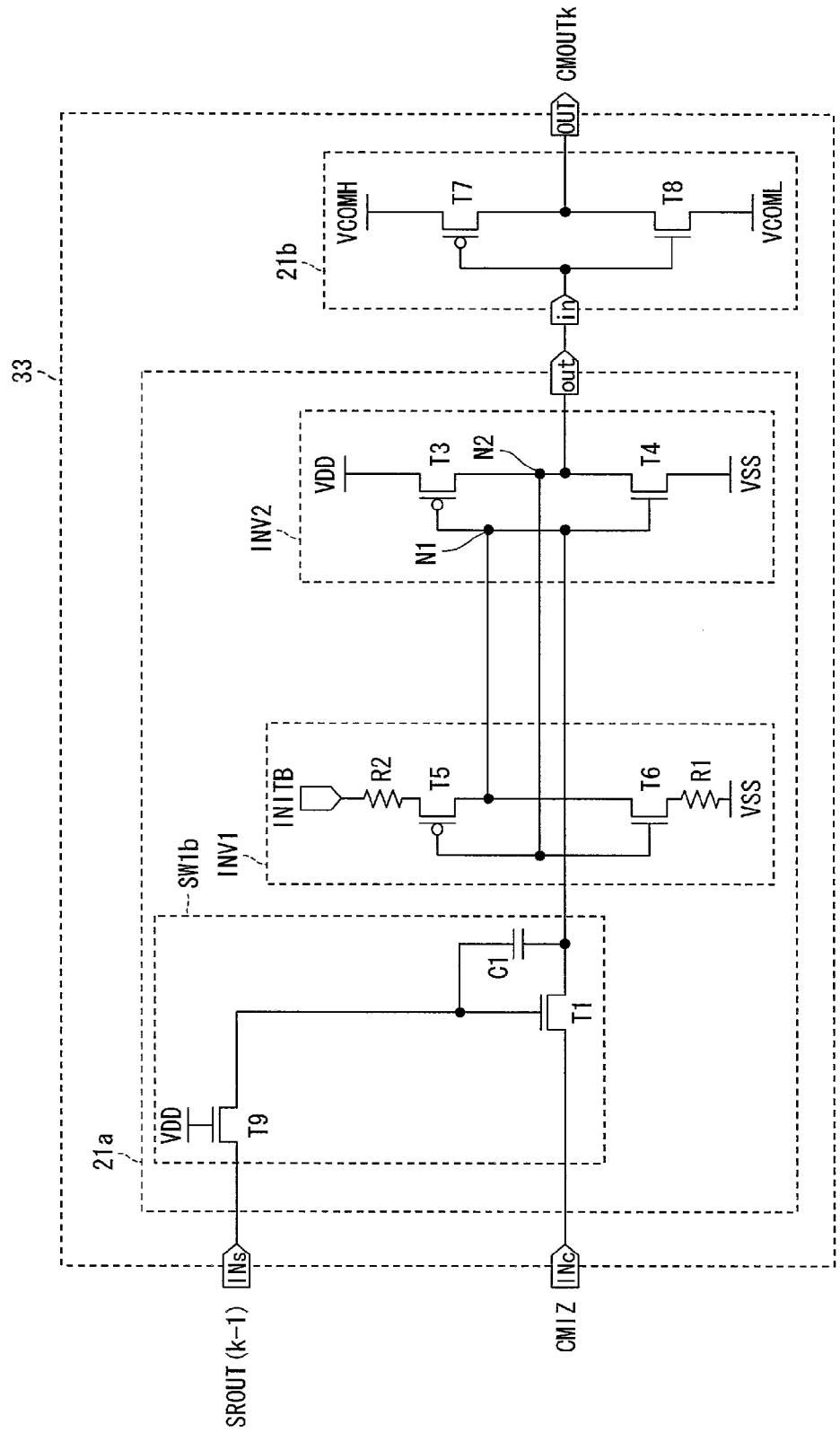
FIG. 17 is a circuit diagram of a unit circuit included in a common electrode driving circuit of Example 13.

FIG. 17 is a circuit diagram of a unit circuit 33 included in a common electrode driving circuit 200 of Example 13.

The unit circuit 33 corresponds to the unit circuit 27 of Example 7 additionally having a function for initializing the common electrode driving circuit 200. Specifically, the unit circuit 33 corresponds to the unit circuit 27 (see FIG. 11) of Example 7 in which the power supply VDD in the inverter INV1 is omitted and an initialization terminal (INITB terminal) is provided. An initialization signal INITB is inputted to a source terminal of a transistor T5 via a resistor R2.

Figure 18:
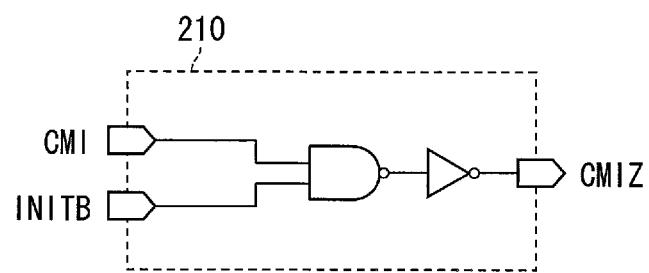
FIG. 18 is a circuit diagram of a generation circuit for generating a polarity signal CMIZ to be supplied to the common electrode driving circuit of Example 13.

The initialization signal INITB is a signal that is at a high level (Vdd) during a regular operation, and that is at a low level (Vss) during initialization (active). A polarity signal CMIZ is a signal that has a polarity inverted for each horizontal scanning period (1H) as well as the polarity signal CMI of the unit circuit 27 during a regular operation, and that is at a low level during initialization. The polarity signal CMIZ is inputted to the unit circuit 33 at each stage. The polarity signal CMIZ is generated by a generation circuit 210 constituted by a NAND circuit and an inverter as shown in FIG. 18, and is supplied from the outside of the common electrode driving circuit 200.

(Operation)

Figure 38:
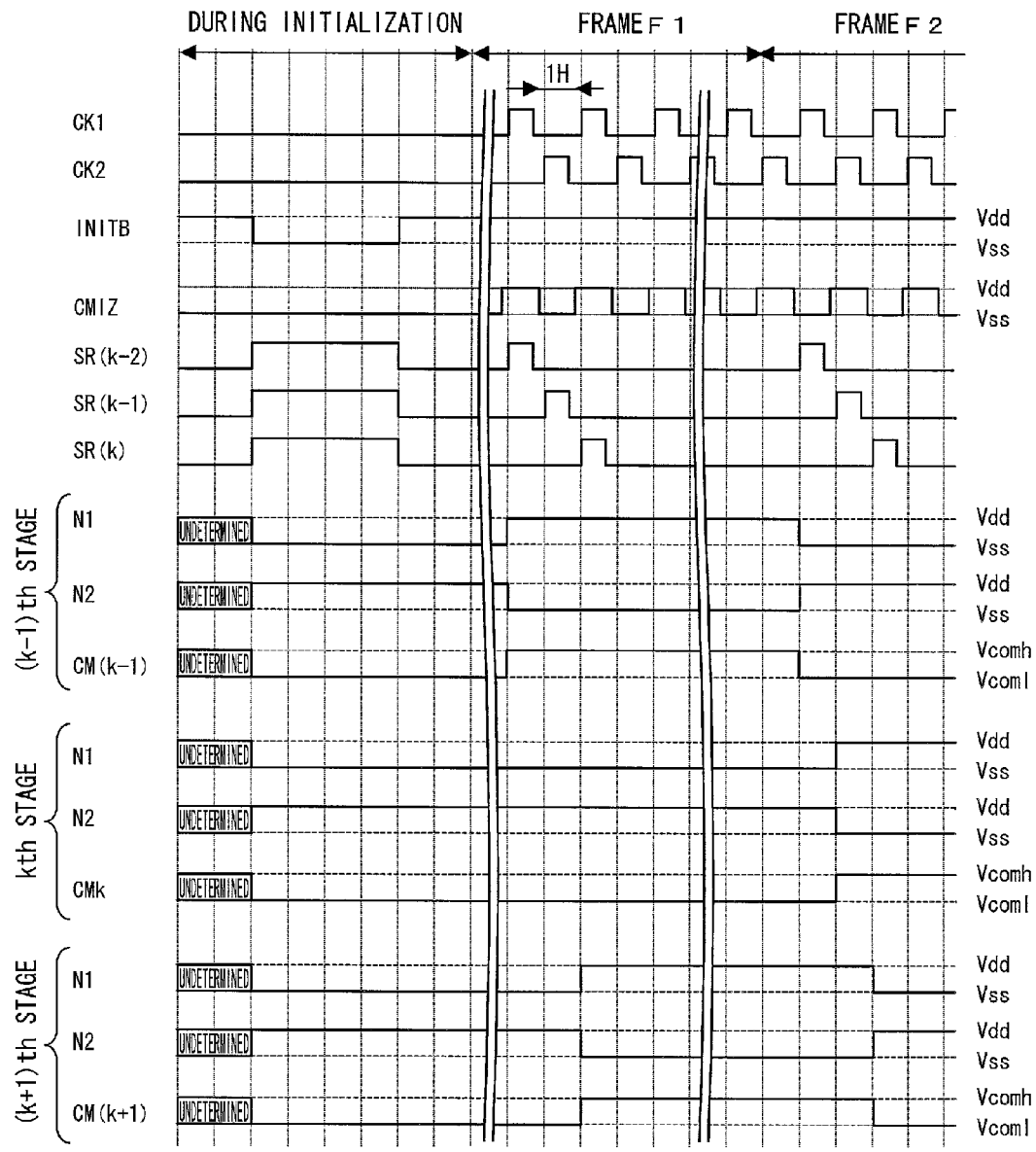
FIG. 38 is a timing chart at the time of an operation of the common electrode driving circuit of FIG. 17.

In a case where output signals SROUT of the unit circuits 11 at all the stages in the shift register 10 are at a high level during initialization, an operation is carried out as follows (see FIG. 38).

First, in a case where the output signals SROUT become a high level, the transistors T1 are switched on in the unit circuits 33 at all the stages, and the nodes N1 at all the stages are supplied (short-circuited) to the polarity signal CMIZ. During an undetermined state immediately before initialization, potentials retained at the nodes N1 are also undetermined. Therefore, whether an output of the inverter INV2, supplied to the polarity signal CMIZ, at each stage is Vdd (high level) or Vss (low level) is not determined, either.

Here, assuming that the initialization signal INITB connected to the nodes N1 is Vdd, the polarity signal CMIZ is supplied simultaneously to (i) the nodes N1 which are connected to the power supplies VDD of the inverters INV1 and (ii) the nodes N1 which are connected to the power supplies VSS. This causes the power supplies VDD and the power supplies VSS to be short-circuited via the polarity signal CMIZ, thereby generating a large current. As a result, the potentials of the nodes N1 become a midpoint potential. Thus, it is impossible to carry out initialization normally.

However, according to the configuration of the unit circuit 33 of Example 13, both of the polarity signal CMIZ and the initialization signal INITB are regulated to be Vss (low level) during initialization. Therefore, the potentials of the nodes N1 necessarily become Vss (low level). Thus, it is possible to carry out initialization without a fail.

Figure 39:
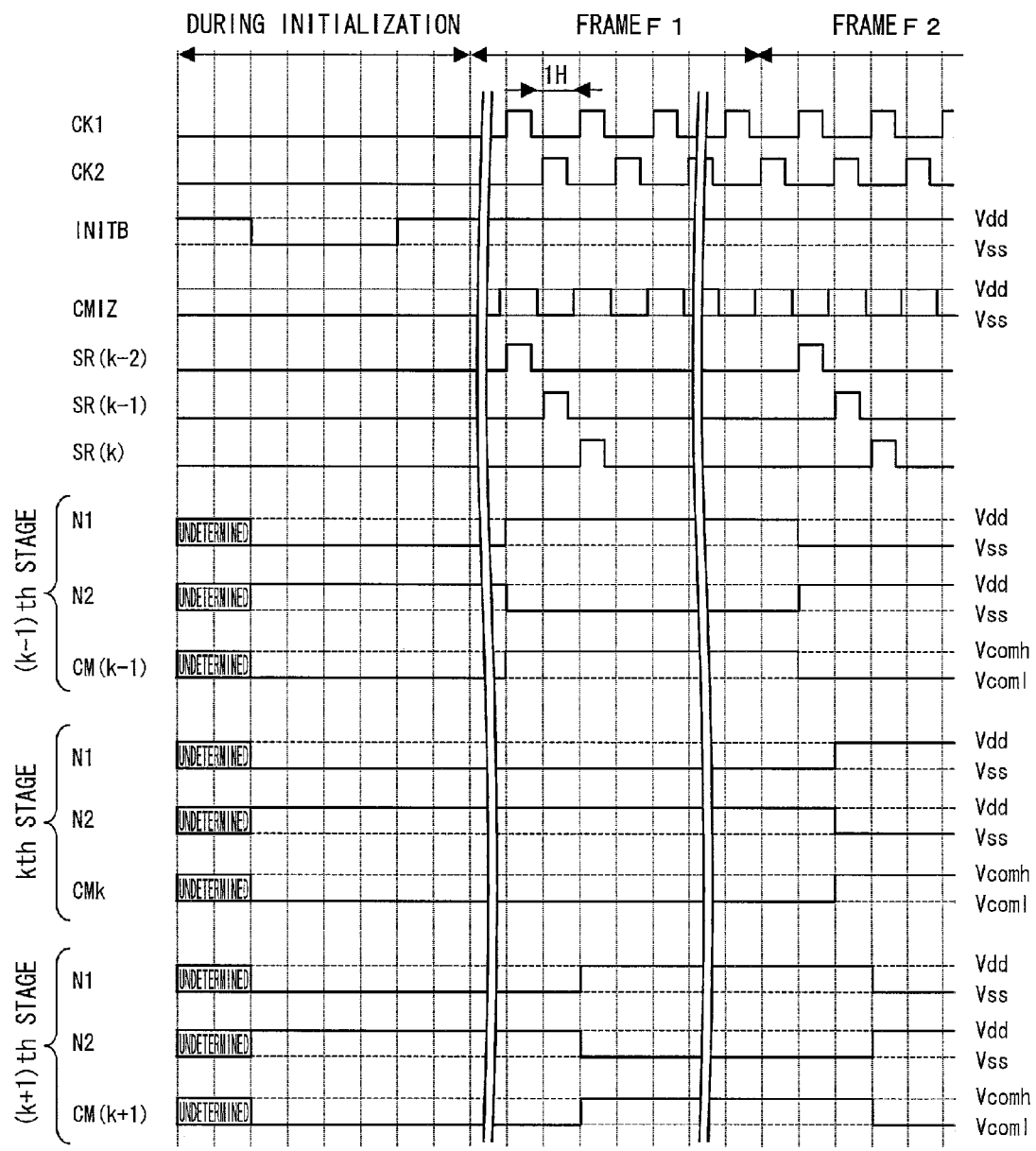
FIG. 39 is a timing chart at the time of an operation of the common electrode driving circuit of FIG. 17.

On the contrary, in a case where output signals SROUT of the unit circuits 11 at all the stages in the shift register 10 are at a low level during initialization, an operation is carried out as follows (see FIG. 39).

In a case where potentials of the nodes N1 are Vdd (high level) during an undetermined state before initialization, the gate terminals of the transistors T5 are Vss (low level) and the transistors T5 are in an ON state. Here, since the initialization signal INITB is Vss (low level) during initialization, the potentials of the nodes N1 become a low level (Vss+Vth) via the transistors T5, which means that the potentials of the nodes N1 drop to below a threshold value (Vth). Outputs of the inverter INV1 are supplied to the inverters INV2, so that the inverters INV2 output Vdd. Since the output (nodes N2) of the inverters INV2 are connected to the input of the inverters INV1, outputs (Vdd) of the inverters INV2 are fed back to the inverters INV1, so that the transistors T6 are switched on. As a result, the nodes N1 at Vss+Vth become Vss (low level). Thus, it is possible to carry out initialization without a fail.

In a case where potentials of the nodes N1 are Vss (low level) during an undetermined state before initialization, the initialization signal INITB is not supplied to the nodes N1 since the transistors T5 are in an OFF state. However, in this case, the nodes N1 are already at a desired potential (Vss). Thus, this state corresponds to an initialized state.

During a general operation, the initialization signal INITB is Vdd (high level) and thus the initialization signal INITB carries out the same function as the power supply VDD. Therefore, it is possible to carry out the same operation as the unit circuit 27 of Example 7.

Thus, with the unit circuit 33, it is possible to achieve not only the effect given by the unit circuit 27 of Example 7 but also an effect of initializing the common electrode driving circuit 200 in a stable manner.

The above description has been made for the configuration corresponding to the unit circuit 27 of Example 7 to which the function for initialization is added. However, the function for initialization is applicable to any of the Examples described above.

Example 14

Figure 19:
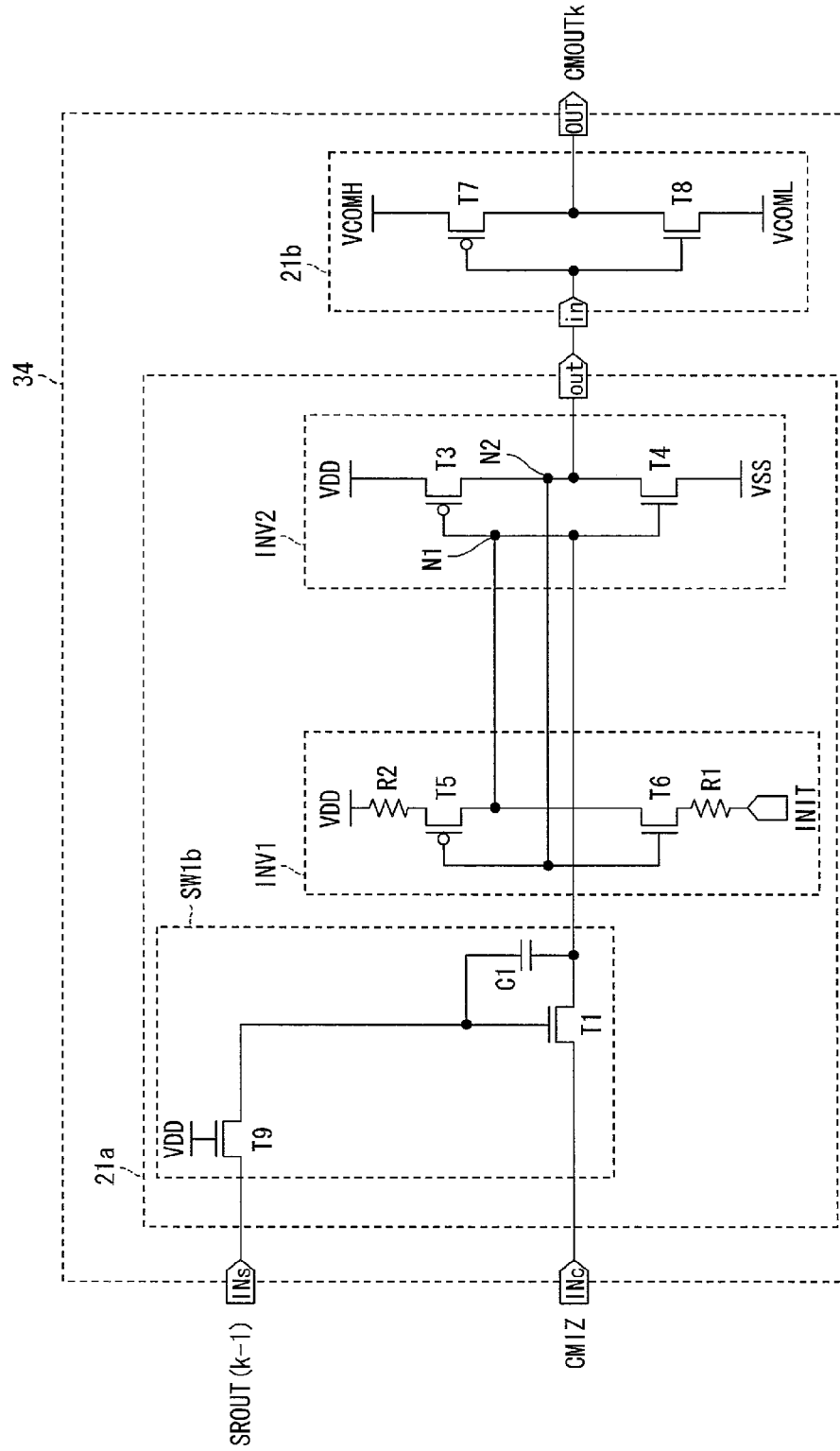
FIG. 19 is a circuit diagram of a unit circuit included in a common electrode driving circuit of Example 14.

FIG. 19 is a circuit diagram of a unit circuit 34 included in a common electrode driving circuit 200 of Example 14.

As well as the unit circuit 33 of Example 13, the unit circuit 34 has a function for initializing the common electrode driving circuit 200. Specifically, the unit circuit 34 corresponds to the unit circuit 27 (see FIG. 11) of Example 7 in which the power supply VSS of the inverter INV1 is omitted and an initialization terminal (INIT terminal) is provided. An initialization signal INIT is inputted to a source terminal of a transistor T6 via a resistor R1.

Figure 20:
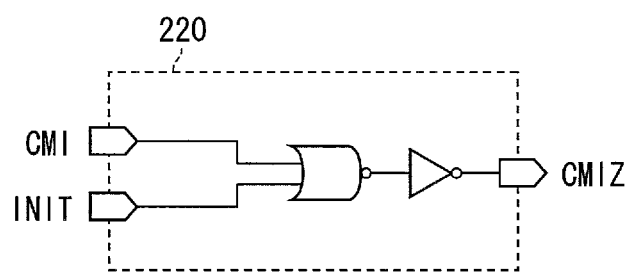
FIG. 20 is a circuit diagram of a generation circuit for generating a polarity signal CMIZ to be supplied to the common electrode driving circuit of Example 14.

The initialization signal INIT is a signal that is at a low level (Vss) during a regular operation, and that is at a high level (Vdd) during initialization (active). A polarity signal CMIZ is a signal that has a polarity inverted for each horizontal scanning period (1H) as well as the polarity signal CMI of the unit circuit 27 during a regular operation, and that is at a high level during initialization. The polarity signal CMIZ is inputted to the unit circuit 34 at each stage. The polarity signal CMIZ is generated by a generation circuit 220 constituted by a NOR circuit and an inverter as shown in FIG. 20, and is supplied from the outside of the common electrode driving circuit 200.

(Operation)

In a case where output signals SROUT of the unit circuits 11 at all the stages in the shift register 10 are at a high level during initialization, an operation is carried out as follows.

During an undetermined state immediately before initialization, both of (i) potentials of the nodes N1 and (ii) outputs of the inverters INV2 are undetermined. However, both of the polarity signal CMIZ and the initialization signal INIT are regulated to be Vdd (high level) during initialization. Therefore, the potentials of the nodes N1 necessarily become Vdd (high level). Thus, it is possible to carry out initialization without a fail.

On the contrary, in a case where output signals SROUT of the unit circuits 11 at all the stages in the shift register 10 are at a low level during initialization, an operation is carried out as follows.

In a case where potentials of the nodes N1 are Vss (low level) during an undetermined state before initialization, the gate terminals of the transistors T6 are Vdd (high level) and the transistors T6 are in an ON state. Here, since the initialization signal INIT is Vdd (high level) during initialization, the potentials of the nodes N1 become a high level (Vdd−Vth)

via the transistors T6, which means that the potentials of the nodes N1 drop to below a threshold value (Vth). Outputs of the inverters INV1 are supplied to the inverters INV2, so that the inverters INV2 output Vss. Since the outputs (nodes N2) of the inverters INV2 are connected to the inputs of the inverters INV1, outputs (Vss) of the inverters INV2 are fed back to the inverters INV1, so that the transistors T5 are switched on. As a result, the nodes N1 at Vdd−Vth become Vdd (high level). Thus, it is possible to carry out initialization without a fail.

In a case where potentials of the nodes N1 are Vdd (high level) during an undetermined state before initialization, the initialization signal INITB is not supplied to the nodes N1 since the transistors T6 are in an OFF state. However, in this case, the nodes N1 are already at a desired potential (Vdd). Thus, this state corresponds to an initialized state.

During a general operation, the initialization signal INIT is Vss (low level) and thus the initialization signal INIT carries out the same function as that of the power supply VSS. Therefore, it is possible to carry out the same operation as the unit circuit 27 of Example 7.

Thus, with the unit circuit 34, it is possible to achieve not only the effect given by the unit circuit 27 of Example 7 but also an effect of initializing the common electrode driving circuit 200 in a stable manner.

Example 15

Figure 21:
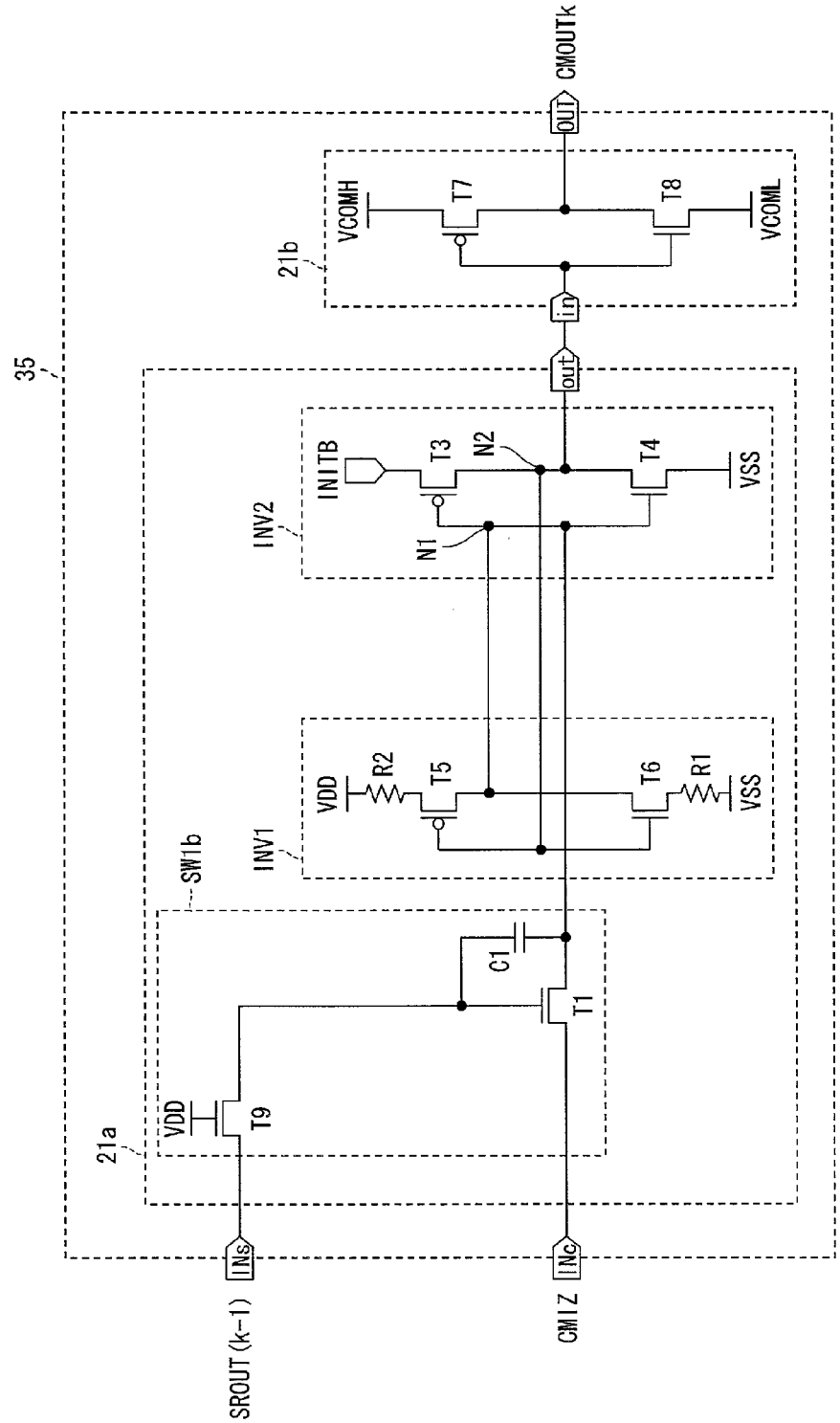
FIG. 21 is a circuit diagram of a unit circuit included in a common electrode driving circuit of Example 15.

FIG. 21 is a circuit diagram of a unit circuit 35 included in a common electrode driving circuit 200 of Example 15.

The unit circuit 35 corresponds to the unit circuit 27 of Example 7 additionally having a function for initializing the common electrode driving circuit 200. Specifically, the unit circuit 35 corresponds to the unit circuit 27 (see FIG. 11) of Example 7 in which the power supply VDD of the inverter INV2 is omitted and an initialization terminal (INITB terminal) is provided. An initialization signal INITB is inputted to a source terminal of a transistor T3.

Figure 22:
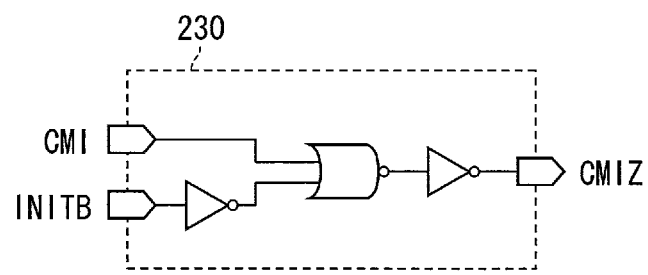
FIG. 22 is a circuit diagram of a generation circuit for generating a polarity signal CMIZ to be supplied to the common electrode driving circuit of Example 15.

The initialization signal INITB is a signal that is at a high level (Vdd) during a regular operation, and that is at a low level (Vss) during initialization (active). A polarity signal CMIZ is a signal that has a polarity inverted for each horizontal scanning period (1H) as well as the polarity signal CMI of the unit circuit 27 during a regular operation, and that is at a high level during initialization. The polarity signal CMIZ is inputted to the unit circuit 35 at each stage. The polarity signal CMIZ is generated by a generation circuit 230 constituted by a NOR circuit and an inverter as shown in FIG. 22, and is supplied from the outside of the common electrode driving circuit 200.

(Operation)

In a case where output signals SROUT of the unit circuits 11 at all the stages in the shift register 10 are at a high level during initialization, an operation is carried out as follows.

During an undetermined state immediately before initialization, both of (i) potentials of the nodes N1 and (ii) outputs (nodes N2) of the inverters INV2 are undetermined. However, during initialization, the polarity signal CMIZ is regulated to be Vdd (high level) and the initialization signal INITB is regulated to be Vss (low level). Therefore, potentials of the nodes N2 become Vss (low level), and outputs (Vss) of the inverters INV2 are fed back to the inverters INV1, so that the transistors T5 are switched on. As a result, the nodes N1 become Vdd. Thus, it is possible to carry out initialization without a fail.

On the contrary, in a case where output signals SROUT of the unit circuits 11 at all the stages in the shift register 10 are at a low level during initialization, an operation is carried out as follows.

In a case where potentials of the nodes N2 are Vdd (high level) during an undetermined state before initialization, the gate terminals of the transistors T3 are Vss (low level) and the transistors T3 are in an ON state. Here, since the initialization signal INITB is Vss (low level) during initialization, the potentials of the nodes N2 become a low level (Vss+Vth) via the transistors T3, which means that the potentials of the nodes N2 drop to below a threshold value (Vth). Since the outputs (nodes N2) of the inverters INV2 are connected to the inputs of the inverters INV1, outputs (Vss+Vth) of the inverters INV2 are fed back to the inverters INV1, so that the transistors T5 are switched on. As a result, the nodes N1 become Vdd (high level), the transistors T4 are switched on, and the nodes N2 at Vss+Vth become Vss (low level). Thus, it is possible to carry out initialization without a fail.

In a case where potentials of the nodes N2 are Vss (low level) during an undetermined state before initialization, the initialization signal INITB is not supplied to the nodes N2 since the transistors T3 are in an OFF state. However, in this case, the nodes N2 are already at a desired potential (Vss). Thus, this state corresponds to an initialized state.

During a general operation, the initialization signal INITB is Vdd (high level) and thus the initialization signal INITB carries out the same function as that of the power supply VDD. Therefore, it is possible to carry out the same operation as the unit circuit 27 of Example 7.

Thus, with the unit circuit 35, it is possible to achieve not only the effect given by the unit circuit 27 of Example 7 but also an effect of initializing the common electrode driving circuit 200 in a stable manner.

Example 16

Figure 23:
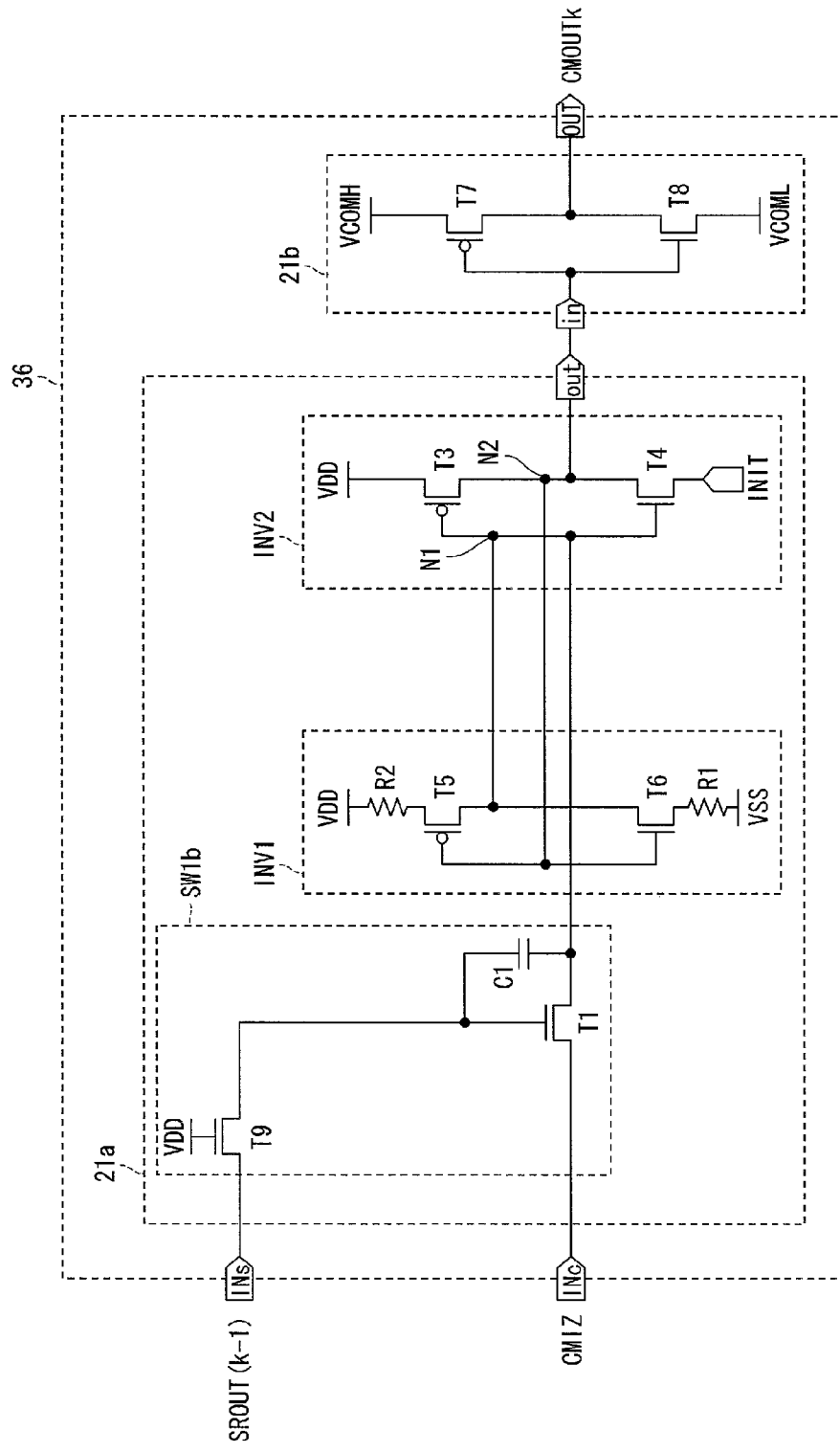
FIG. 23 is a circuit diagram of a unit circuit included in a common electrode driving circuit of Example 16.

FIG. 23 is a circuit diagram of a unit circuit 36 included in a common electrode driving circuit 200 of Example 16.

The unit circuit 36 corresponds to the unit circuit 27 of Example 7 additionally having a function for initializing the common electrode driving circuit 200. Specifically, the unit circuit 36 corresponds to the unit circuit 27 (see FIG. 11) of Example 7 in which the power supply VSS of the inverter INV2 is omitted and an initialization terminal (INIT terminal) is provided. An initialization signal INIT is inputted to a source terminal of a transistor T4.

Figure 24:
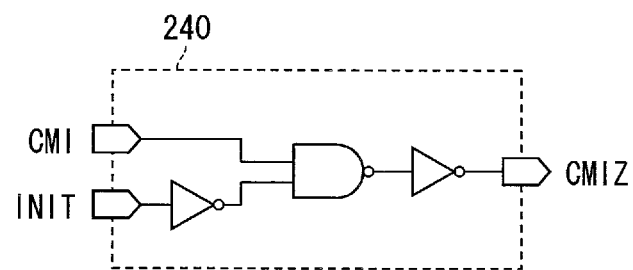
FIG. 24 is a circuit diagram of a generation circuit for generating a polarity signal CMIZ to be supplied to the common electrode driving circuit of Example 16.

The initialization signal INIT is a signal that is at a low level (Vss) during a regular operation, and that is at a high level (Vdd) during initialization (active). A polarity signal CMIZ is a signal that has a polarity inverted for each horizontal scanning period (1H) as well as the polarity signal CMI of the unit circuit 27 during a regular operation, and that is at a low level during initialization. The polarity signal CMIZ is inputted to the unit circuit 36 at each stage. The polarity signal CMIZ is generated by a generation circuit 240 constituted by a NOR circuit and an inverter as shown in FIG. 24, and is supplied from the outside of the common electrode driving circuit 200.

(Operation)

In a case where output signals SROUT of the unit circuits 11 at all the stages in the shift register 10 are at a high level during initialization, an operation is carried out as follows.

During an undetermined state immediately before initialization, both of (i) potentials of the nodes N1 and (ii) outputs (nodes N2) of the inverters INV2 are undetermined. However, during initialization, the polarity signal CMIZ is regulated to be Vss (low level) and the initialization signal INIT is regulated to be Vdd (high level). Therefore, the potentials of the nodes N2 become Vdd (high level). Thus, outputs (Vdd) of the inverters INV2 are fed back to the inverters INV1, so that the transistors T6 are switched on. As a result, the nodes N1 become Vss. Thus, it is possible to carry out initialization without a fail.

On the contrary, in a case where output signals SROUT of the unit circuits 11 at all the stages in the shift register 10 are at a low level during initialization, an operation is carried out as follows.

In a case where potentials of the nodes N2 are Vss (low level) during an undetermined state before initialization, the gate terminals of the transistors T4 are Vdd (high level) and the transistors T4 are in an ON state. Here, since the initialization signal INIT is Vdd (high level) during initialization, the potentials of the nodes N2 become a high level (Vdd−Vth) via the transistors T4, which means that the potentials of the nodes N2 drop to below a threshold value (Vth). Since the outputs (nodes N2) of the inverters INV2 are connected to the inputs of the inverters INV1, outputs (Vdd−Vth) of the inverters INV2 are fed back to the inverters INV1, so that the transistors T6 are switched on. As a result, the nodes N1 become Vss (low level), the transistors T3 are switched on, and the nodes N2 at Vdd−Vth become Vdd (high level). Thus, it is possible to carry out initialization without a fail.

In a case where potentials of the nodes N2 are Vdd (high level) during an undetermined state before initialization, the initialization signal INIT is not supplied to the nodes N2 since the transistors T4 are in an OFF state. However, in this case, the nodes N2 are already at a desired potential (Vdd). Thus, this state corresponds to an initialized state.

During a general operation, the initialization signal INIT is Vss (low level) and thus the initialization signal INIT carries out the same function as that of the power supply VSS. Therefore, it is possible to carry out the same operation as the unit circuit 27 of Example 7.

Thus, with the unit circuit 36, it is possible to achieve not only the effect given by the unit circuit 27 of Example 7 but also an effect of initializing the common electrode driving circuit 200 in a stable manner.

Example 17

Figure 25:
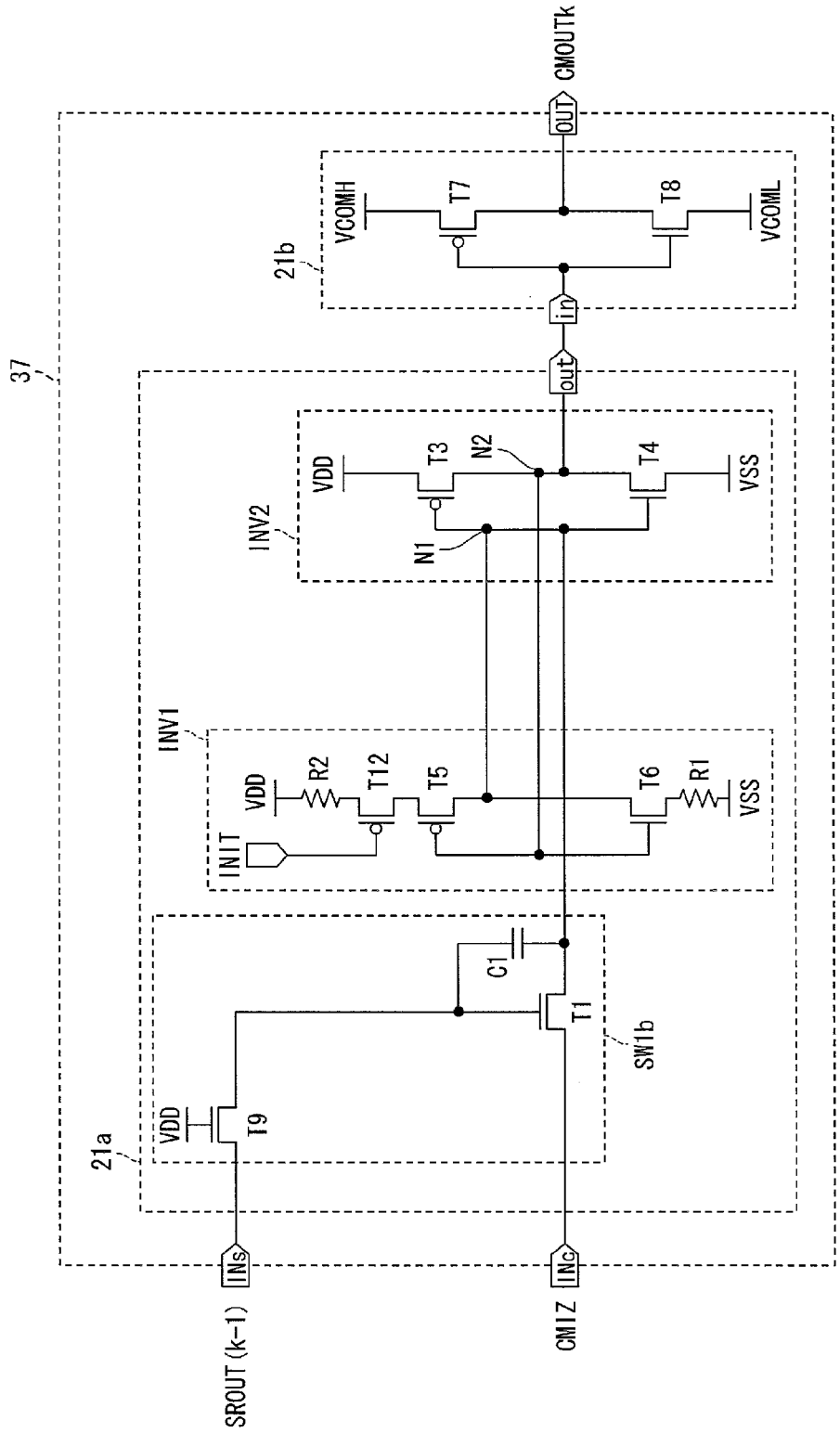
FIG. 25 is a circuit diagram of a unit circuit included in a common electrode driving circuit of Example 17.

FIG. 25 is a circuit diagram of a unit circuit 37 included in a common electrode driving circuit 200 of Example 17.

The unit circuit 37 corresponds to the unit circuit 27 of Example 7 additionally having a function for initializing the common electrode driving circuit 200. Specifically, the unit circuit 37 corresponds to the unit circuit 27 (see FIG. 11) of Example 7 in which a P channel type transistor T12 is added and an initialization terminal (INIT terminal) is provided in the inverter INV1. The transistor T12 has a gate terminal supplied with an initialization signal INIT, a source terminal connected to one terminal of a resistor R2, and a drain terminal connected to a source terminal of a transistor T5.

The initialization signal INIT is a signal that is at a low level (Vss) during a regular operation, and that is at a high level (Vdd) during initialization (active). A polarity signal CMIZ is a signal that has a polarity inverted for each horizontal scanning period (1H) as well as the polarity signal CMI of the unit circuit 27 during a regular operation, and that is at a low level during initialization. The polarity signal CMIZ is inputted to the unit circuit 37 at each stage. The polarity signal CMIZ is generated by the generation circuit 240 shown in FIG. 24, and is supplied from the outside of the common electrode driving circuit 200.

With this configuration, during initialization, the initialization signal INIT is at a high level, and therefore the transistors T12 are switched off, so that the nodes N1 are disconnected from the power supplies VDD. As a result, the nodes N1 are fixed at a low level (Vss) of the polarity signal CMIZ. Thus, it is possible to carry out initialization without a fail.

During a regular operation, the initialization signal INIT is at a low level, and therefore the power supplies VDD are connected to the transistors T5 via the resistors R2 and the transistors T12 which are switched on. Therefore, it is possible to carry out the same operation as the unit circuit 27 of Example 7.

Thus, with the unit circuit 37, it is possible to achieve not only the effect given by the unit circuit 27 of Example 7 but also an effect of initializing the common electrode driving circuit 200 in a stable manner.

Example 18

Figure 26:
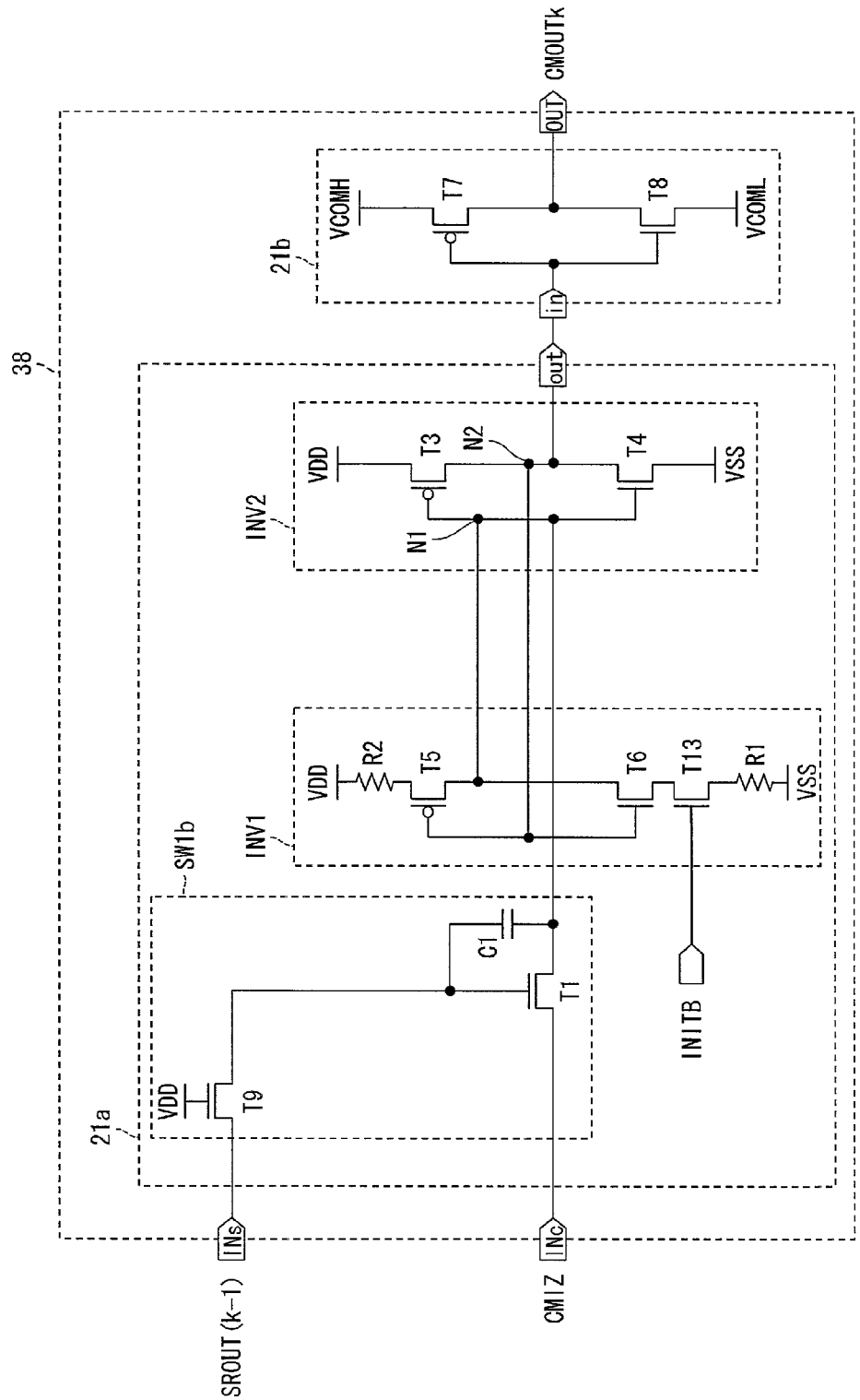
FIG. 26 is a circuit diagram of a unit circuit included in a common electrode driving circuit of Example 18.

FIG. 26 is a circuit diagram of a unit circuit 38 included in a common electrode driving circuit 200 of Example 18.

The unit circuit 38 corresponds to the unit circuit 27 of Example 7 additionally having a function for initializing the common electrode driving circuit 200. Specifically, the unit circuit 38 corresponds to the unit circuit 27 (see FIG. 11) of Example 7 in which an N channel type transistor T13 is added and an initialization terminal (INITB terminal) is provided in the inverter INV1. The transistor T13 has a gate terminal supplied with an initialization signal INITB, a source terminal connected to one terminal of a resistor R1, and a drain terminal connected to a source terminal of a transistor T6.

The initialization signal INITB is a signal that is at a high level (Vdd) during a regular operation, and that is at a low level (Vss) during initialization (active). A polarity signal CMIZ is a signal that has a polarity inverted for each horizontal scanning period (1H) as well as the polarity signal CMI of the unit circuit 27 during a regular operation, and that is at a high level during initialization. The polarity signal CMIZ is inputted to the unit circuit 38 at each stage. The polarity signal CMIZ is generated by the generation circuit 230 shown in FIG. 22, and is supplied from the outside of the common electrode driving circuit 200.

With this configuration, during initialization, the initialization signal INITB is at a low level, and therefore the transistors T13 are switched off, so that the nodes N1 are disconnected from the power supplies VSS. As a result, the nodes N1 are fixed at a high level (Vdd) of the polarity signal CMIZ. Thus, it is possible to carry out initialization without a fail.

During a regular operation, the initialization signal INITB is at a high level, and therefore the power supplies VSS are connected to the transistors T6 via the resistors R1 and the transistors T13 which are switched on. Therefore, it is possible to carry out the same operation as the unit circuit 27 of Example 7.

Thus, with the unit circuit 38, it is possible to achieve not only the effect given by the unit circuit 27 of Example 7 but also an effect of initializing the common electrode driving circuit 200 in a stable manner.

Example 19

Figure 27:
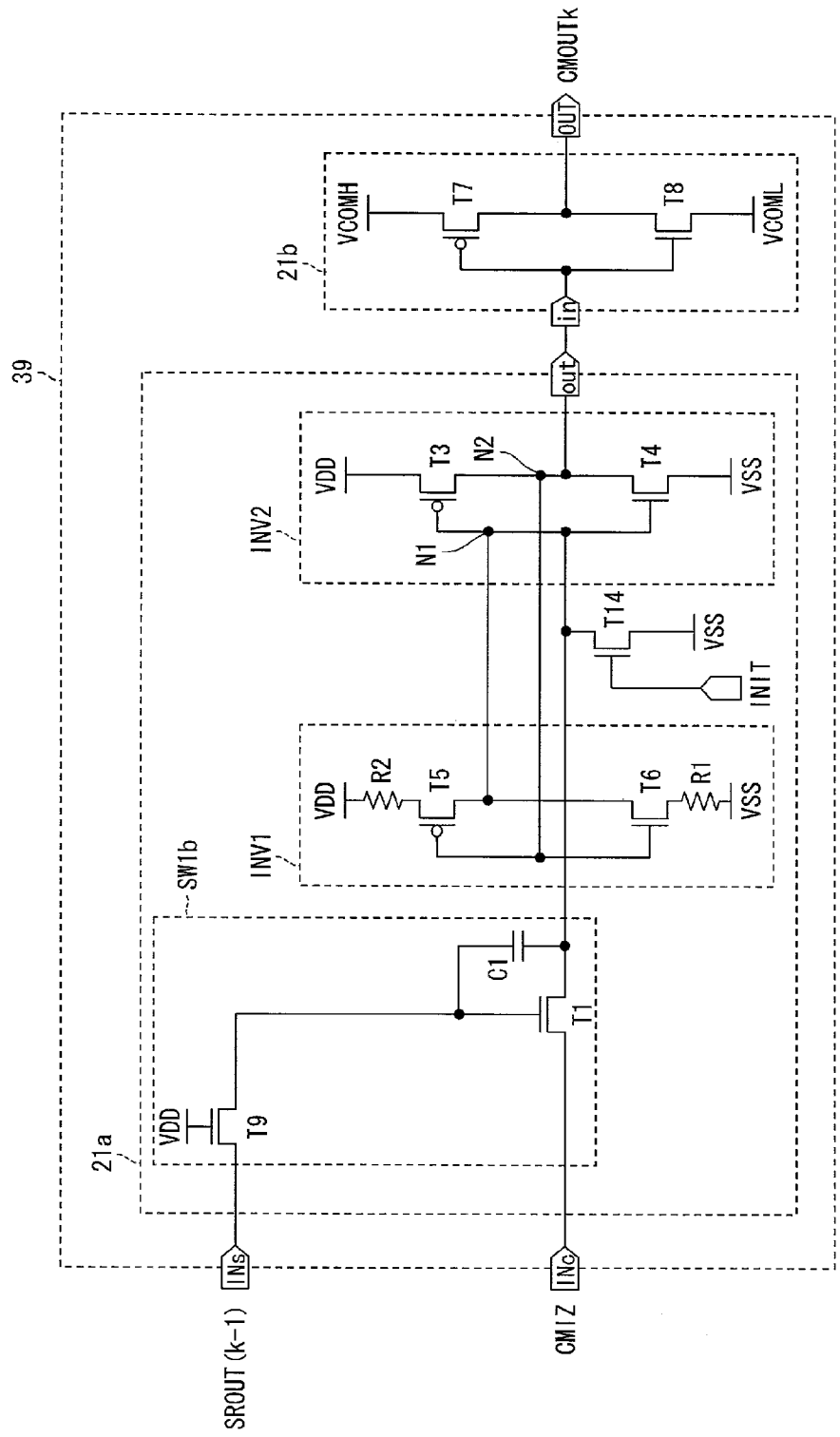
FIG. 27 is a circuit diagram of a unit circuit included in a common electrode driving circuit of Example 19.

FIG. 27 is a circuit diagram of a unit circuit 39 included in a common electrode driving circuit 200 of Example 19.

The unit circuit 39 corresponds to the unit circuit 27 of Example 7 additionally having a function for initializing the common electrode driving circuit 200. Specifically, the unit circuit 39 corresponds to the unit circuit 27 (see FIG. 11) of Example 7 in which an N channel type transistor T14 is added for the node N1 and an initialization terminal (INIT terminal) is provided. The transistor T14 has a gate terminal supplied with an initialization signal INIT, a source terminal supplied with a power supply voltage Vss, and a drain terminal connected to the node N1.

The initialization signal INIT is a signal that is at a low level (Vss) during a regular operation, and that is at a high level (Vdd) during initialization (active). A polarity signal CMIZ is a signal that has a polarity inverted for each horizontal scanning period (1H) as well as the polarity signal CMI of the unit circuit 27 during a regular operation, and that is at a low level during initialization. The polarity signal CMIZ is inputted to the unit circuit 39 at each stage. The polarity signal CMIZ is generated by the generation circuit 240 shown in FIG. 24, and is supplied from the outside of the common electrode driving circuit 200.

With this configuration, during initialization, the initialization signal INIT is at a high level, and therefore the transistors T14 are switched on, so that potentials of the nodes N1 are made closer to a power supply voltage Vss. This makes it possible to forcibly fix the nodes N1 at a low level (Vss). Thus, it is possible to carry out initialization without a fail.

During a regular operation, the initialization signal INIT is at a low level, and therefore the nodes N1 are disconnected from the power supplies VSS. Therefore, it is possible to carry out the same operation as the unit circuit 27 of Example 7.

Thus, with the unit circuit 39, it is possible to achieve not only the effect given by the unit circuit 27 of Example 7 but also an effect of initializing the common electrode driving circuit 200 in a stable manner.

Example 20

Figure 28:
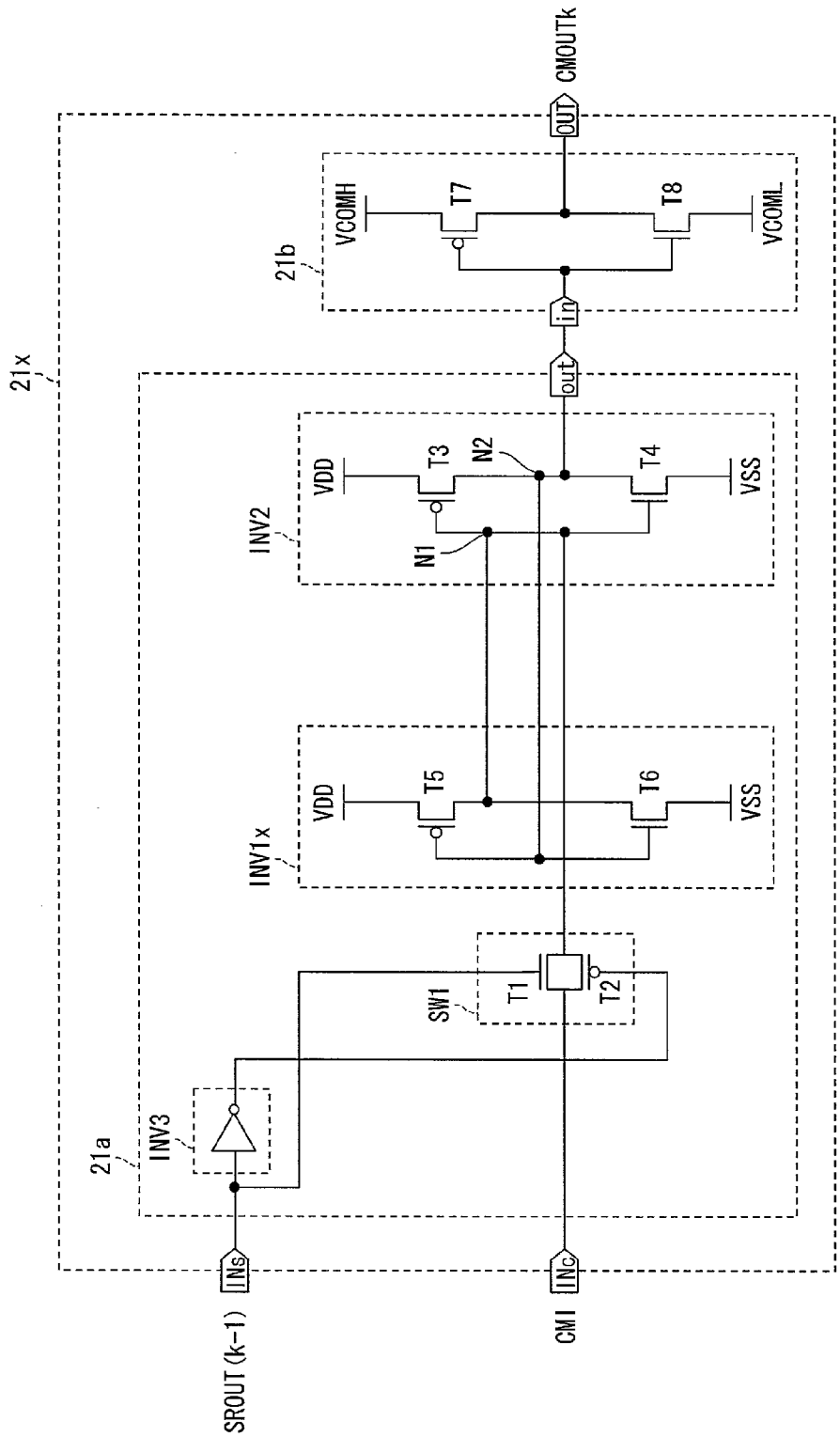
FIG. 28 is a circuit diagram of a unit circuit included in a common electrode driving circuit of Example 20.

FIG. 28 is a circuit diagram of a unit circuit 21x included in a common electrode driving circuit 200 of Example 20. In the unit circuit 21x, transistors T5, T6 configuring an inverter INV1x are set to have channel lengths L identical with those of transistors T3, T4 configuring an inverter INV2. In other words, all transistors configuring the inverters INV1, INV2 are set to have identical sizes. Further, the unit circuit 21x is set so that a polarity signal CMI to be supplied to an input terminal INc has an increased driving capability. The unit circuit 21x is configured, for instance, so that an input line of the polarity signal CMI has a wiring resistor smaller than that of a connection line of the inverters INV1, INV2.

With this configuration, even in a case where an output signal SROUT(k−1) is at a high level (active) and thus Vss (low level) of a polarity signal CMI and a power supply VDD (high level) are short-circuited, a potential of the node N1 is made closer to the polarity signal CMI since the polarity signal CMI has a high driving capability. Thus, the potential of the node N1 decreases to a potential close to Vss (low level) of the polarity signal CMI (potential lower than an inverted potential of the inverter INV2), and thereafter decreases to Vss due to feedback of an output (Vdd) of the inverter INV2. Further, even in a case where Vdd (high level) of the polarity signal CMI and a power supply VSS (low level) are short-circuited, a potential of the node N1 is made closer to the polarity signal CMI since the polarity signal CMI has a high driving capability. Thus, the potential of the node N1 increases to a potential close to Vdd of the polarity signal CMI (potential higher than an inverted potential of the inverter INV2), and thereafter increases to Vdd due to feedback of an output (Vss) of the inverter INV2.

With this, it is possible to achieve a similar effect to that of Example 1 and the like. The configuration of Example 20 is applicable to any of the Examples described above.

The following description will discuss specific configurations for increasing the driving capability of the polarity signal CMI.

(a) of FIG. 53 is a block diagram illustrating unit circuits 21 and a CMI buffer section 60. (b) of FIG. 53 is a circuit diagram thereof. The unit circuits 21 may each be a unit circuit of any of the Examples described above. FIG. 53 schematically illustrates the unit circuits 21 in a simplified manner for convenience. The polarity signal CMI is supplied to the unit circuits 21 via the CMI buffer section 60. Referring now to (b) of FIG. 53, in a case where a polarity signal CMI is to be written to the unit circuits 21, if the relations below hold for a unit circuit 21 of which the analog switch circuit SW1 is in an ON state, that unit circuit 21 can retain a desired value.

$r2+r3+r4<r5$ (for a case where a polarity signal CMI at a low level is to be written to a node N1)

$r1+r3+r4<r6$ (for a case where a polarity signal CMI at a high level is to be written to a node N1)

Thus, for an increased driving capability of the polarity signal CMI, it is simply necessary that (i) the CMI buffer section 60 be configured so that a channel width W is increased for decreased resistance values of the resistors r1, r2, that (ii) a resistance value of a wiring resistor r3 be decreased, or that (iii) a resistance value of a resistor r4 of the analog switch circuit SW1 be decreased. Alternatively, a channel length L may be increased or a resistor may be inserted as in other Examples for increased resistance values of resistors r5 and r6.

The relations described above apply to a case where an inverted potential of the inverter section INV2 is at a center between the power supply voltage Vss and the power supply voltage Vdd. In a case where the inverted potential is not at the center, respective resistance values of the resistors r1, r3, and r4 may simply be decreased so that the inverted potential exceeds the center.

(a) of FIG. 54 is a block diagram illustrating unit circuits 21 and an IC circuit 61. (b) of FIG. 54 is a circuit diagram thereof. The unit circuits 21 are supplied with an output signal of the IC circuit 61 as a polarity signal CMI. In a case where the unit circuits 21 each include, for example, a transistor that includes (i) a glass substrate or the like and (ii) polysilicon, amorphous silicon, IGZO or the like on the glass substrate and that has a relatively low electron or positive hole carrier mobility, the unit circuit 21 includes a transistor having an extremely high resistance value. Thus, the relations below easily hold in a case where a line of the polarity signal CMI is to be driven with use of a circuit that includes, for example, monocrystalline silicon and that has an extremely low output impedance.

$r7+r3+r4<r5$ (for a case where a polarity signal CMI at a low level is to be written to a node N1)

$r7+r3+r4<r6$ (for a case where a polarity signal CMI at a high level is to be written to a node N1)

In addition, for an increased driving capability of the polarity signal CMI, (i) a resistance value of a wiring resistor r3 may be decreased, or (ii) a resistor r4 of the analog switch circuit SW1 may be decreased. Alternatively, a channel length L may be increased or a resistor may be inserted as in other Examples for increased resistance values of resistors r5 and r6.

The relations described above apply to a case where an inverted potential of the inverter section INV2 is at a center between the power supply voltage Vss and the power supply voltage Vdd. In a case where the inverted potential is not at the center, respective resistance values of the resistors r7, r3, and r4 may simply be decreased so that the inverted potential exceeds the center.

Example 21

Figure 29:
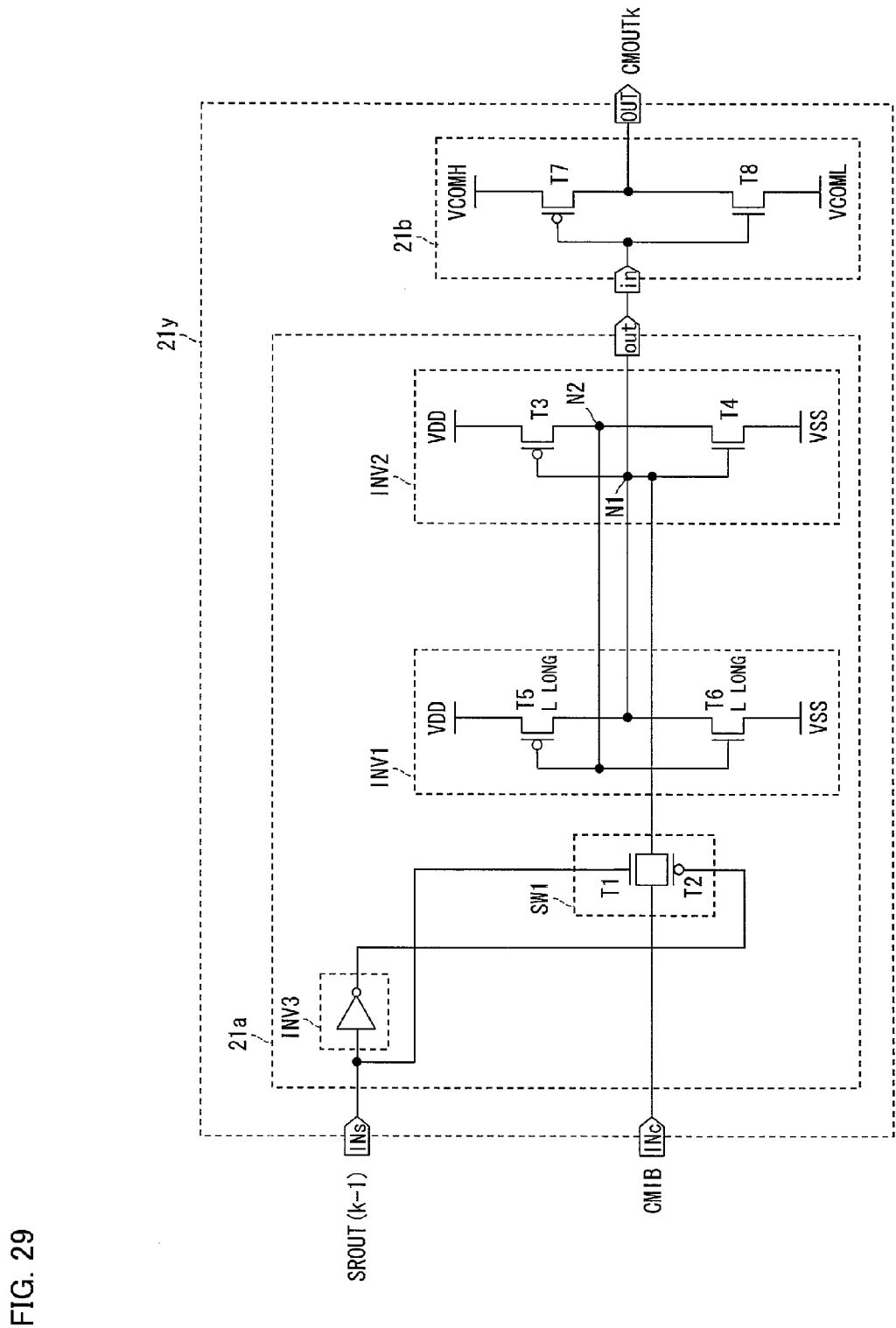
FIG. 29 is a circuit diagram of a unit circuit included in a common electrode driving circuit of Example 21.

FIG. 29 is a circuit diagram of a unit circuit 21y included in a common electrode driving circuit 200 of Example 21. The unit circuit 21y is identical in configuration with the unit circuit 21 of Example 1 (see FIG. 3) except that an output terminal "out" of a latch circuit 21a is connected to a node N1 and that an input terminal INc is supplied with a polarity signal CMIB (an inversion signal of CMI).

With this configuration, even in a case where an output signal SROUT(k−1) is at a high level (active) and thus Vss (low level) of a polarity signal CMIB and a power supply VDD (high level) are short-circuited, a potential of the node N1 is made closer to the polarity signal CMIB since the transistor T5 of the inverter INV1 is set to have a long channel length L and therefore has a low driving capability. Thus, the potential of the node N1 decreases to a potential close to Vss (low level) of the polarity signal CMIB (potential lower than an inverted potential of the inverter INV2), and thereafter decreases to Vss due to feedback of an output (Vdd) of the inverter INV2. Further, even in a case where Vdd (high level) of the polarity signal CMIB and a power supply VSS (low level) are short-circuited, a potential of the node N1 is made closer to the polarity signal CMIB since the transistor T6 of the inverter INV1 is set to have a long channel length L and therefore has a low driving capability. Thus, the potential of the node N1 increases to a potential close to Vdd of the polarity signal CMIB (potential higher than an inverted potential of the inverter INV2), and thereafter increases to Vdd due to feedback of an output (Vss) of the inverter INV2. In a case where the polarity signal CMIB is Vss (low level), Vcomh is outputted via a buffer 21b, whereas in a case where the polarity signal CMIB is Vdd (high level), Vcoml is outputted via a buffer 21b.

With this, it is possible to achieve a similar effect to that of Example 1 and the like. The configuration of Example 21 is applicable to any of the Examples described above.

(Switching of Scanning Direction)

Figure 30:
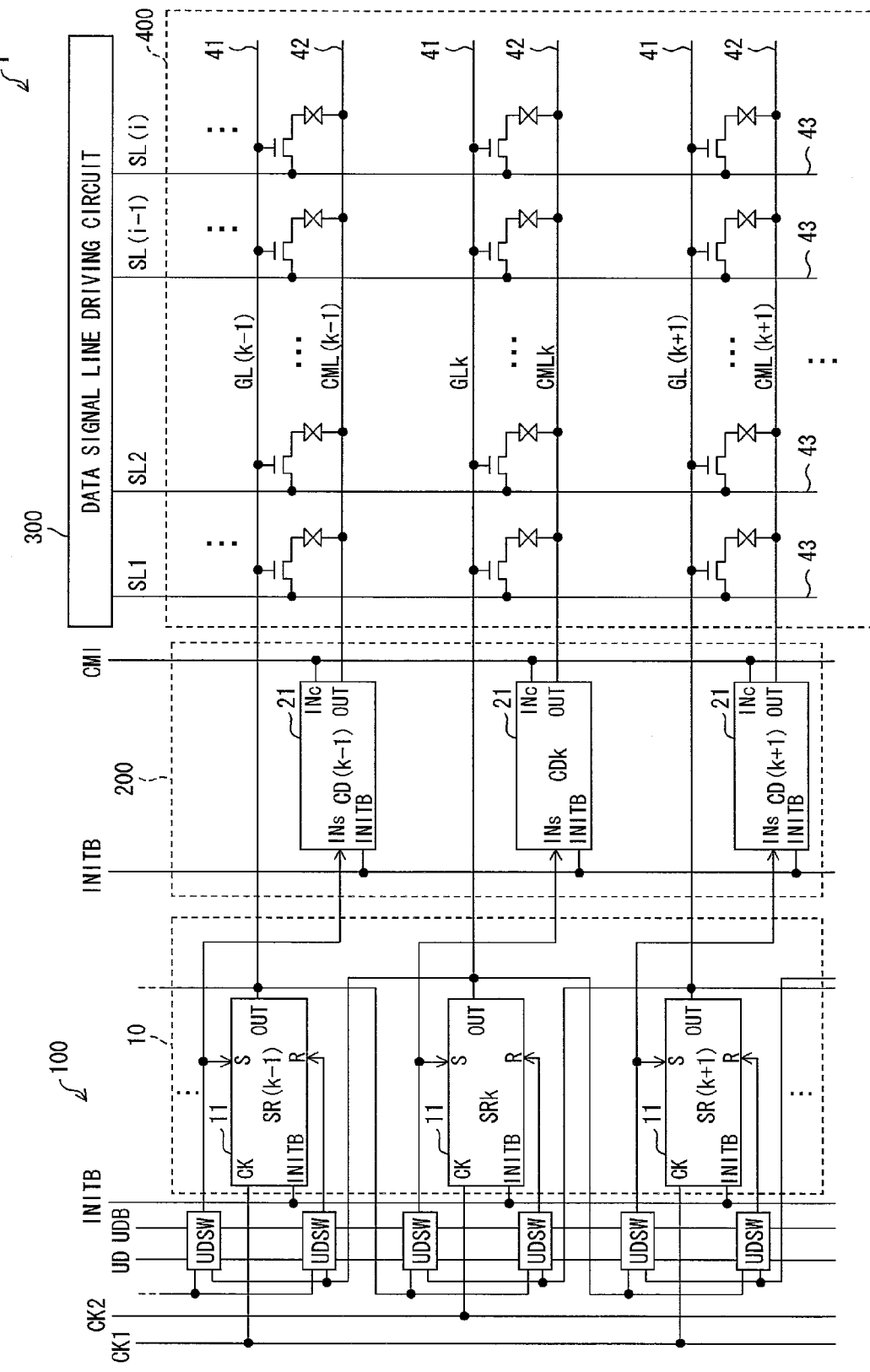
FIG. 30 is a block diagram illustrating a variation of the liquid crystal display device of Embodiment 1.
Figure 31:
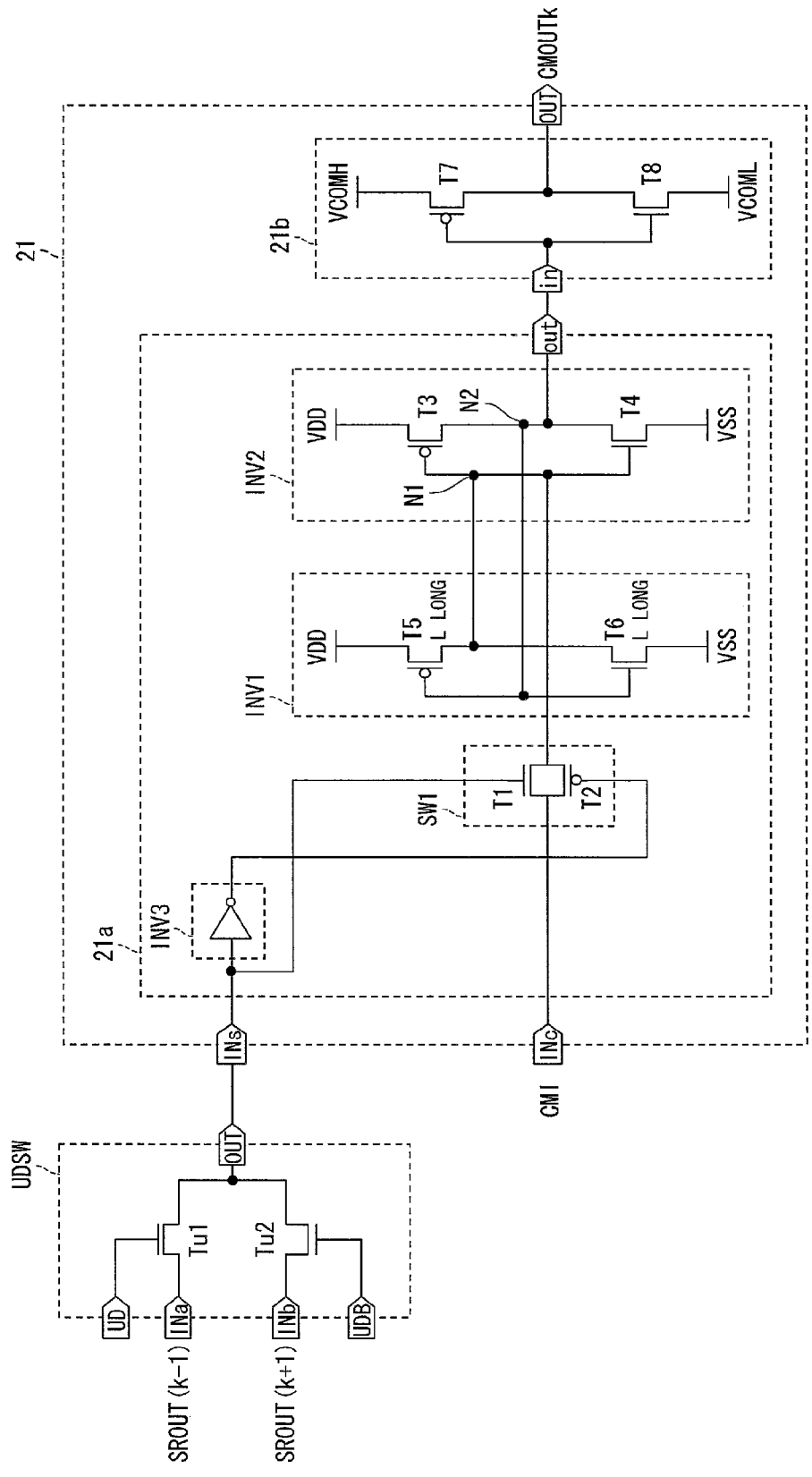
FIG. 31 is a circuit diagram illustrating a connection between a switching circuit UDSW and a kth unit circuit included in the common electrode driving circuit of Example 1.

The liquid crystal display device 1 may further include switching circuits UDSW each for switching a scanning direction (shift direction) of a shift register 10. FIG. 30 is a block diagram illustrating a variation of the liquid crystal display device 1. FIG. 31 is a circuit diagram illustrating how the switching circuit UDSW is connected to a kth unit circuit 21 included in the common electrode driving circuit 200 of Example 1.

The switching circuit UDSW includes N channel type transistors Tu1 and Tu2. The transistor Tu1 has a source terminal connected to an input terminal INa, a drain terminal connected to an output terminal OUT, and a gate terminal supplied with a switching signal UD. The transistor Tu2 has a source terminal connected to an input terminal INb, a drain terminal connected to an output terminal OUT, and a gate terminal supplied with a switching signal UDB (inversion signal of UD). The switching circuit UDSW has an output terminal connected to an input terminal INs of the unit circuit 21. For the kth unit circuit 21, the input terminal INa of the switching circuit UDSW is supplied with an output signal SROUT(k−1) of a (k−1)th unit circuit 11 of the shift register 10, whereas the input terminal INb of the switching circuit UDSW is supplied with an output signal SROUT(k+1) of a (k+1)th unit circuit 11 of the shift register 10.

The switching signals UD and UDB are opposite to each other in polarity. In a case where the switching signal UD is at a high level (switching signal UDB is at a low level), the transistor Tu1 is in an ON state, and the output signal SROUT (k−1) is supplied from the switching circuit UDSW to the kth unit circuit 21. In a case where the switching signal UDB at a high level (switching signal UD is at a low level), the transistor Tu2 is in an ON state, and the output signal SROUT(k+1) is supplied from the switching circuit UDSW to the kth unit circuit 21.

Figure 32:
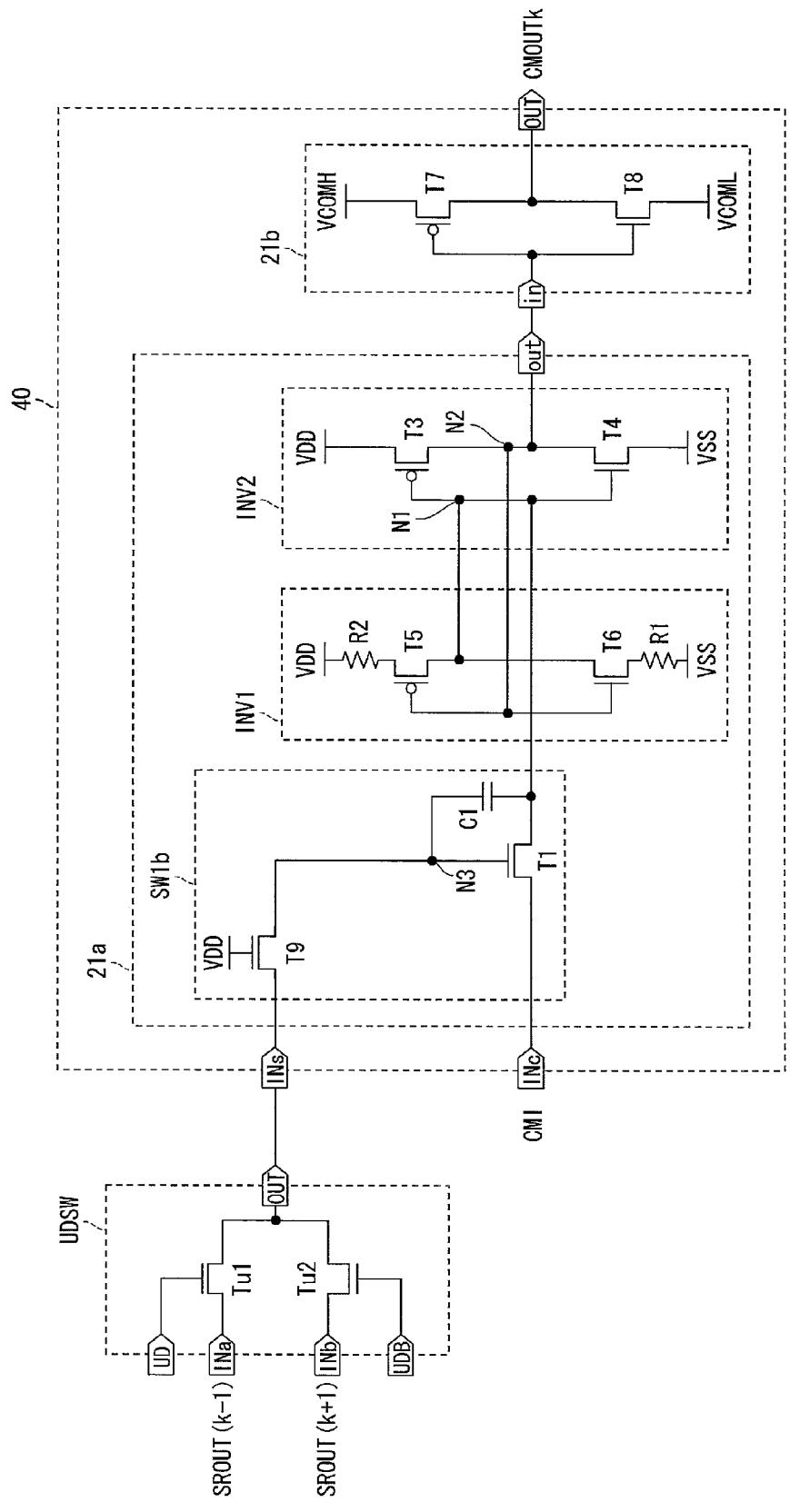
FIG. 32 is a circuit diagram of a unit circuit in which a switching circuit UDSW is provided to the unit circuit of Example 7.
Figure 33:
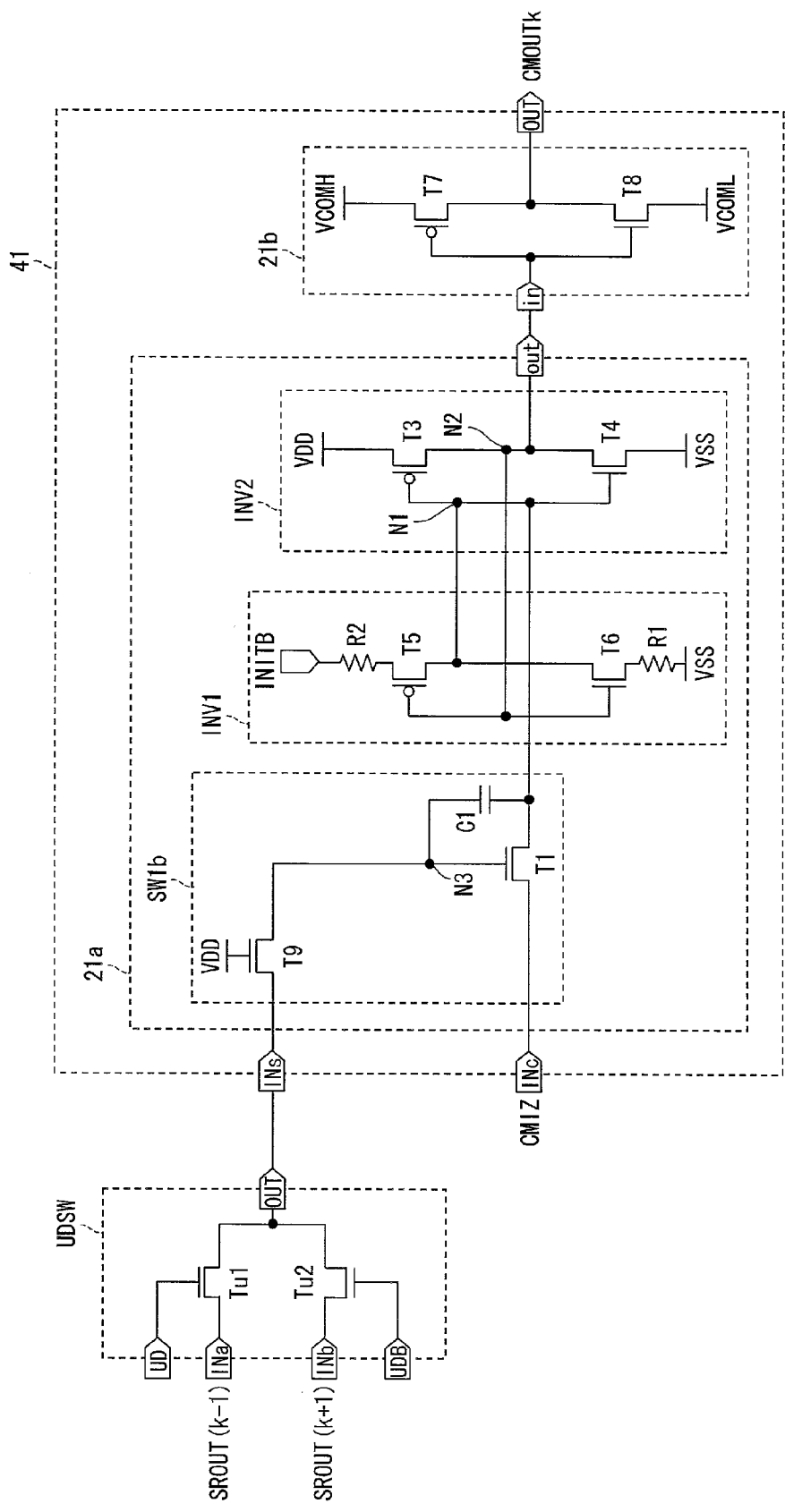
FIG. 33 is a circuit diagram of a unit circuit in which a switching circuit UDSW is provided to the unit circuit of Example 13.

The above arrangement allows switching the scanning direction of the shift register 10 between a first direction (from the first stage to an nth stage) and a second direction (from the nth stage to the first stage). The switching circuit UDSW may be used in any of the Examples described above. As examples, FIG. 32 illustrates a unit circuit 40 that corresponds to the unit circuit 27 of Example 7 and that further includes a switching circuit UDSW, and FIG. 33 illustrates a unit circuit 41 that corresponds to the unit circuit 33 of Example 13 and that further includes a switching circuit UDSW. Including a switching circuit UDSW increases a difference between (i) a potential raised by a bootstrap operation and (ii) a potential of a gate terminal of a transistor in the switching circuit UDSW which transistor has a gate terminal supplied with a low-level signal. In each of the unit circuits 40 and 41 of FIGS. 32 and 33, however, a transistor T9 functions as a pressure-resistant transistor.

Figure 52:
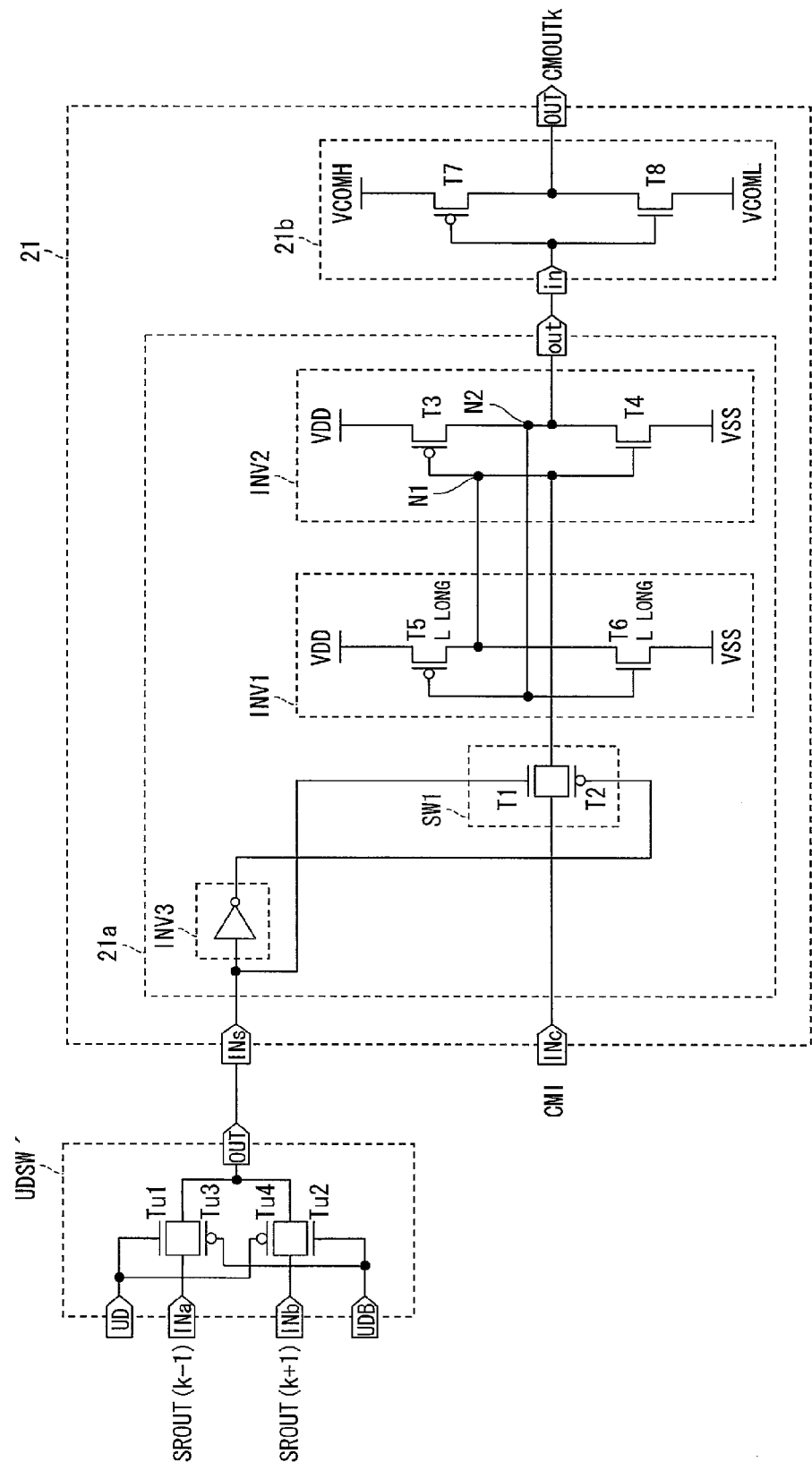
FIG. 52 is a view illustrating another configuration of the switching circuit UDSW illustrated in FIG. 31.

FIG. 52 is a diagram illustrating another configuration of the switching circuit UDSW. FIG. 52 illustrates a switching circuit UDSW' including N channel type transistors Tu1 and Tu2 and P channel type transistors Tu3 and Tu4. The switching circuit UDSW' allows an inverter INV3 to receive a signal free from a threshold drop.

Figure 34:
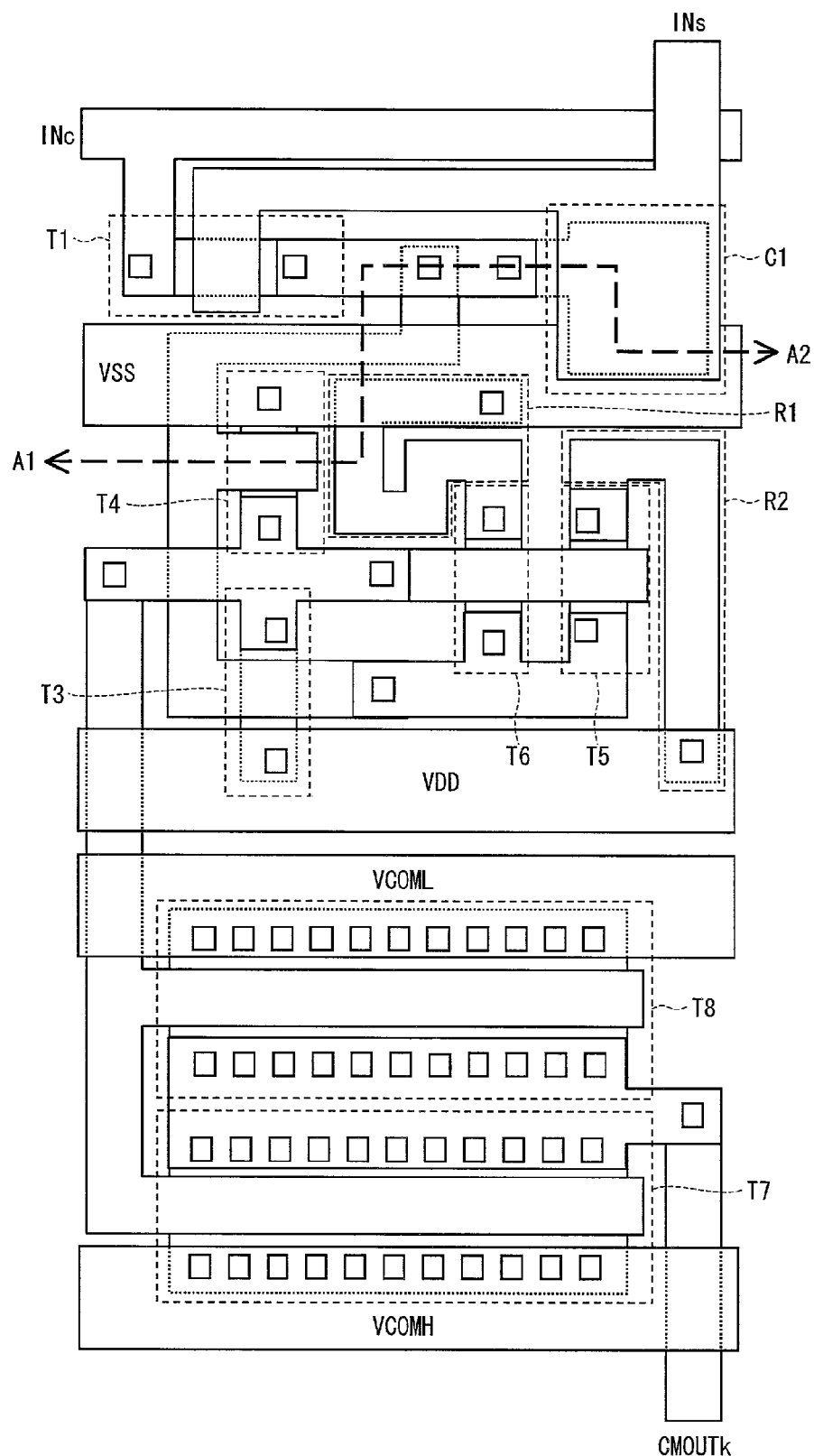
FIG. 34 is a view illustrating a planar layout of the unit circuit of FIG. 32.
Figure 35:
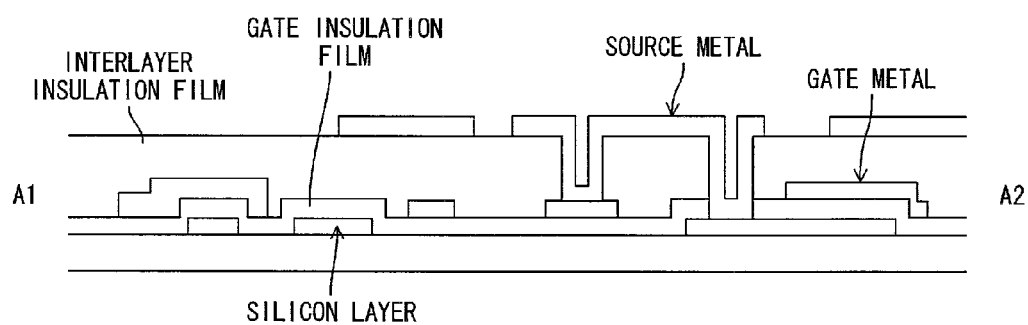
FIG. 35 is a cross-sectional view taken along the line A1-A2 of FIG. 34.

FIG. 34 illustrates a planar layout of the unit circuit 40 of FIG. 32. FIG. 35 illustrates a cross-sectional view of the unit circuit 40 taken along line A1-A2 in FIG. 34. As shown in FIGS. 34 and 35, making the resistors r1, r2 of a portion (silicon) forming a channel of a transistor allows the resistors r1, r2 to be positioned below a source metal and laid out in any pattern unlike a transistor. In addition, a silicon semiconductor has a sheet resistance value that is approximately tens of thousands times larger than that of a gate or a source. This allows a layout area to be reduced greatly.

Figure 37:
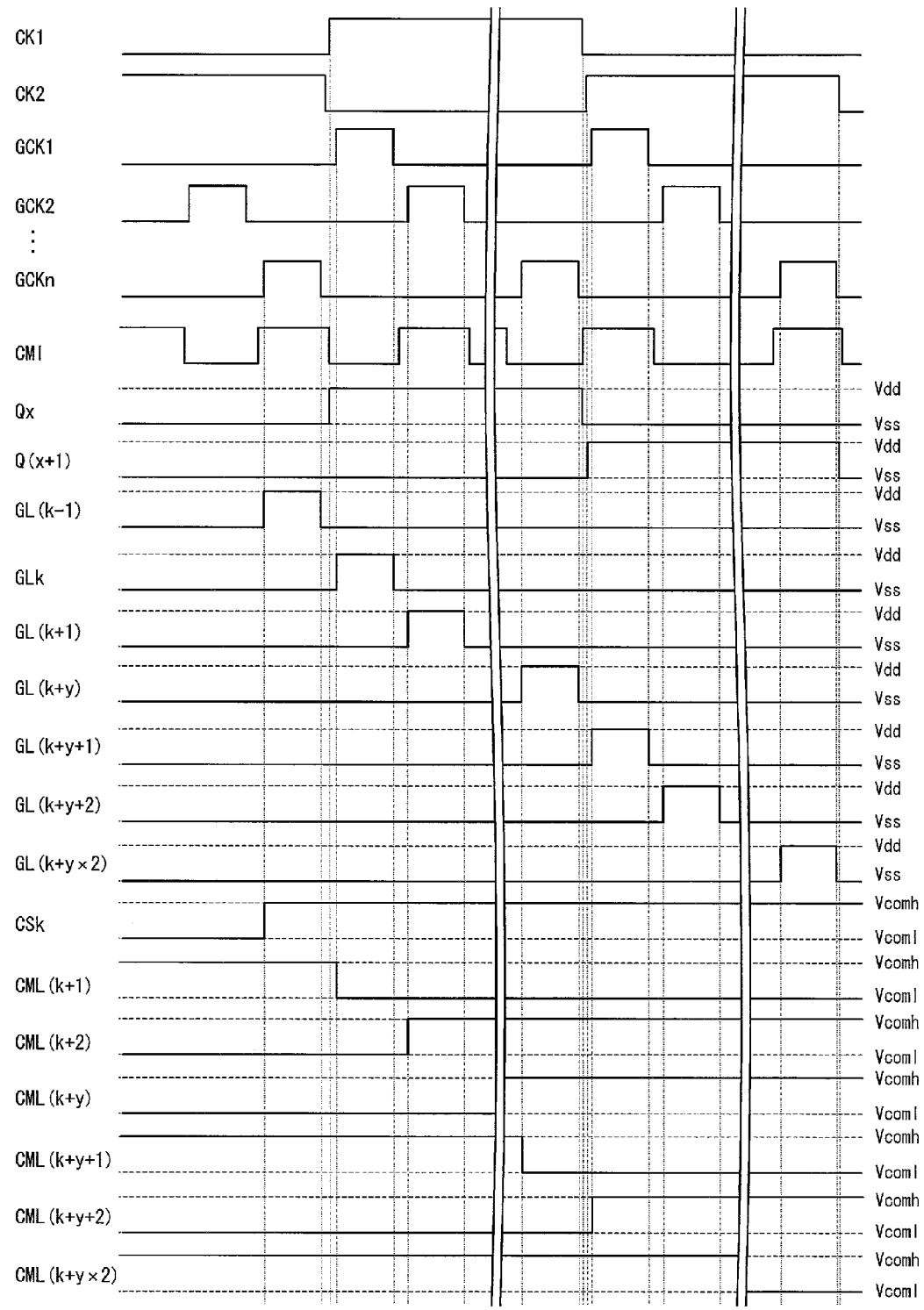
FIG. 37 is a timing chart at the time of an operation of the common electrode driving circuit of FIG. 36.

In the Examples described above, a single unit circuit of the common electrode driving circuit 200 is provided corresponding to a single unit circuit 11 of the shift register 10. However, the present invention is not limited thereto. Plural unit circuits of the common electrode driving circuit 200 may be provided corresponding to a single unit circuit 11 of the shift register 10. FIG. 36 is a block diagram illustrating another configuration of the common electrode driving circuit 200. FIG. 37 is a timing chart at the time of an operation of the common electrode driving circuit 200. As shown in FIG. 36, plural unit circuits 21 are provided corresponding to a single unit circuit 11, and are each supplied with an output of a pulse output section OP (see FIGS. 36 and 56). This can reduce the number of unit circuits 11 included in the shift register 10, thereby further reducing the circuit scale.

In the common electrode driving circuit 200 of each of the Examples described above, the inverters INV1, INV2 configuring a unit circuit (retention circuit) are each a CMOS inverter (see (a) of FIG. 55). However, the unit circuit of the present invention is not limited thereto. The inverters INV1, INV2 may each be a NMOS inverter (see (b) of FIG. 55) or a PMOS inverter (see (c) of FIG. 55). (d) to (f) of FIG. 55 are each a diagram illustrating another example configuration of the inverters INV1, INV2 of the unit circuit of the present invention.

Assuming that, when a transistor is ON, a threshold value of a next transistor to be connected is Vth, the NMOS inverter can be used as an inverter by having such a sufficiently high resistance value Rn that an output OUT is lower than Vss+Vth. Assuming that, when a transistor is ON, a threshold value of a next transistor to be connected is Vth, the PMOS inverter can be used as an inverter by having such a sufficiently high resistance value Rp that an output OUT is higher than Vdd−Vth. Including a NMOS inverter or a PMOS inverter can reduce the number of transistors, thereby reducing the circuit scale.

Further, in a case where, for instance, the resistors r1, r2 are provided as in FIG. 6, using a NMOS inverter allows a resistor Rn to further serve a function of the resistor R2, whereas using a PMOS inverter allows a resistor Rp to further serve a function of the resistor R1. This can reduce the circuit scale (layout scale).

Embodiment 2

The description below deals with Embodiment 2 of the present invention with reference to drawings. For convenience of explanation, members of Embodiment 2 that are identical in function with their respective corresponding members of Embodiment 1 above are each assigned an identical reference numeral, and are not described here. Further, the terms defined in Embodiment 1 are also used in Embodiment 2 as so defined unless otherwise stated.

Figure 40:
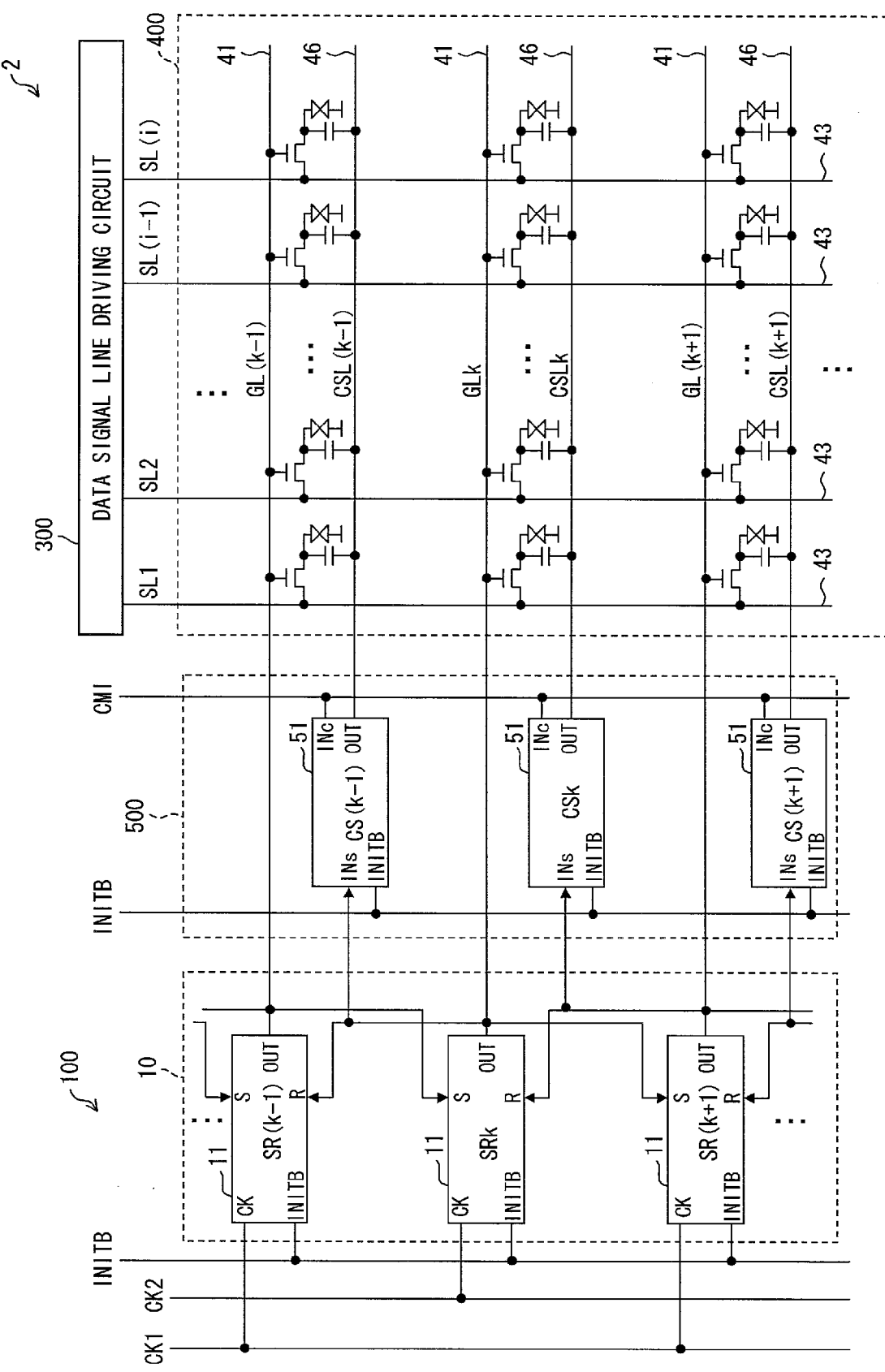
FIG. 40 is a block diagram illustrating a schematic configuration of a liquid crystal display device of Embodiment 2.

FIG. 40 is a block diagram illustrating a schematic configuration of a liquid crystal display device 2 of Embodiment 2. The liquid crystal display device 2 includes a scanning signal line driving circuit 100, a retention capacitor line driving circuit 500 (CS driver), a data signal line driving circuit 300, and a display panel 400. Note that the driving circuits and pixel circuits may be monolithically formed on an active matrix substrate.

The display panel 400 is driven by the scanning signal line driving circuit 100, the retention capacitor line driving circuit 500, the data signal line driving circuit 300, and control circuits for controlling those circuits 100, 500, and 300.

The retention capacitor line driving circuit 500 supplies each retention capacitor line 46 (CS line) with a high-level signal (Vcsh) (modulation signal) or a low-level signal (Vcsl) (modulation signal) on the basis of an output signal (SROUT) of a shift register 10 included in the scanning signal line driving circuit 100.

The control circuits control the scanning signal line driving circuit 100, the retention capacitor line driving circuit 500, and the data signal line driving circuit 300 to output gate signals, source signals, and CS signals.

The liquid crystal display device 2 of Embodiment 2 is configured to perform a stable operation by preventing decrease in potential level of an output signal of the retention capacitor line driving circuit 500 while reducing a circuit area. The following description will discuss specific configurations of the scanning signal line driving circuit 100 and the retention capacitor line driving circuit 500.

The shift register 10 configuring the scanning signal line driving circuit 100 is configured by connecting multiple m (m is an integer of 2 or more) unit circuits 11. Each of the unit circuits 11 is made up of a clock terminal (CK terminal), a set terminal (S terminal), a reset terminal (R terminal), an initialization terminal (INITB terminal), and an output terminal OUT. Hereinafter, signals inputted and outputted via those terminals will be referred to with use of reference names of the terminals (e.g., a signal inputted via a clock terminal CK will be referred to as "clock signal CK").

To the shift register 10, a start pulse (not shown) and double-phase clock signals CK1, CK2 are supplied from the outside. The start pulse is supplied to an S terminal of a first unit circuit 11. The clock signals CK1 are supplied to CK terminals of (odd-number)th unit circuits 11, meanwhile, the clock signals CK2 are supplied to CK terminals of (even-number)th unit circuits 11. An output of each unit circuit 11, which is as an output signal SROUT, is supplied, via an output terminal OUT, to a corresponding scanning signal line GL, to an S terminal of a subsequent unit circuit 11, and to an R terminal of a preceding unit circuit 11. Further, the output signal SROUT of the each unit circuit 11 is supplied to a corresponding unit circuit 51 of the retention capacitor line driving circuit 500.

Specifically, as shown in FIG. 40, an output signal SROUT (k−1) of a (k−1)th unit circuit 11 is supplied to an S terminal of a kth (k is an integer of 1 or more but n or less) unit circuit 11 of the shift register 10, and the kth unit circuit 11 supplies an output signal SROUTk to a scanning signal line GLk. As described above, the shift register 10 subsequently outputs output signals SROUT1 to SROUTn to scanning signal lines GL1 to GLn, respectively, in accordance with a shift operation.

The retention capacitor line driving circuit 500 is configured by connecting multiple n (n is an integer of 2 or more) unit circuits 51 (retention circuits). Each of the unit circuits 51 is made up of input terminals INs, INc, an initialization terminal (INITB terminal), and an output terminal OUT. The output signal SROUT of the shift register 10 is supplied to the input terminal INs of the unit circuit 51, a polarity signal CMIZ is supplied to the input terminal INc, an initialization signal (INITB) is supplied to the initialization terminal (INITB terminal), and an output from the unit circuit 51 is supplied, as an output signal CSOUT, to a retention capacitor line (CS line).

Specifically, as shown in FIG. 40, an output signal SROUT (k+1) of a (k+1)th unit circuit 11 of the shift register 10 is supplied to a kth (k is an integer of 1 or more but n or less) unit circuit 51 of the retention capacitor line driving circuit 500, and the kth unit circuit 51 supplies an output signal CSOUTk to a retention capacitor line CSLk. As described above, the retention capacitor line driving circuit 500 subsequently supplies output signals CSOUT1 to CSOUTn to retention capacitor lines CSL1 to CSLn, respectively, in accordance with a shift operation of the shift register 10.

As the shift register 10, a well-known configuration can be applied. Therefore, detailed description of the shift register 10 will be omitted, and the following description will discuss the retention capacitor line driving circuit 500 in detail.

Example 1

Figure 41:
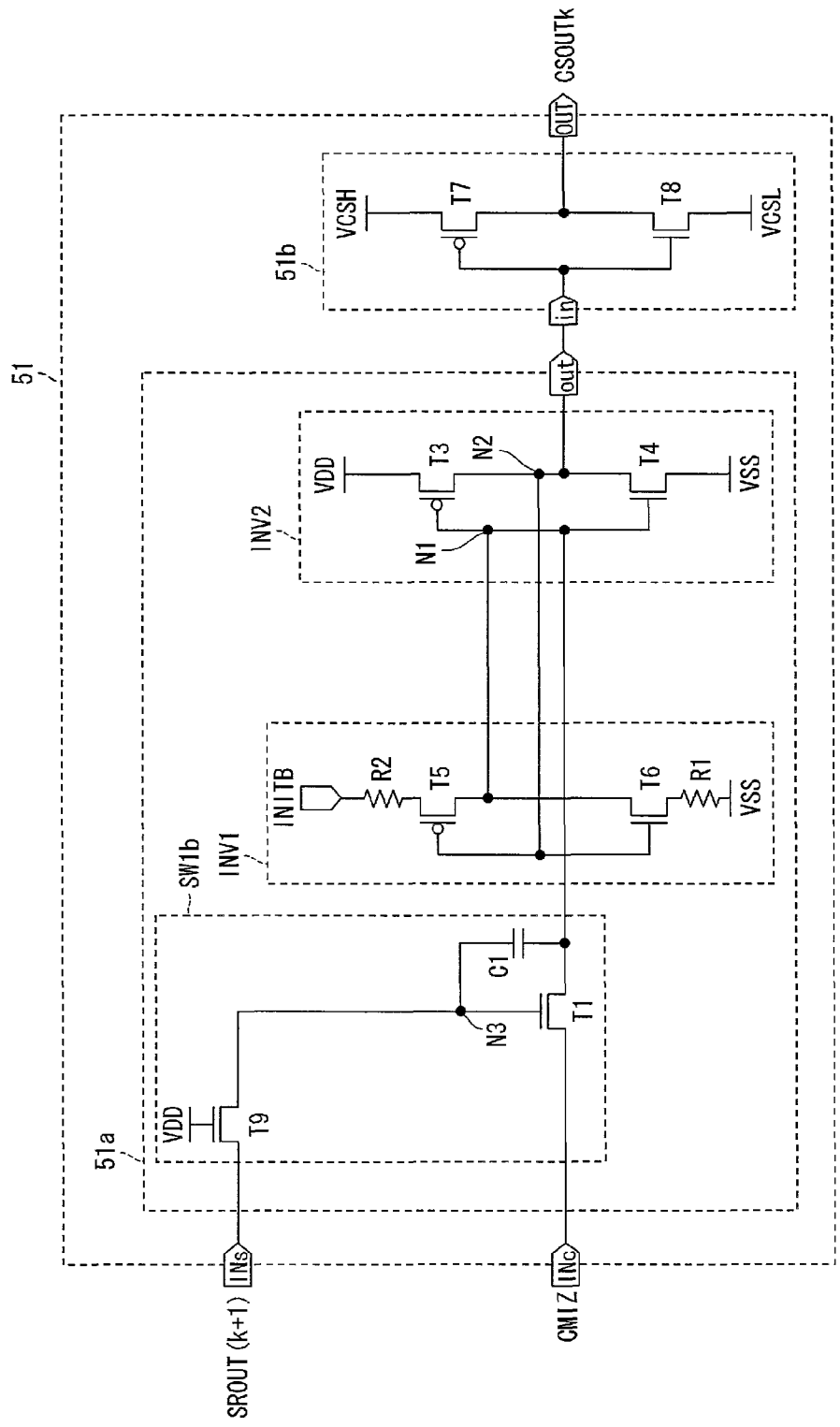
FIG. 41 is a circuit diagram of a unit circuit included in a retention capacitor line driving circuit of Example 1.

FIG. 41 is a circuit diagram of the unit circuit 51 included in the retention capacitor line driving circuit 500 of Example 1. The unit circuit 51 (retention circuit) includes a latch through circuit 51a and a buffer 51b. The latch through circuit 51a includes inverters INV1, INV2, and an analog switch circuit SW1. The buffer 51b includes two transistors. The inverter INV1 is provided with resistors R1, R2. Hereinafter, in the inverter INV2, a connection point between an output of the inverter INV1 and an input of the inverter INV2 is defined as a node N1 and a connection point between an input of the inverter INV1 and an output of the inverter INV2 is defined as a node N2.

The analog switch circuit SW1b includes an N channel type transistor T1 (first transistor), a transistor T9, and a capacitor C1. The transistor T9 has a gate terminal supplied with a power supply voltage Vdd, a source terminal connected to an input terminal INs, and a drain terminal connected to a gate terminal of a transistor T1. The capacitor C1 is provided between the gate terminal and drain terminal of the transistor T1. Note that a connection point between the capacitor C1 and the gate terminal of the transistor T1 is defined as a node N3. The transistor T1 has a source terminal connected to an input terminal INc. An output signal SROUT of the unit circuit 11 of the shift register 10 is supplied to the input terminal INs, meanwhile, a polarity signal CMIZ is supplied to the input terminal INc.

The inverter INV2 is made up of a P channel type transistor T3 (fourth transistor) and an N channel type transistor T4 (fifth transistor). An input terminal (connection point (node N1) between a gate terminal of the transistor T3 and a gate terminal of the transistor T4) of the inverter INV2 is connected to an output terminal (drain terminal of the transistor T1) of the analog switch circuit SW1b. A power supply voltage Vdd is supplied to a source terminal of the transistor T3, meanwhile, a drain terminal of the transistor T3 is connected to an output terminal (connection point (node N2) between the drain terminal of the transistor T3 and a drain terminal of the transistor T4) of the inverter INV2. A power supply voltage Vss is supplied to the source terminal of the transistor T4, meanwhile, the drain terminal of the transistor T4 is connected to the output terminal (node N2) of the inverter INV2. The node N2 is connected to an output terminal "out" of the latch through circuit 51a and an input terminal (gate terminals of transistors T5, T6) of the inverter INV1.

The inverter INV1 includes a P channel type transistor T5 (second transistor), an N channel type transistor T6 (third transistor), and resistors r1, r2, and is further provided with an initialization terminal (INITB terminal). The input terminal (gate terminals of the transistors T5, T6) of the inverter INV1 is connected to the output terminal (node N2) of the inverter INV2. An initialization signal INITB is supplied to a source terminal of the transistor T5 via the resistor R2, and a drain terminal of the transistor T5 is connected to an output terminal (connection point between the drain terminal of the transistor T5 and a drain terminal of the transistor T6) of the inverter INV1. A power supply voltage Vss is supplied to a source terminal of the transistor T6 via the resistor R1, and the drain terminal of the transistor T6 is connected to the output terminal of the inverter INV1. The output terminal of the inverter INV1 is connected to the input terminal (node N1) of the inverter INV2. The output terminal "out" of the latch through circuit 51a is connected to an input terminal 'in' of the buffer 51b.

The buffer 51b includes a P channel type transistor T7 and an N channel type transistor T8. Gate terminals of the transistors T7, T8 are connected to the input terminal 'in'. A power supply voltage Vcsh is supplied to a source terminal of the transistor T7, and a drain terminal of the transistor T7 is connected to the output terminal OUT of the unit circuit 51. A power supply voltage Vcsl is supplied to a source terminal of the transistor T8, and a drain terminal of the transistor T8 is connected to the output terminal OUT of the unit circuit 51.

Therefore, the output signal SROUT(k+1) of the (k+1)th unit circuit 11 of the shift register 10 is supplied to the input terminal INs of the kth unit circuit 51, and the output signal CSOUTk is supplied to the kth retention capacitor line CSLk via the output terminal OUT of the kth unit circuit 51.

The retention capacitor line driving circuit 500, including the unit circuit 51 configured as described above, subsequently outputs output signals CSOUT1 to CSOUTn one by one, whose voltages are alternately changed (high level (Vcsh) or low level (Vcsl)) in each frame. Hereinafter, potentials of signals inside the retention capacitor line driving circuit 500, including the clock signals CK1, CK2, and potentials of input and output signals are defined to be Vdd in the case where the potentials are at a high level, and are defined to be Vss in the case where the potentials are at a low level, unless otherwise specified. The initialization signal INITB is a signal that is at a high level (Vdd) during a regular operation, and that is at a low level (Vss) during initialization. Further, a potential of the polarity signal CMIZ is also defined to be Vdd in the case where the potential is at a high level, and is defined to be Vss in the case where the potential is at a low level. Note, however, that a potential level of the polarity signal CMIZ is not limited thereto, and "high level" only needs to be higher than an inverted potential of the inverter INV2, whereas "low level" only needs to be lower than the inverted potential of the inverter INV2.

(Operation)

Figure 42:
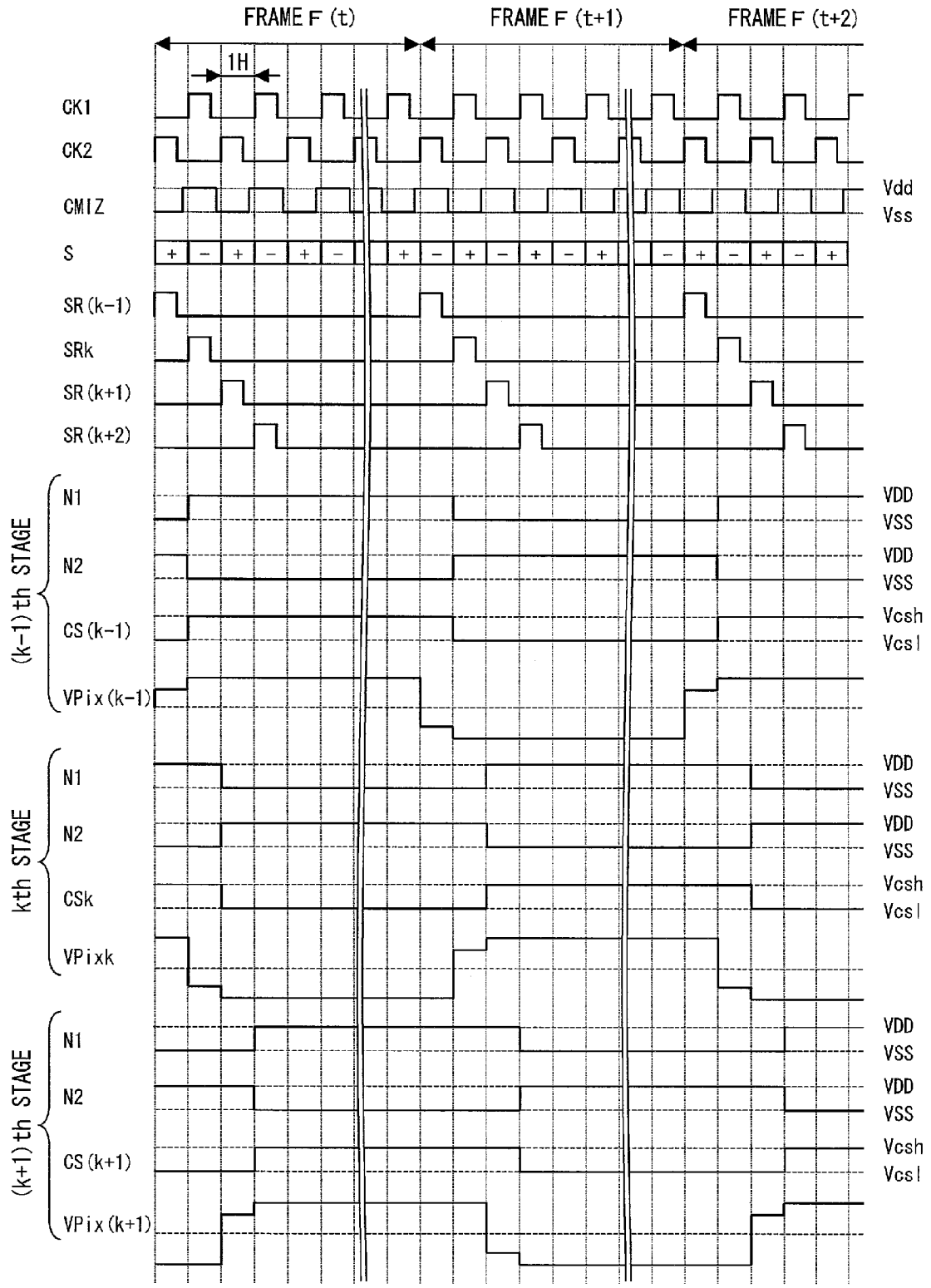
FIG. 42 is a timing chart at the time of an operation of the retention capacitor line driving circuit of Example 1.
Figure 43:
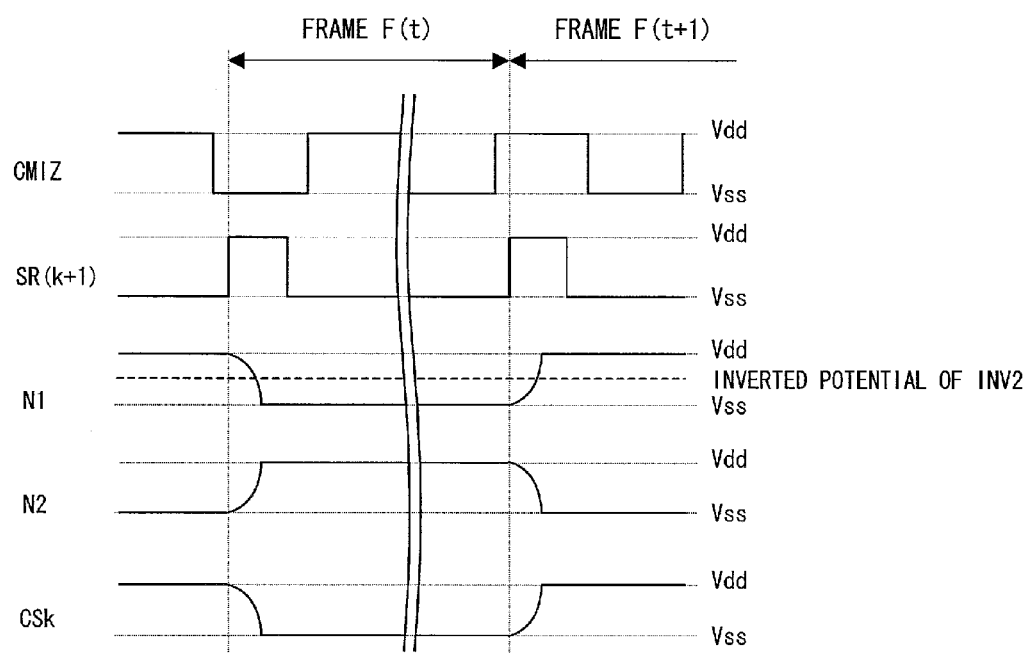
FIG. 43 is a schematic view showing a timing chart at the time of an operation of the retention capacitor line driving circuit of Example 1.

An operation of the retention capacitor line driving circuit 500 will be described with reference to FIGS. 42 and 43. FIG. 42 is a timing chart at the time of an operation of the retention capacitor line driving circuit 500. FIG. 43 is a schematic view showing a timing chart at the time of an operation of the retention capacitor line driving circuit 500. In FIG. 42, input and output signals are illustrated in the (k−1)th unit circuit 51, the kth unit circuit 51, and a (k+1)th unit circuit 51, as well as a potential of a pixel P corresponding to each stage.

CK1 is a clock signal to be supplied to each of the CK terminals of the (odd-number)th unit circuits 51, meanwhile, CK2 is a clock signal to be supplied to each of the CK terminals of the (even-number)th unit circuits 51. CMIZ is a signal (polarity signal) whose polarity is inverted in each horizontal scanning period (1H) during a regular operation similarly to CMI and is at a low level during initialization. SR(k−1), SRk, SR(k+1), and SR(k+2) indicate potentials of output signals SROUT(k−1), SROUTk, SROUT(k+1), and SROUT(k+2) of a (k−1)th unit circuit 11, a kth unit circuit 11, a (k+1)th unit circuit 11, and a (k+2)th unit circuit 11, respectively, of the shift register 10. N1 and N2 indicate a potential of the node N1 and a potential of the node N2, respectively, of FIG. 41. CS(k−1), CSk, and CS(k+1) indicate output signals CSOUT(k−1), CSOUTk, and CSOUT(k+1) of the (k−1)th unit circuit 51, the kth unit circuit 51, and the (k+1)th unit circuit 51, respectively, of the retention capacitor line driving circuit 500. S indicates a data signal having a waveform in which its polarity is identical for all pixels in a row and reversed for each row (horizontal scanning period) (one line (1H) inversion driving). Note that a period after the output signal SROUTk is outputted but until the next output signal SROUTk is outputted corresponds to one vertical scanning period (1 frame: 1 V). Further, FIG. 42 shows arbitrarily sequential frames F(t), F(t+1), and F(t+2). Note that the initialization signal INITB is at a high level (Vdd).

First, the following description will discuss a kth pixel Pk (one of the pixels connected to a scanning signal line GLk) and operations in the frames F(t), F(t+1) of the kth unit circuit 51.

In the frame F(t), when the output signal SROUTk of the kth unit circuit 11 of the shift register 10 becomes the high level (active), the scanning signal line GLk becomes active, thereby writing a data signal S (negative polarity) to the pixel Pk. Then, when the output signal SROUT(k+1) of the (k+1)th unit circuit 11 of the shift register 10 becomes the high level (active), the output signal SROUT(k+1) (high level) is supplied to an input terminal INs of the kth unit circuit 51, with the result that a polarity signal CMIZ (low level; Vss) is received by the latch through circuit 51a.

Immediately before the output signal SROUT(k+1) becomes a high level (active), a potential of the node N1 is retained at Vdd (high level) and the transistor T5 is in an ON state. Therefore, when the output signal SROUT(k+1) becomes the high level (active), Vss (low level) of the polarity signal CMIZ and an INITB terminal (high level) are short-circuited. As to this point, a resistor R2 is provided between the INITB terminal and the node N1. Therefore, a potential of the node N1 is made closer to that of the polarity signal CMIZ, thereby decreasing to a potential (potential lower than an inverted potential of the inverter INV2) which is close to Vss (low level) of the polarity signal CMIZ (see FIG. 43).

Thereafter, the transistor T3 is switched on, and an output (node N2; Vdd (high level)) of the inverter INV2 is fed back to the input of the inverter INV1, which results in switching off the transistor T5 and switching on the transistor T6. This further decreases the potential of the node N1 from the potential close to Vss of the polarity signal CMIZ to Vss (see FIG. 43).

The potential of the node N1 becomes close to Vss (low level) or becomes Vss (low level), which results in switching on the transistor T3 of the inverter INV2 and switching off the transistor T4 of the inverter INV2. This switching on of the transistor T3 causes the potential of the node N2 to be Vdd (high level), and Vdd (high level) is outputted from the latch through circuit 51a. In addition, in the buffer 51b, to which Vdd (high level) is supplied, the transistor T7 is switched off, whereas the transistor T8 is switched on. As such, Vcsl is outputted from the buffer 51b and is supplied to a kth retention capacitor line CSLk. Immediately before the output signal SROUT(k+1) becomes a high level (active), the potential of the node N1 is retained at Vdd (high level), and the kth retention capacitor line CSLk thus has a potential of Vcsh. Therefore, a potential of the kth retention capacitor line CSLk changes from Vcsh to Vcsl, thereby causing a floating potential of the pixel Pk to fall (potential shift).

Then, the output signal SROUT(k+1) of the shift register 10 changes from the high level (active) to the low level (non-active), the transistor T1 is switched off, and therefore an input of the polarity signal CMIZ is interrupted, with the result that the node N1 retains the potential (Vss (low level)) which has been retained immediately before such interruption because of a latch operation of the inverters INV1, INV2, and the buffer 51b keeps supplying the Vcsl to the kth retention capacitor line CSLk until the output signal SROUT(k+1) becomes the high level (active) in the frame F(t+1). The pixel Pk retains a potential achieved after the fall (shift).

Next, in the frame F(t+1), when the output signal SROUTk of the kth unit circuit 11 of the shift register 10 becomes the high level (active), the scanning signal line GLk becomes active, thereby writing a data signal S (positive polarity) to the pixel Pk. Then, when the output signal SROUT(k+1) of the (k+1)th unit circuit 11 of the shift register 10 becomes the high level (active), a potential of the node N3 is charged to be Vdd−Vth, and thereafter the transistor T9 is switched off. The node N1 is supplied with Vdd (high level) of a polarity signal CMIZ, since the transistor T1 is switched on by the output signal SROUT(k+1) (high level). Consequently, the potential of the node N1 starts to increase from Vss (low level) to Vdd (high level). Due to the change in the potential of the node N1, a potential of the node N3 is caused to rise to Vdd−Vth+α via the capacitor C1. As a result, the polarity signal CMIZ (Vdd) is inputted to the node N1 without dropping to below a threshold value (Vth). Thus, the potential of the node N1 becomes Vdd (bootstrap operation).

Immediately before the output signal SROUT(k+1) becomes a high level (active) (frame F(t)), the potential of the node N1 is retained at Vss (low level) and the transistor T6 is in an ON state. Therefore, when the output signal SROUT(k+1) becomes the high level (active), Vdd (high level) of the polarity signal CMIZ and a power supply Vss (low level) are short-circuited. As to this point, a resistor R1 is provided between the power supply VSS and the node N1. Therefore, the potential of the node N1 is made closer to that of the polarity signal CMIZ, thereby increasing to a potential (potential lower than an inverted potential of the inverter INV2) which is close to Vdd (high level) of the polarity signal CMIZ (see FIG. 43).

Thereafter, an output (node N2; Vss (low level)) of the inverter INV2 is fed back to the input of the inverter INV1, which results in switching on the transistor T5 and switching off the transistor T6. This further increases the potential of the node N1 from the potential close to Vdd of the polarity signal CMIZ to Vdd (see FIG. 43).

The potential of the node N1 becomes close to Vdd (high level) or becomes Vdd (high level), which results in switching on the transistor T4 of the inverter INV2 and switching off the transistor T3 of the inverter INV2. This switching on of the transistor T4 causes the potential of the node N2 to be Vss (low level), and Vss (low level) is outputted from the latch through circuit 51a. In addition, in the buffer 51b, to which Vss (low level) is supplied, the transistor T8 is switched off, whereas the transistor T7 is switched on. As such, Vcsh is outputted from the buffer 51b and is supplied to a kth retention capacitor line CSLk. Immediately before the output signal SROUT(k+1) becomes a high level (active) (frame F(t)), the potential of the node N1 is retained at Vss (low level), and the kth retention capacitor line CSLk thus has a potential of Vcsl. Therefore, a potential of the kth retention capacitor line CSLk changes from Vcsl to Vcsh, thereby causing a floating potential of the pixel Pk to rise (potential shift).

Then, the output signal SROUT(k+1) of the shift register 10 changes from the high level (active) to the low level (non-active), the analog switch circuit SW1 is switched off, and therefore an input of the polarity signal CMIZ is interrupted, with the result that the node N1 retains the potential (Vdd (high level)) which has been retained immediately before such interruption because of a latch operation of the inverters INV1, INV2, and the buffer 51b keeps supplying the Vcsh to the kth retention capacitor line CSLk until the output signal SROUT(k+1) becomes the high level (active) in the frame F(t+2). The pixel Pk retains a potential achieved after the rise (shift). After the frame F(t+2), the operations in the frames F(t), F(t+1) are repeated.

Next, the following description will discuss a (k+1)th pixel Pk and operations in the frames F(t), F(t+1) of the kth unit circuit 51.

In the frame F(t), when the output signal SROUT(k+1) of the (k+1)th unit circuit 11 of the shift register 10 becomes the high level (active), the scanning signal line GL(k+1) becomes active, thereby writing a data signal S (positive polarity) to the pixel P(k+1). Then, when the output signal SROUT(k+2) of the (k+2)th unit circuit 11 of the shift register 10 becomes the high level (active), the output signal SROUT(k+2) (high level) is supplied to an input terminal INs of the k(k+1) unit circuit 51, a potential of the node N3 is charged to be Vdd−Vth, and thereafter the transistor T9 is switched off. The node N1 is supplied with Vdd (high level) of a polarity signal CMIZ, since the transistor T1 is switched on by the output signal SROUT(k+2) (high level). Consequently, the potential of the node N1 starts to increase from Vss (low level) to Vdd (high level). Due to the change in the potential of the node N1, a potential of the node N3 is caused to rise to Vdd–Vth+α via the capacitor C1. As a result, the polarity signal CMIZ (Vdd) is inputted to the node N1 without dropping to below a threshold value (Vth). Thus, the potential of the node N1 becomes Vdd (bootstrap operation).

Immediately before the output signal SROUT(k+2) becomes a high level (active), the potential of the node N1 is retained at Vss (low level) and the transistor T6 is in an ON state. Therefore, when the output signal SROUT(k+2) becomes the high level (active), Vdd (high level) of the polarity signal CMIZ and a power supply Vss (low level) are short-circuited. As to this point, a resistor R1 is provided between the power supply VSS and the node N1. Therefore, the potential of the node N1 is made closer to that of the polarity signal CMIZ, thereby increasing to a potential (potential lower than an inverted potential of the inverter INV2) which is close to Vdd (high level) of the polarity signal CMIZ.

Thereafter, the transistor T4 is switched on, and an output (node N2; Vss (low level)) of the inverter INV2 is fed back to the input of the inverter INV1, which results in switching on the transistor T5 and switching off the transistor T6. This further increases the potential of the node N1 from the potential close to Vdd of the polarity signal CMIZ to Vdd.

The potential of the node N1 becomes close to Vdd (high level) or becomes Vdd (high level), which results in switching on the transistor T4 of the inverter INV2 and switching off the transistor T3 of the inverter INV2. This switching on of the transistor T4 causes the potential of the node N2 to be Vss (low level), and Vss (low level) is outputted from the latch through circuit 51a. In addition, in the buffer 51b, to which Vss (low level) is supplied, the transistor T8 is switched off, whereas the transistor T7 is switched on. As such, Vcsh is outputted from the buffer 51b and is supplied to a (k+1)th retention capacitor line CSL(k+1). Immediately before the output signal SROUT(k+2) becomes a high level (active) (frame F(t)), the potential of the node N1 is retained at Vss (low level), and the (k+1)th retention capacitor line CSL(k+1) thus has a potential of Vcsl. Therefore, a potential of the (k+1)th retention capacitor line CSL(k+1) changes from Vcsl to Vcsh, thereby causing a floating potential of the pixel P(k+1) to rise (potential shift).

Then, the output signal SROUT(k+2) of the shift register 10 changes from the high level (active) to the low level (non-active), the analog switch circuit SW1 is switched off, and therefore an input of the polarity signal CMIZ is interrupted, with the result that the node N1 retains the potential (Vdd (high level)) which has been retained immediately before such interruption because of a latch operation of the inverters INV1, INV2, and the buffer 51b keeps supplying the Vcsh to the (k+1)th retention capacitor line CSL(k+1) until the output signal SROUT(k+2) becomes the high level (active) in the frame F(t+1). The pixel P(k+1) retains a potential achieved after the rise (shift).

Next, in the frame F(t+1), when the output signal SROUT(k+1) of the (k+1)th unit circuit 11 of the shift register 10 becomes the high level (active), the scanning signal line GL(k+1) becomes active, thereby writing a data signal S (negative polarity) to the pixel P(k+1). Then, when the output signal SROUT(k+2) of the (k+2)th unit circuit 11 of the shift register 10 becomes the high level (active), a polarity signal CMIZ (low level; Vss) is received by the latch through circuit 51a.

Immediately before the output signal SROUT(k+2) becomes a high level (active) (frame F(t)), the potential of the node N1 is retained at Vdd (high level) and the transistor T5 is in an ON state. Therefore, when the output signal SROUT(k+2) becomes the high level (active), Vss (low level) of the polarity signal CMIZ and a power supply Vdd (high level) are short-circuited. As to this point, a resistor R2 is provided between the INITB terminal and the node N1. Therefore, the potential of the node N1 is made closer to that of the polarity signal CMIZ, thereby decreasing to a potential (potential lower than an inverted potential of the inverter INV2) which is close to Vss (low level) of the polarity signal CMIZ.

Thereafter, the transistor T3 is switched on, and an output (node N2; Vdd (high level)) of the inverter INV2 is fed back to the input of the inverter INV1, which results in switching off the transistor T5 and switching on the transistor T6. This further decreases the potential of the node N1 from the potential close to Vss of the polarity signal CMIZ to Vss.

The potential of the node N1 becomes close to Vss (low level) or becomes Vss (low level), which results in switching on the transistor T3 of the inverter INV2 and switching off the transistor T4 of the inverter INV2. This switching on of the transistor T3 causes the potential of the node N2 to be Vdd (high level), and Vdd (high level) is outputted from the latch through circuit 51a. In addition, in the buffer 51b, to which Vdd (high level) is supplied, the transistor T7 is switched off, whereas the transistor T8 is switched on. As such, Vcsl is outputted from the buffer 51b and is supplied to a (k+1)th retention capacitor line CSLk. Immediately before the output signal SROUT(k+2) becomes a high level (active), the potential of the node N1 is retained at Vdd (high level), and the (k+1)th retention capacitor line CSL(k+1) thus has a potential of Vcsh. Therefore, a potential of the (k+1)th retention capacitor line CSL(k+1) changes from Vcsh to Vcsl, thereby causing a floating potential of the pixel P(k+1) to fall (potential shift).

Then, the output signal SROUT(k+2) of the shift register 10 changes from the high level (active) to the low level (non-active), the analog switch circuit SW1 is switched off, and therefore an input of the polarity signal CMIZ is interrupted, with the result that the node N1 retains the potential (Vss (low level)) which has been retained immediately before such interruption because of a latch operation of the inverters INV1, INV2, and the buffer 51b keeps supplying the Vcsl to the (k+1)th retention capacitor line CSL(k+1) until the output signal SROUT(k+2) becomes the high level (active) in the frame F(t+2). The pixel P(k+1) retains a potential achieved after the fall (shift). After the frame F(t+2), the operations in the frames F(t), F(t+1) are repeated.

The use of the unit circuit 51 of Example 1 reduces the circuit scale of the retention capacitor line driving circuit 500. Therefore, it is possible to achieve further slim bezel of the liquid crystal display device. Further, no malfunction is caused by the reduction in circuit scale.

The unit circuit 51, during initialization (INITB: low level), carries out an operation identical with that of the unit circuit 27 (Example 13) included in the common electrode driving circuit 200 of Embodiment 1.

(Variation)

The unit circuit 51 included in the retention capacitor line driving circuit 500 of Embodiment 2 has a circuit configuration identical with that of the unit circuit 33 included in the common electrode driving circuit 200 of Embodiment 1 excerpt for the power supplies VCSH and VCSL of the buffer 51b. In other words, the unit circuit included in the retention capacitor line driving circuit 500 can have a circuit configuration identical with that of any of the unit circuits (unit circuits 21 to 41) included in the common electrode driving circuit 200 of Embodiment 1. Each unit circuit of the retention capacitor line driving circuit 500 carries out an operation identical with that of each unit circuit of the common electrode driving circuit 200.

The unit circuits 21 to 40 of the common electrode driving circuit 200 are each configured so that the current stage (for example, a kth stage) is supplied with an output SROUT(k−1) of a preceding ((k−1)th) unit circuit of the shift register 10 (see, for example, FIG. 3). However, the present invention is not limited thereto. The unit circuits 21 to 40 may each be configured so that the current stage is supplied with an output (SROUT(k−2) or SROUT(k−3)) of a unit circuit (for example, a (k−2)th unit circuit or (k−3)th unit circuit) preceding the (k−1)th unit circuit. Each unit circuit of the retention capacitor line driving circuit 500 is configured so that the current stage (for example, the kth stage) is supplied with an output SROUT(k+1) of a subsequent ((k+1)th) unit circuit of the shift register 10 (see FIG. 41). However, the present invention is not limited thereto. Each unit circuit of the retention capacitor line driving circuit 500 may be configured so that the current stage is supplied with an output (SROUT(k+2) or SROUT(k+3)) of a unit circuit (for example, a (k+2)th unit circuit or (k+3)th unit circuit) subsequent to the (k+1)th unit circuit.

Example 2

Figure 44:
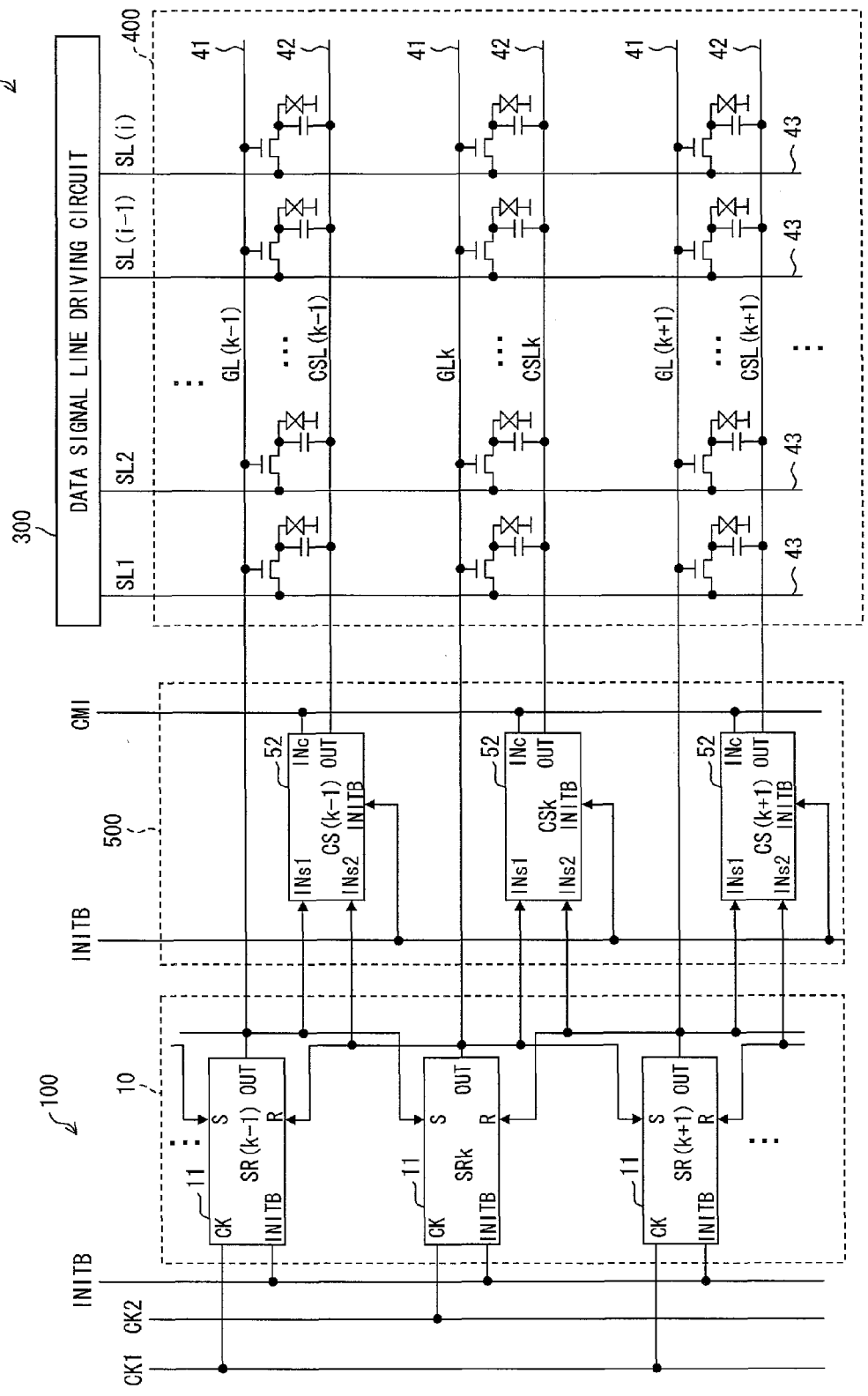
FIG. 44 is a block diagram illustrating a schematic configuration of a liquid crystal display device of Embodiment 3.
Figure 45:
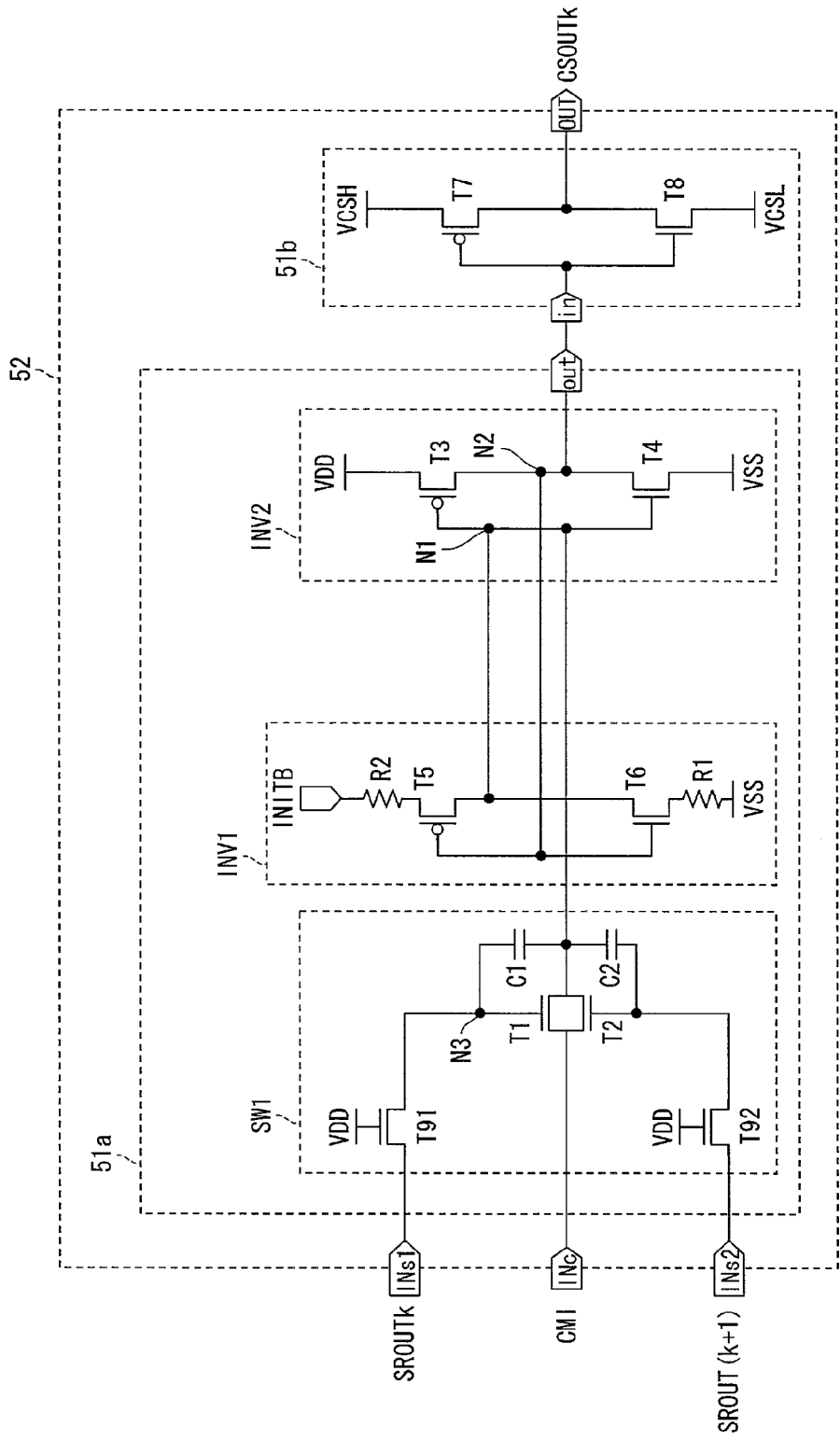
FIG. 45 is a circuit diagram of a unit circuit included in a retention capacitor line driving circuit of Example 2.

Each unit circuit of the retention capacitor line driving circuit 500 is configured so that the current stage is supplied with an output SROUT(k+1) of a subsequent ((k+1)th) unit circuit 11 (see, for example, FIG. 3) of the shift register 10. Each unit circuit of the retention capacitor line driving circuit 500 may alternatively be configured so that the current stage is further supplied with an output SROUTk of the unit circuit 11 (FIG. 3) of the current (kth) stage of the shift register 10. FIG. 44 is a block diagram illustrating a schematic configuration of a variation of a liquid crystal display device 3 of Embodiment 3. FIG. 45 is a circuit diagram of a unit circuit 52 included in a retention capacitor line driving circuit 500. As shown in FIGS. 44 and 45, a kth output SROUTk is supplied to an input terminal INs1 of the kth unit circuit 52, and a (k+1)th output SROUT(k+1) is supplied to an input terminal INs 2 of the kth unit circuit 52.

Figure 46:
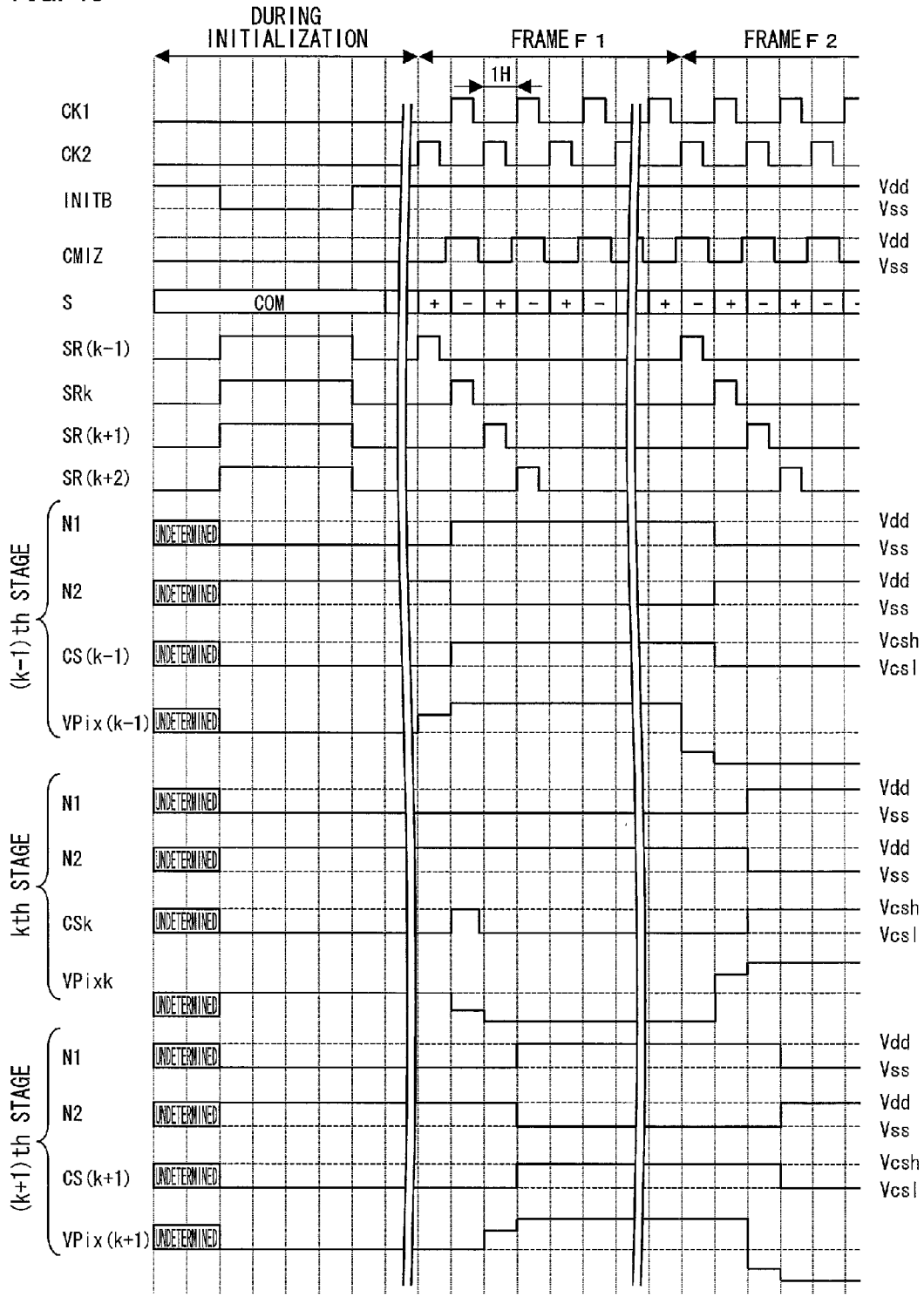
FIG. 46 is a timing chart at the time of an operation of the retention capacitor line driving circuit of Example 2.

FIG. 46 is a timing chart at the time of an operation of the retention capacitor line driving circuit 500 illustrated in FIG. 44. The timing chart illustrates a first frame (frame F1), during which a regular operation starts after power starts to be supplied, and a second frame (frame F2) subsequent to F1. An initialization operation carried out immediately after power starts to be supplied will be described later.

In the frame F1, when the output signal SROUTk of the kth unit circuit 11 of the shift register 10 becomes the high level (active), the scanning signal line GLk becomes active, thereby writing a data signal S (negative polarity) to the pixel Pk. At the same time, an output signal SROUTk (high level) is supplied to the input terminal INs1 of the kth unit circuit 52, and a polarity signal CMIZ (high level; Vdd) is received by a latch through circuit 51a due to the bootstrap operation described above. The unit circuit 52 thereafter operates similarly to that illustrated in FIG. 42. This causes the unit circuit 52 to supply Vcsh to a kth retention capacitor line CSLk. Then, when the output signal SROUT(k+1) of the (k+1)th unit circuit 11 of the shift register 10 becomes the high level (active), the output signal SROUT(k+1) (high level) is supplied to an input terminal INs2 of the kth unit circuit 52, with the result that a polarity signal CMIZ (low level; Vss) is received by the latch through circuit 51a. This causes the unit circuit 52 to supply Vcsl to the kth retention capacitor line CSLk. Then, a potential of the kth retention capacitor line CSLk changes from Vcsh to Vcsl, thereby causing a floating potential of the pixel Pk to fall (potential shift).

A known problem is that since respective potentials (CS signals) of all retention capacitor lines CSL are each set to a low level in an initial state during which power starts to be supplied, a potential shift of a CS signal is not carried out appropriately in even-numbered rows (or odd-numbered rows) in the first frame, thereby causing lateral stripes to appear in a display image. In a case where, for instance, the kth unit circuit 52 receives a (k+1)th output signal SROUT (k+1) to generate a CS signal in the configuration illustrated in FIG. 41, the CS signal is at a low level constantly during the first frame, with the result that it is impossible to shift a potential of the pixel Pk to which a data signal having a negative polarity has been written. In contrast, for pixels P(k−1) and P(k+1) on the preceding and subsequent rows, a CS signal is shifted from a low level to a high level, and a pixel potential thus rises appropriately. This causes lateral stripes to appear.

As to this point, according to the configuration of FIG. 45, the unit circuit 52 further receives an output signal SROUTk of the current stage (kth stage) and can thus generate an appropriate CS signal. This allows an appropriate potential shift in all pixels, and consequently prevent a decrease in display quality during the first frame.

(Initialization Operation)

The following description will discuss an initialization operation carried out immediately after power starts to be supplied. In a case where output signals SROUT of the unit circuits 11 at all the stages in the shift register 10 are at a high level during initialization, an operation is carried out as follows (see FIG. 46).

First, in a case where the output signals SROUT become a high level, the transistors T1 are switched on in the unit circuits 52 at all the stages, and the nodes N1 at all the stages are supplied (short-circuited) to the polarity signal CMIZ. During an undetermined state immediately before initialization, potentials retained at the nodes N1 are also undetermined. Therefore, whether an output of the inverter INV2, supplied to the polarity signal CMIZ, at each stage is Vdd (high level) or Vss (low level) is not determined, either.

Here, assuming that the initialization signal INITB connected to the nodes N1 is Vdd, the polarity signal CMIZ is supplied simultaneously to (i) the nodes N1 which are connected to the power supplies VDD of the inverters INV1 and (ii) the nodes N1 which are connected to the power supplies VSS. This causes the power supplies VDD and the power supplies VSS to be short-circuited via the polarity signal CMIZ, thereby generating a large current. As a result, the potentials of the nodes N1 become a midpoint potential. Thus, it is impossible to carry out initialization normally.

However, according to the configuration of the unit circuit 52, both of the polarity signal CMIZ and the initialization signal INITB are regulated to be Vss (low level) during initialization. Therefore, the potentials of the nodes N1 necessarily become Vss (low level). Thus, it is possible to carry out initialization without a fail.

Figure 47:
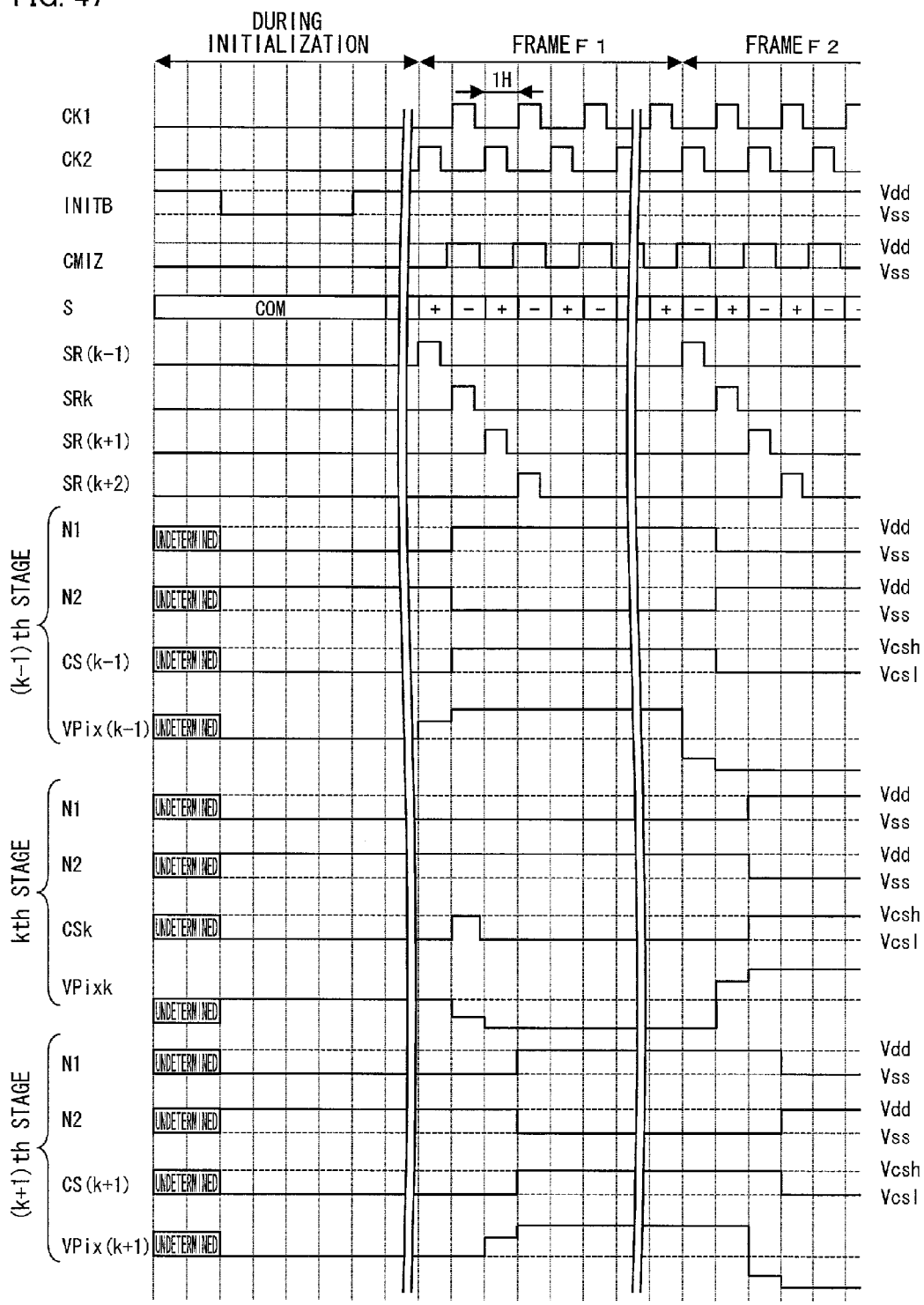
FIG. 47 is a timing chart at the time of an operation of the retention capacitor line driving circuit of Example 2.

On the contrary, in a case where output signals SROUT of the unit circuits 11 at all the stages in the shift register 10 are at a low level during initialization, an operation is carried out as follows (see FIG. 47).

In a case where potentials of the nodes N1 are Vdd (high level) during an undetermined state before initialization, the gate terminals of the transistors T5 are Vss (low level) and the transistors T5 are in an ON state. Here, since the initialization signal INITB is Vss (low level) during initialization, the potentials of the nodes N1 become a low level (Vss+Vth) via the transistors T5, which means that the potentials of the nodes N1 drop to below a threshold value (Vth). Outputs of the inverter INV1 are supplied to the inverters INV2, so that the inverters INV2 output Vdd. Since the output terminals (nodes N2) of the inverters INV2 are connected to the input terminals of the inverters INV1, outputs (Vdd) of the inverters INV2 are fed back to the inverters INV1, so that the transistors T6 are switched on. As a result, the nodes N1 at Vss+Vth become Vss (low level). Thus, it is possible to carry out initialization without a fail.

In a case where potentials of the nodes N1 are Vss (low level) during an undetermined state before initialization, the initialization signal INITB is not supplied to the nodes N1 since the transistors T5 are in an OFF state. However, in this case, the nodes N1 are already at a desired potential (Vss). Thus, this state corresponds to an initialized state.

Thus, with the unit circuit 52, it is possible to initialize the retention capacitor line driving circuit 500 in a stable manner. The above initialization operation is applicable to any unit circuit included in the retention capacitor line driving circuit 500.

Example 3

Figure 48:
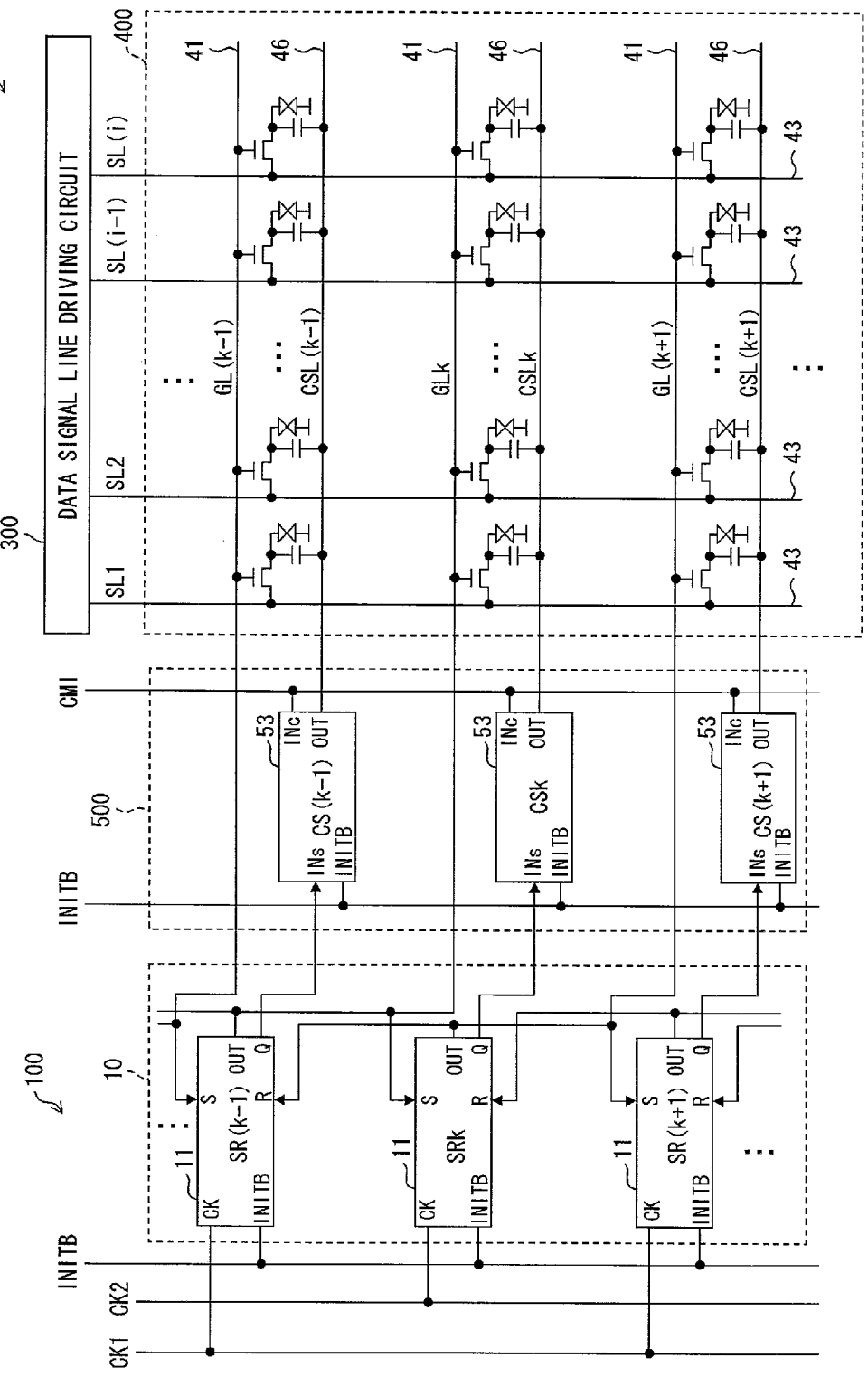
FIG. 48 is a block diagram illustrating a schematic configuration of a liquid crystal display device of Example 3.
Figure 49:
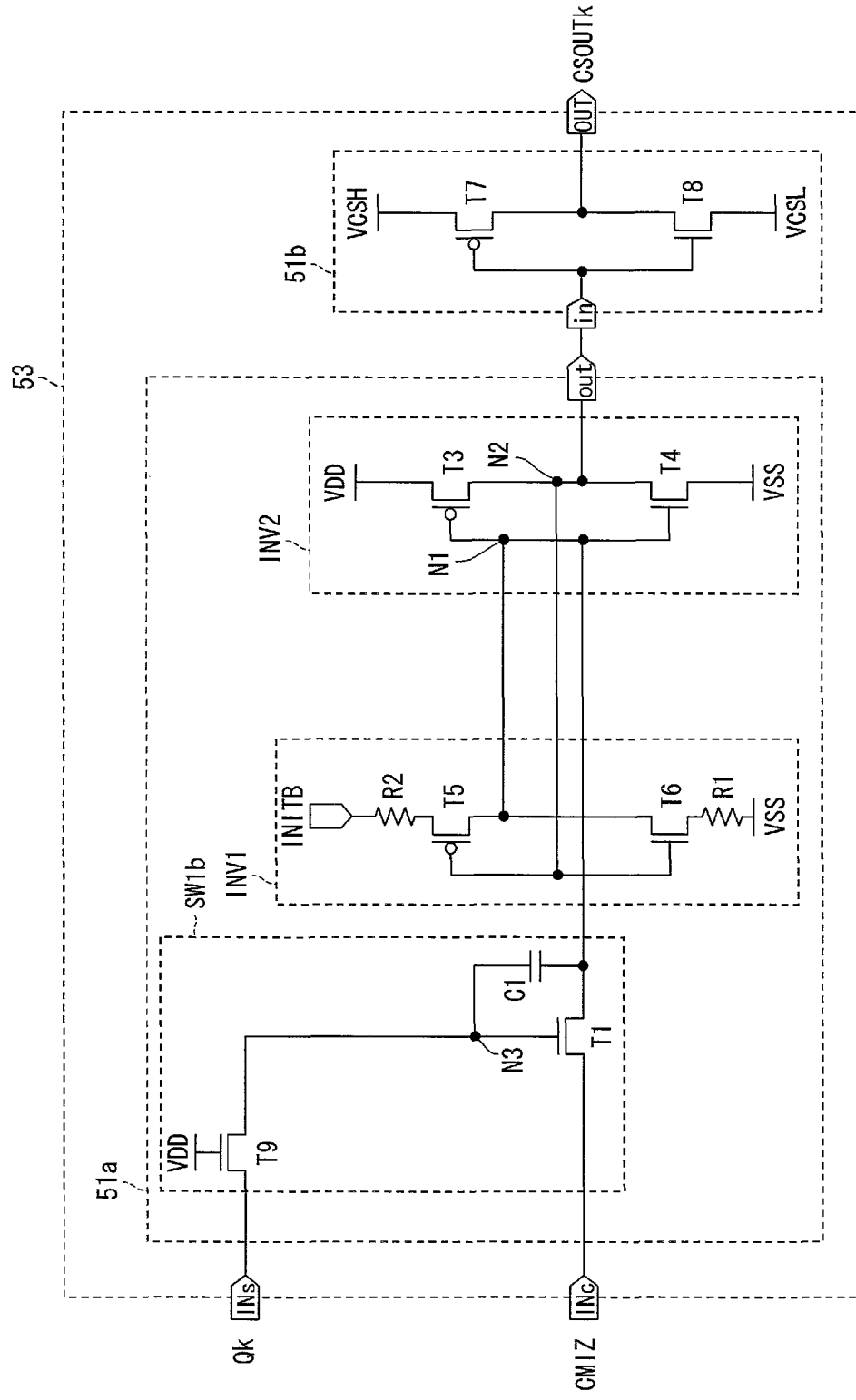
FIG. 49 is a circuit diagram of a unit circuit included in a retention capacitor line driving circuit of Example 3.

The following description will discuss a configuration that can prevent a decrease in display quality during the first frame described above in the unit circuit 51 illustrated in FIG. 41. FIG. 48 is a block diagram illustrating a schematic configuration of a liquid crystal display device 3 of Example 3. FIG. 49 is a circuit diagram of a unit circuit 53 included in the retention capacitor line driving circuit 500. In a kth unit circuit 53, an input terminal INs is supplied with an internal signal Qk (an output signal Qk of a flip-flop circuit) of a (k+1)th unit circuit 11 of the shift register 10.

Figure 50:
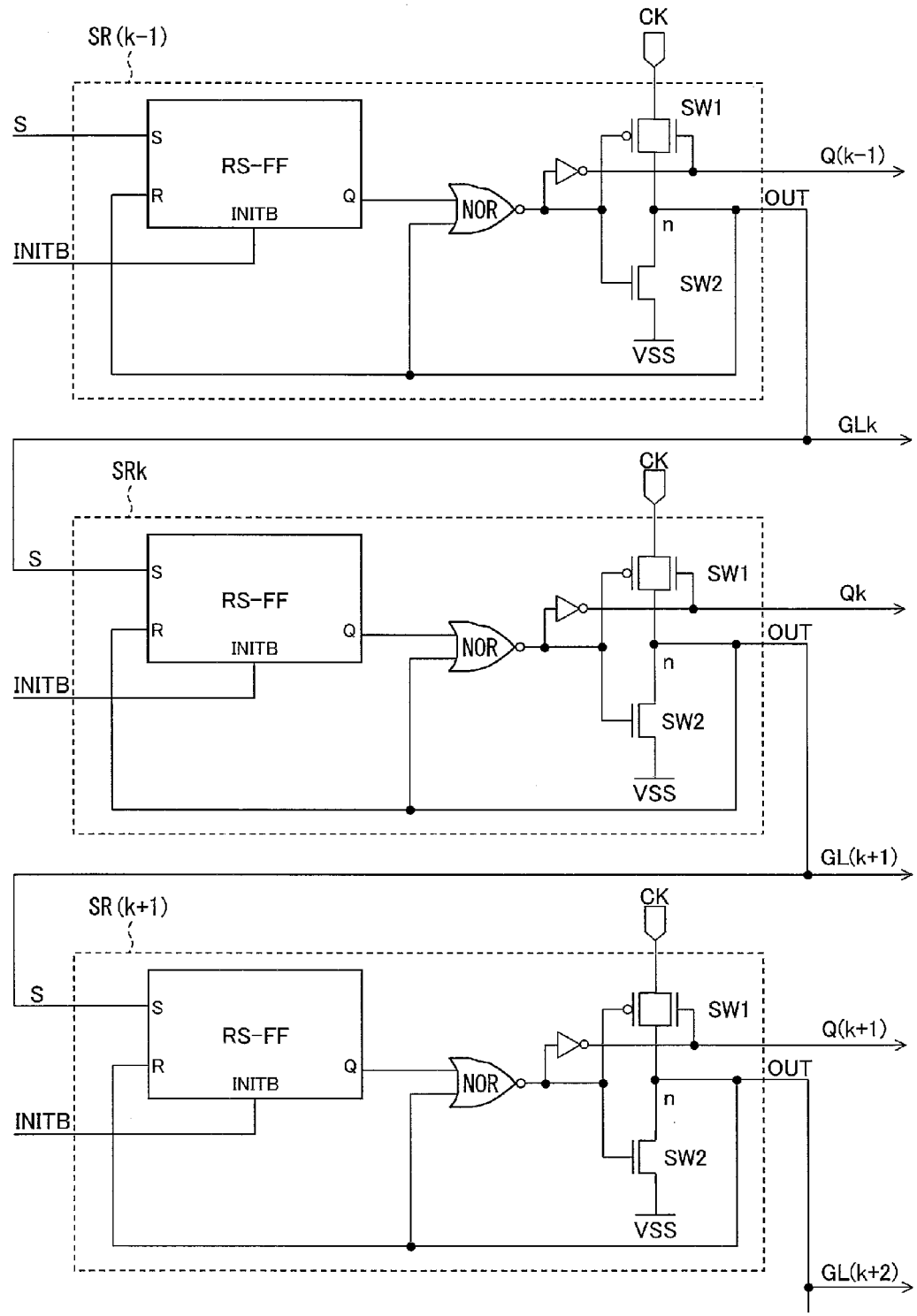
FIG. 50 is a circuit diagram showing a configuration of a unit circuit of a shift register.

FIG. 50 is a circuit diagram illustrating a configuration of a unit circuit 11 of the shift register 10. FIG. 50 illustrates details of a (k−1)th, kth, and (k+1)th unit circuits 11 (SR(k−1), SRk, and SR(k+1).

The unit circuit SRk includes a RS type flip-flop circuit RS-FF, a NOR circuit, and switch circuits SW1 and SW2. An input terminal S of the flip-flop circuit RS-FF is supplied with, as a set signal, an output signal SROUT(k−1) of the preceding ((k−1)th) unit circuit SR(k−1). One input terminal of the NOR circuit is connected to an output terminal Q of the flip-flop circuit RS-FF, whereas the other input terminal is connected to an output terminal OUT of the unit circuit SRk. An output of the NOR circuit is connected to respective gate terminals of the analog switch circuits SW1 and SW2. A Q terminal is connected to an input terminal INs (see FIG. 49) of the kth unit circuit 53. A source terminal of the analog switch circuit SW1 is supplied with CK, and a drain terminal thereof is connected to a drain terminal of the analog switch circuit SW2. A source terminal of the analog switch circuit SW2 is supplied with a power supply VSS. A connection point n between the switch circuits SW1 and SW2 is connected to the output terminal OUT of the unit circuit SRk, the one input terminal of the NOR circuit, and an input terminal R of the flip-flop circuit RS-FF of the current (kth) stage. The output terminal OUT of the unit circuit SRk is connected to an input terminal S of a subsequent ((k+1)th) stage. This allows an output signal SROUTk of the current (kth) stage to be supplied as a set signal for the subsequent ((k+1)th) unit circuit SR(k+1).

With the above configuration, an output OUT of the unit circuit SRk is supplied as a reset signal to the input terminal R of the flip-flop circuit RS-FF. The unit circuit SRk thus functions as a self-resetting flip-flop.

Figure 51:
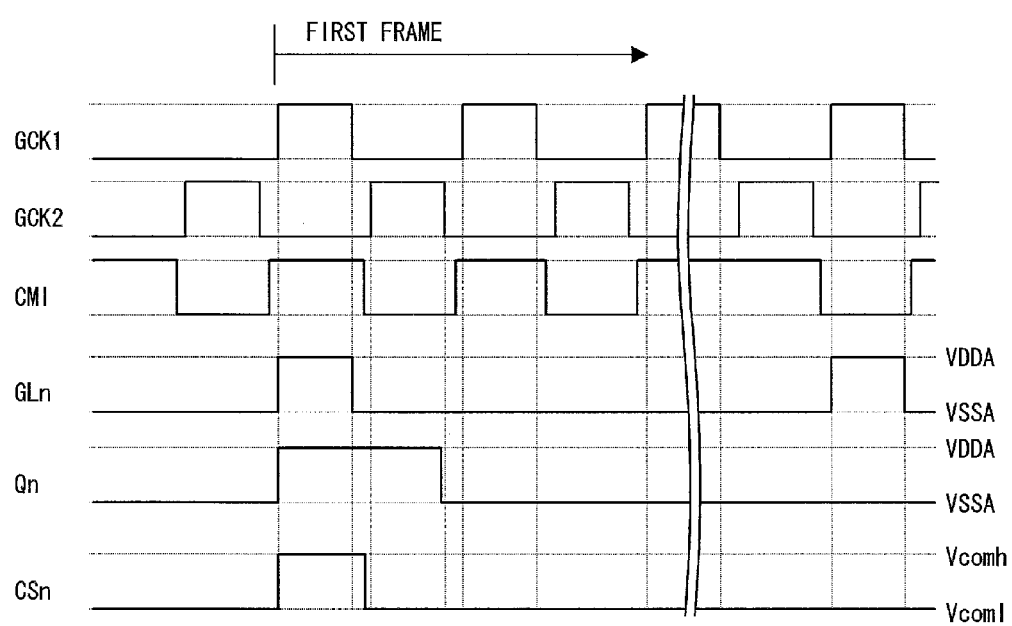
FIG. 51 is a timing chart showing an output signal Q of a flip-flop circuit RS-FF and a CS signal outputted from a unit circuit.

FIG. 51 is a timing chart illustrating (i) an output signal Q of the kth flip-flop circuit RS-FF which output signal Q is supplied to the kth unit circuit 53 and (ii) a CS signal outputted from the kth unit circuit 53. As shown in FIG. 51, supplying a Q signal to a unit circuit 53 allows an appropriate CS signal to be generated similarly to the CS signals illustrated in FIGS. 46 and 47. This allows an appropriate potential shift in all pixels, and consequently prevent a decrease in display quality during the first frame.

The display driving circuits of Embodiments of the present invention may be configured such that, when the output signal of the shift register becomes active, a potential level of a signal retained at a first connection point is changed to be closer to a potential level of the retention target signal, the first connection point being a connection point between the output terminal of the first inverter and the input terminal of the second inverter.

The display driving circuits of Embodiments of the present invention may be configured such that, when the output signal of the shift register becomes active and an output signal of the second inverter is supplied to the first inverter, the potential level of the signal retained at the first connection point becomes equal to the potential level of the retention target signal.

The display driving circuits of Embodiments of the present invention may be configured such that an output signal of the first inverter or an output signal of the second inverter is supplied to the corresponding scanning signal line via a buffer.

The display driving circuits of Embodiments of the present invention may be configured such that a transistor, which configures the first inverter and is provided between the first connection point and the input terminal of the first inverter, is set to have a channel length longer than that of a transistor configuring the second inverter.

The display driving circuits of Embodiments of the present invention may be configured such that a resistor is provided between the first connection point and the output terminal of the first inverter.

The display driving circuits of Embodiments of the present invention may be configured such that a wiring resistor of an input line of the retention target signal is smaller than that of a connection line of the first inverter and the second inverter.

The display driving circuits of Embodiments of the present invention may be configured such that the each of the retention circuits includes first to fifth transistors, and the first inverter includes the second and third transistors, and the second inverter includes the fourth and fifth transistors;

a gate terminal of the first transistor receives the output signal of the shift register and a source terminal of the first transistor receives the retention target signal; gate terminals of the second and third transistors are connected to drain terminals of the fourth and fifth transistors; and drain terminals of the second and third transistors, gate terminals of the fourth and fifth transistors, and a drain terminal of the first transistor are connected to one another.

The display driving circuits of Embodiments of the present invention may be configured such that a source terminal of the third transistor is connected to a low-potential-side power supply via a first resistor, and a source terminal of the second transistor is connected to a high-potential-side power supply via a second resistor, a source terminal of the fifth transistor receives a signal having a low potential, and a source terminal of the fourth transistor receives a signal having a high potential.

The display driving circuits of Embodiments of the present invention may be configured such that a first resistor is provided between the drain terminal of the third transistor and the output terminal of the first inverter; and a second resistor is provided between the drain terminal of the second transistor and the output terminal of the first inverter.

The display driving circuits of Embodiments of the present invention may be configured such that an initialization signal is supplied to any one of the source terminals of the two to fifth transistors.

The display driving circuits of Embodiments of the present invention, which is used in a display device in which a signal having a first potential or a second potential is supplied to common electrode lines constituting capacitors with pixel electrodes, may be configured such that: an output signal of a preceding stage of the shift register is supplied to one of the retention circuits corresponding to a current stage of the shift register; and, when the output signal of the preceding stage of the shift register becomes active, the one of the retention circuits corresponding to the current stage supplies an output of the one of the retention circuits corresponding to the current stage to the corresponding common electrode line while receiving and retaining a retention target signal, the output having the first potential or the second potential, the corresponding common electrode line constituting a capacitor with one of the pixel electrodes, which one is of a pixel corresponding to the current stage.

The display driving circuits of Embodiments of the present invention, which is used in a display device in which retention capacitor lines constituting capacitors with pixel electrodes are supplied with a modulation signal according to a polarity of a potential of a signal written to the pixel electrode, may be configured such that: an output signal of a subsequent stage of the shift register is supplied to one of the retention circuits which is a retention circuit corresponding to a current stage; and, when the output signal of the subsequent stage of the shift register becomes active, the retention circuit corresponding to the current stage supplies, as the modulation signal, an output of the retention circuit corresponding to the current stage to the corresponding retention capacitor line while receiving and retaining a retention target signal, the corresponding retention capacitor line constituting a capacitor with one of the pixel electrodes, which one is of a pixel corresponding to the current stage.

A display panel of the present invention includes any one of the above display driving circuits; and a pixel circuit, the any one of the above display driving circuits and the pixel circuit being monolithically formed.

A display panel of the present invention includes any one of the above display driving circuits.

The present invention is not limited to the description of the embodiments above, and can be modified in numerous ways by a skilled person as long as such modification falls within the scope of the claims. An embodiment derived from a proper combination of technical means disclosed in different embodiments is also encompassed in the technical scope of the present invention.

INDUSTRIAL APPLICABILITY

The present invention is suitably usable in driving circuits of display devices.

REFERENCE SIGNS LIST

1, 2, 3 Liquid crystal display device (display device)
10 Shift register
11 Unit circuit of shift register
21-41 Unit circuit (retention circuit) of common electrode driving circuit
51-53 Unit circuit (retention circuit) of retention capacitor line driving circuit
41 Scanning signal line (gate line)
42 Common electrode line (common line)
43 Data signal line (source line)
44 TFT
45 Pixel electrode
100 Scanning signal line driving circuit (gate driver)
200 Common electrode driving circuit (COM driver)
300 Data signal line driving circuit (source driver)
400 Display panel
500 Retention capacitor line driving circuit (CS driver)
T1 Transistor (first transistor)
T3 Transistor (fourth transistor)
T4 Transistor (fifth transistor)
T5 Transistor (second transistor)
T6 Transistor (third transistor)
INV1 Inverter (first inverter)
INV2 Inverter (second inverter)
R1 Resistor (first resistor)
R2 Resistor (second resistor)

The invention claimed is:

1. A display driving circuit for driving a display panel including (i) pixel electrodes included in pixels and (ii) common lines which constitute capacitors with the pixel electrodes, the display driving circuit comprising:
a shift register which includes plural stages provided corresponding to plural scanning signal lines, wherein:
one or more retention circuits for receiving retention target signals are provided corresponding to each of the plural stages of the shift register;
when an output signal of any one of the plural stages of the shift register becomes active, the corresponding retention circuit supplies an output of the corresponding retention circuit to the corresponding common line while receiving and retaining a retention target signal;
each of the retention circuits includes a first inverter and a second inverter for retaining the retention target signal,
when the output signal of the shift register becomes active, the retention target signal is supplied to the second inverter, and the each of the retention circuits supplies, on the basis of an output from the first inverter or the second inverter, a high-level or low-level signal to the corresponding common line; and
in the case where the output signal of the shift register is active, an input terminal of the first inverter and an output terminal of the second inverter are electrically connected to each other and an output terminal of the first inverter and an input terminal of the second inverter are electrically connected to each other,
wherein, when the output signal of the shift register becomes active, a potential level of a signal retained at a first connection point is changed to be closer to a potential level of the retention target signal, the first connection point being a connection point between the output terminal of the first inverter and the input terminal of the second inverter.

2. The display driving circuit as set forth in claim 1, wherein,
when the output signal of the shift register becomes active and an output signal of the second inverter is supplied to the first inverter, the potential level of the signal retained at the first connection point becomes equal to the potential level of the retention target signal.

3. The display driving circuit as set forth in claim 1, wherein a transistor, which configures the first inverter and is provided between the first connection point and the input terminal of the first inverter, is set to have a channel length longer than that of a transistor configuring the second inverter.

4. The display driving circuit as set forth in claim 1, wherein a resistor is provided between the first connection point and the output terminal of the first inverter.

5. The display driving circuit as set forth in claim 1, wherein a wiring resistor of an input line of the retention target signal is smaller than that of a connection line of the first inverter and the second inverter.

6. A display panel, comprising:
   a display driving circuit recited in claim 1; and
   a pixel circuit,
      the display driving circuit and the pixel circuit being monolithically formed.

7. A display device comprising a display driving circuit recited in claim 1.

8. A display driving circuit for driving a display panel including (i) pixel electrodes included in pixels and (ii) common lines which constitute capacitors with the pixel electrodes, the display driving circuit comprising:
   a shift register which includes plural stages provided corresponding to plural scanning signal lines, wherein:
   one or more retention circuits for receiving retention target signals are provided corresponding to each of the plural stages of the shift register;
   when an output signal of any one of the plural stages of the shift register becomes active, the corresponding retention circuit supplies an output of the corresponding retention circuit to the corresponding common line while receiving and retaining a retention target signal;
   each of the retention circuits includes a first inverter and a second inverter for retaining the retention target signal,
   when the output signal of the shift register becomes active, the retention target signal is supplied to the second inverter, and the each of the retention circuits supplies, on the basis of an output from the first inverter or the second inverter, a high-level or low-level signal to the corresponding common line; and
   in the case where the output signal of the shift register is active, an input terminal of the first inverter and an output terminal of the second inverter are electrically connected to each other and an output terminal of the first inverter and an input terminal of the second inverter are electrically connected to each other, wherein:
   the each of the retention circuits includes first to fifth transistors, and the first inverter includes the second and third transistors, and the second inverter includes the fourth and fifth transistors;
   a gate terminal of the first transistor receives the output signal of the shift register and a source terminal of the first transistor receives the retention target signal;
   gate terminals of the second and third transistors are connected to drain terminals of the fourth and fifth transistors; and
   drain terminals of the second and third transistors, gate terminals of the fourth and fifth transistors, and a drain terminal of the first transistor are connected to one another.

9. The display driving circuit as set forth in claim 8, wherein:
   a source terminal of the third transistor is connected to a low-potential-side power supply via a first resistor, and a source terminal of the second transistor is connected to a high-potential-side power supply via a second resistor,
   a source terminal of the fifth transistor receives a signal having a low potential, and a source terminal of the fourth transistor receives a signal having a high potential.

10. The display driving circuit as set forth in claim 8, wherein:
   a first resistor is provided between the drain terminal of the third transistor and the output terminal of the first inverter; and
   a second resistor is provided between the drain terminal of the second transistor and the output terminal of the first inverter.

11. The display driving circuit as set forth in claim 8, wherein an initialization signal is supplied to any one of the source terminals of the two to fifth transistors.

12. A display panel, comprising:
   a display driving circuit recited in claim 8; and
   a pixel circuit,
   the display driving circuit and the pixel circuit being monolithically formed.

13. A display device comprising a display driving circuit recited in claim 8.

14. A display driving circuit for driving a display panel including (i) pixel electrodes included in pixels and (ii) common lines which constitute capacitors with the pixel electrodes, the display driving circuit comprising:
   a shift register which includes plural stages provided corresponding to plural scanning signal lines, wherein:
   one or more retention circuits for receiving retention target signals are provided corresponding to each of the plural stages of the shift register;
   when an output signal of any one of the plural stages of the shift register becomes active, the corresponding retention circuit supplies an output of the corresponding retention circuit to the corresponding common line while receiving and retaining a retention target signal;
   each of the retention circuits includes a first inverter and a second inverter for retaining the retention target signal,
   when the output signal of the shift register becomes active, the retention target signal is supplied to the second inverter, and the each of the retention circuits supplies, on the basis of an output from the first inverter or the second inverter, a high-level or low-level signal to the corresponding common line; and
   in the case where the output signal of the shift register is active, an input terminal of the first inverter and an output terminal of the second inverter are electrically connected to each other and an output terminal of the first inverter and an input terminal of the second inverter are electrically connected to each other,
   the display driving circuit is used in a display device in which retention capacitor lines constituting capacitors with pixel electrodes are supplied with a modulation signal according to a polarity of a potential of a signal written to the pixel electrode, wherein:
   an output signal of a subsequent stage of the shift register is supplied to one of the retention circuits which is a retention circuit corresponding to a current stage; and
   when the output signal of the subsequent stage of the shift register becomes active, the retention circuit corresponding to the current stage supplies, as the modulation signal, an output of the retention circuit corresponding to the current stage to the corresponding retention capacitor line while receiving and retaining a retention target signal, the corresponding retention capacitor line constituting a capacitor with one of the pixel electrodes, which one is of a pixel corresponding to the current stage.

15. A display panel, comprising:
a display driving circuit recited in claim 14; and
a pixel circuit,
the display driving circuit and the pixel circuit being monolithically formed.

16. A display device comprising a display driving circuit recited in claim 14.

* * * * *